(12) United States Patent
Kasai et al.

(10) Patent No.: US 10,276,515 B2
(45) Date of Patent: Apr. 30, 2019

(54) MOUNTING COMPONENT, WIRING SUBSTRATE, ELECTRONIC DEVICE AND MANUFACTURING METHOD THEREOF

(71) Applicant: DAI NIPPON PRINTING Co., Ltd., Tokyo (JP)

(72) Inventors: Ryohei Kasai, Tokyo (JP); Tsuyoshi Tsunoda, Tokyo (JP); Yuichi Yamamoto, Tokyo (JP); Shuji Sagara, Tokyo (JP); Masaya Tanaka, Tokyo (JP)

(73) Assignee: DAI NIPPON PRINTING Co., Ltd., Tokyo (JP)

( * ) Notice: Subject to any disclaimer, the term of this patent is extended or adjusted under 35 U.S.C. 154(b) by 0 days.

(21) Appl. No.: 15/933,539

(22) Filed: Mar. 23, 2018

(65) Prior Publication Data
US 2018/0240760 A1    Aug. 23, 2018

Related U.S. Application Data

(63) Continuation of application No. PCT/JP2016/077743, filed on Sep. 20, 2016.

(30) Foreign Application Priority Data

Sep. 25, 2015 (JP) .................. 2015-188066
Nov. 2, 2015 (JP) .................. 2015-215462
(Continued)

(51) Int. Cl.
*H01L 23/12* (2006.01)
*H05K 1/18* (2006.01)
(Continued)

(52) U.S. Cl.
CPC ........ *H01L 23/562* (2013.01); *H01L 21/4857* (2013.01); *H01L 21/4867* (2013.01);
(Continued)

(58) Field of Classification Search
CPC ............... H01L 23/562; H01L 21/4857; H01L 21/4867; H01L 23/12; H01L 23/49838;
(Continued)

(56) References Cited

U.S. PATENT DOCUMENTS 6,140,226 A * 10/2000 Grill ................. H01L 21/76811
257/E21.579
6,181,278 B1    1/2001 Kakimoto et al.
(Continued)

FOREIGN PATENT DOCUMENTS

JP    H10-56060 A    2/1998
JP    H10-270936 A    10/1998
(Continued)

OTHER PUBLICATIONS

International Search Report dated Dec. 6, 2016 for PCT Application No. PCT/JP2016/077743.
(Continued)

*Primary Examiner* — Timothy Thompson
*Assistant Examiner* — Michael F McAllister
(74) *Attorney, Agent, or Firm* — Typha IP LLC

(57) ABSTRACT

Disclosed is a wiring substrate including: a first wiring layer, a second wiring layer disposed on the first wiring layer interposed by an insulating film, and a via conductor passing through the insulating film in a thickness direction, the via conductor electrically connecting the first wiring layer and the second wiring layer. The second wiring layer and the via conductor include a second sintered metal layer and a first sintered metal layer arranged to surround the second sintered metal layer, and an average particle diameter of first metal particles forming the first sintered metal layer is smaller than an average particle diameter of second metal particles forming the second sintered metal layer.

8 Claims, 32 Drawing Sheets

(30) Foreign Application Priority Data

Apr. 19, 2016 (JP) .................................. 2016-083674
Sep. 16, 2016 (JP) .................................. 2016-181571

(51) Int. Cl.
| | | |
|---|---|---|
| *H05K 3/46* | (2006.01) | |
| *H01L 23/00* | (2006.01) | |
| *H01L 21/48* | (2006.01) | |
| *H01L 23/498* | (2006.01) | |

(52) U.S. Cl.
CPC ........ *H01L 23/12* (2013.01); *H01L 23/49822* (2013.01); *H01L 23/49838* (2013.01); *H01L 23/49866* (2013.01); *H05K 1/18* (2013.01); *H05K 3/46* (2013.01); *H05K 1/181* (2013.01); *H05K 2201/10674* (2013.01)

(58) Field of Classification Search
CPC ...... H01L 23/49866; H05K 1/18; H05K 3/46; H05K 1/181; H05K 2201/10674
USPC ......................................................... 174/251
See application file for complete search history.

(56) References Cited

U.S. PATENT DOCUMENTS

| | | | |
|---|---|---|---|
| 9,538,644 | B2 | 1/2017 | Kitajima |
| 9,691,634 | B2* | 6/2017 | Koelling ............... B22F 1/0014 |
| 2011/0067901 | A1 | 3/2011 | Kim et al. |
| 2016/0064280 | A1* | 3/2016 | Ookita .............. H01L 21/76898 257/758 |

FOREIGN PATENT DOCUMENTS

| | | |
|---|---|---|
| JP | 2001-156411 A | 6/2001 |
| JP | 2001-352005 A | 12/2001 |
| JP | 2003-257979 A | 9/2003 |
| JP | 2004-87928 A | 3/2004 |
| JP | 2005-317566 A | 11/2005 |
| JP | 2008-147498 A | 6/2008 |
| JP | 2008-227429 A | 9/2008 |
| JP | 2010-16061 A | 1/2010 |
| JP | 2010-34430 A | 2/2010 |
| JP | 2010-258415 A | 11/2010 |
| JP | 2011-71454 A | 4/2011 |
| JP | 2011-103602 A | 5/2011 |
| JP | 2013-16780 A | 1/2013 |
| JP | 2014-207346 A | 10/2014 |

OTHER PUBLICATIONS

Written Opinion of the International Search Authority dated Dec. 6, 2016 for PCT Application No. PCT/JP2016/077743.
Study on electrical characteristics of micron-order wiring with nano-scale conductive metal particle, ICEP 2016, p. 456-460, cited in Non-Patent Literature Document No. 1.

* cited by examiner

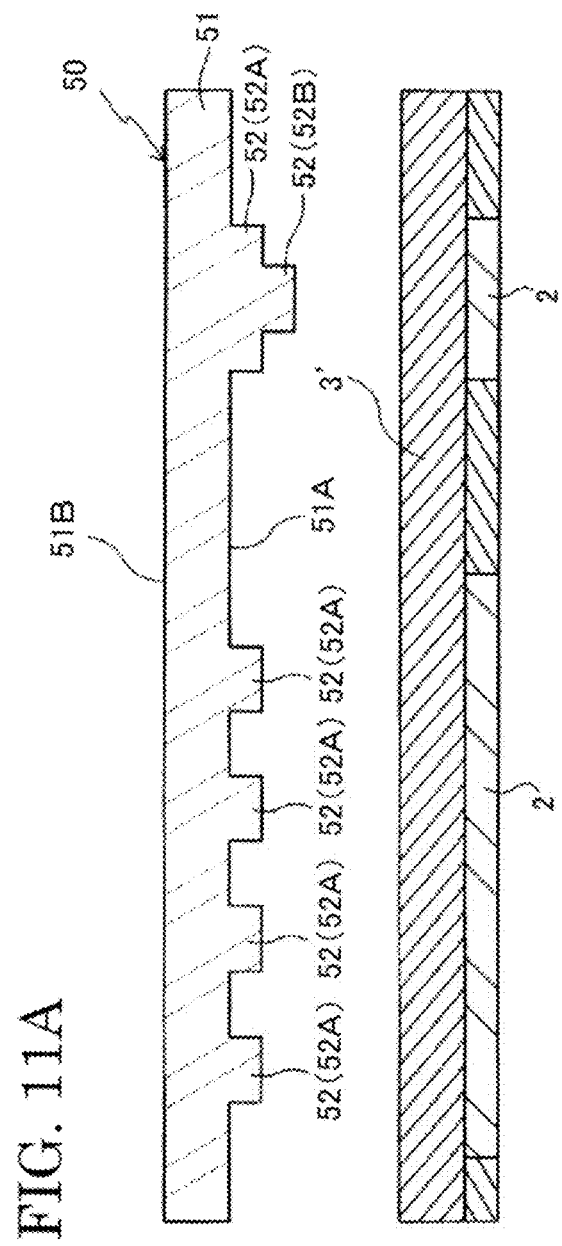

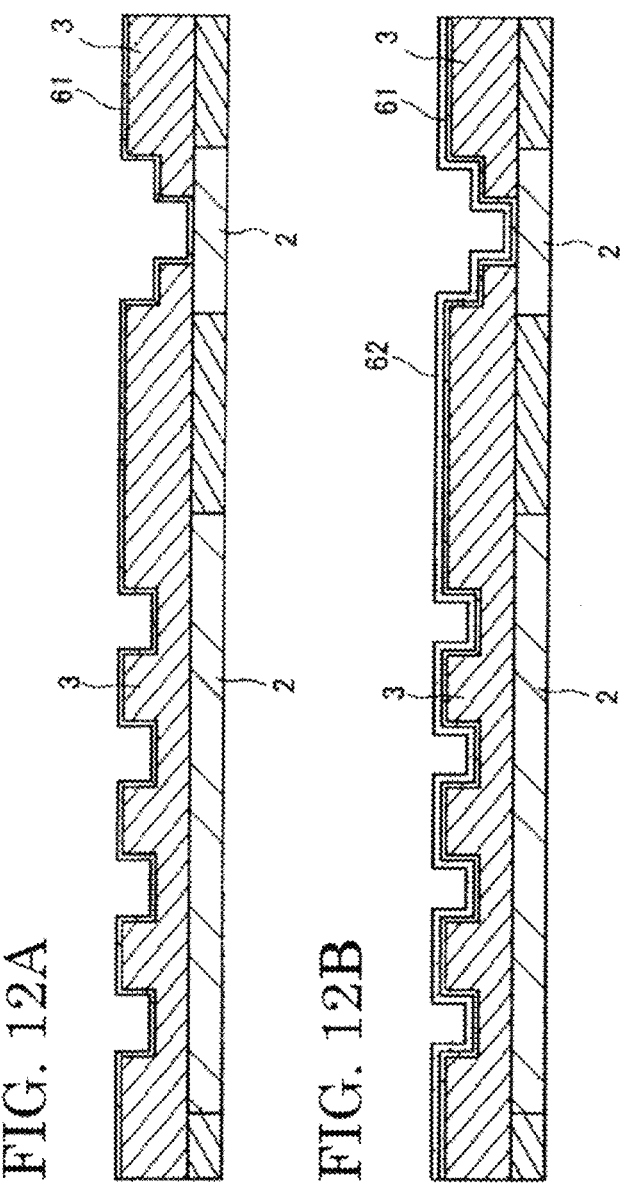

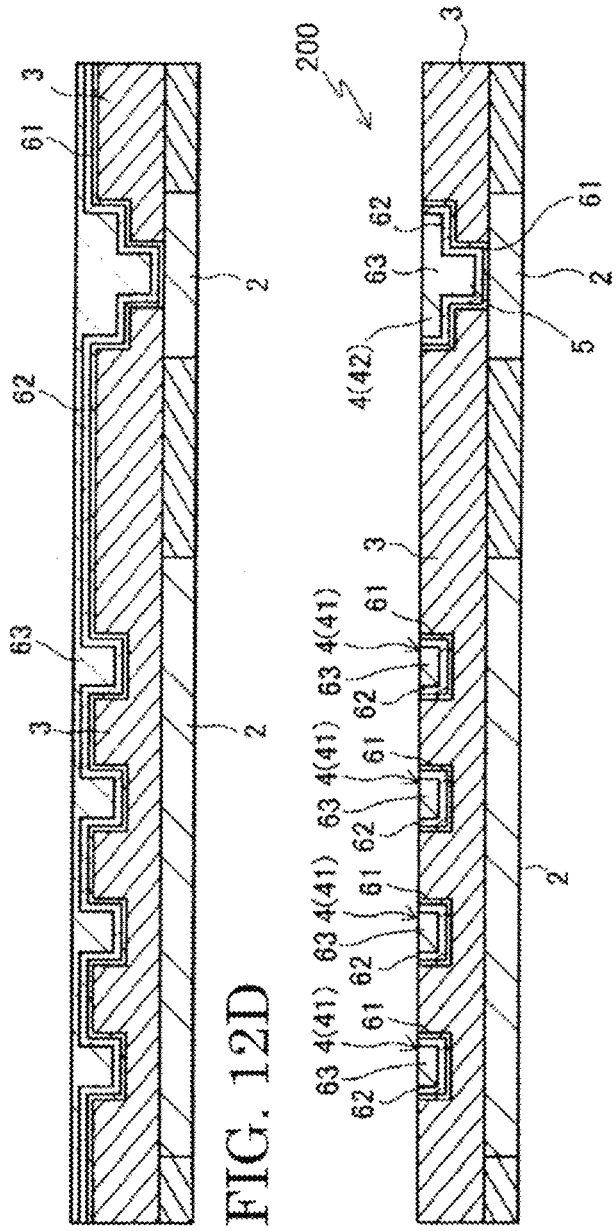

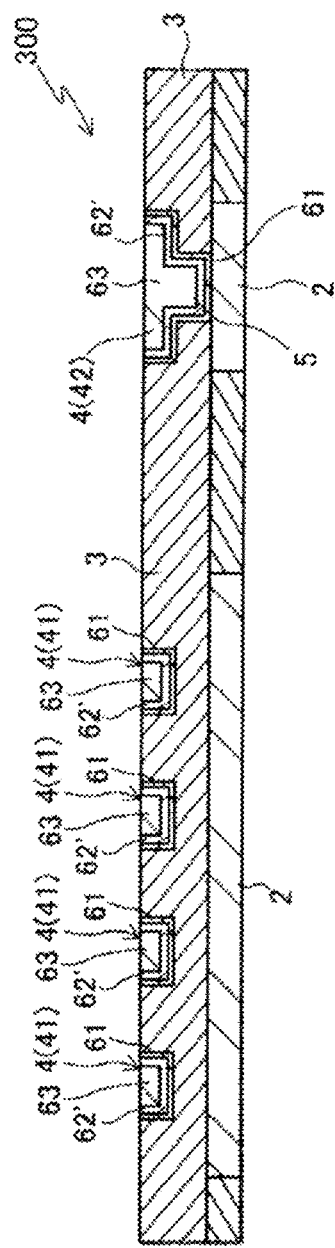

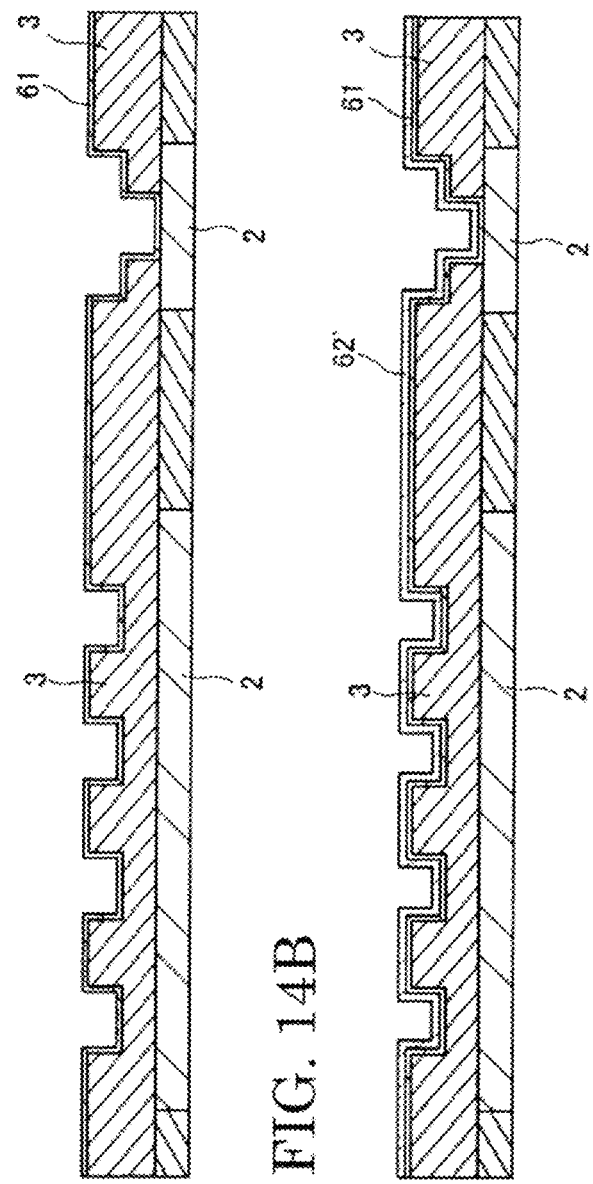

MOUNTING COMPONENT, WIRING SUBSTRATE, ELECTRONIC DEVICE AND MANUFACTURING METHOD THEREOF

CROSS REFERENCE TO RELATED APPLICATIONS

This application is based on and claims the benefit of priority from the prior Japanese Patent Application No. 2015-188066, filed on Sep. 25, 2015, No. 2015-215462, filed on Nov. 2, 2015, No. 2016-083674, filed on Apr. 19, 2016, No. 2016-181571, filed on Sep. 16, 2016, and PCT/JP2016/077743, filed on Sep. 20, 2016. The entire contents of these applications are incorporated herein by reference.

FIELD

The embodiments of the present disclosure relate to a mounting component and a wiring substrate having a multilayer wiring structure, a manufacturing method thereof, and an electronic device in which the mounting component is mounted on a multilayer wiring substrate.

BACKGROUND

An electronic device in which a mounting component such as a semiconductor chip or the like is flip-chip mounted on a multilayer wiring substrate has a structure in which the multilayer wiring substrate has a plurality of connection electrodes for mounting the semiconductor chip on one outermost layer and the other outermost layer includes a connection part above which a solder ball is fixed, and has a ball grid array (BGA) structure for connecting to a mother substrate.

In the manufacturing process of this type of electronic device, in the case where multi-pin mounting components are flip-chip mounted on a multilayer wiring substrate and integrated, in order to ensure a connection between mutual electrodes, it is necessary to apply a moderate load to the mounting site. Furthermore, in the case where an electrode of a mounting component has a protrusion shaped conductive material, by elastically deforming the protrusion shaped conductive material when mounting on a multilayer wiring substrate, residual stress is generated within the protrusion shaped conductive material and it is possible to provide an effect of maintaining a connection even when the mounting component is deformed after mounting. In order to achieve such an effect, it is necessary to apply an appropriate load to the mounting site. As described above, with the aim of concentrating a load on a mounting site, a method has been proposed of increasing a metal ratio inside a multilayer wiring substrate in order to provide mechanical rigidity (See Japanese Laid Open Patent Publication No. 2013-16780).

In addition, while a subtract method or an additive method and the like by photolithography have been conventionally performed as a method for forming a circuit pattern of a semiconductor chip or a multilayer wiring substrate, pattern formation by imprint lithography has also recently begun. Furthermore, while the usual method of forming a conductor part of a circuit pattern was conventionally a subtract method or an additive method which applied electrolytic plating, a method of filling a conductive paste into a groove of an insulating layer formed by lithography using a printing method has been developed in recent years as a method of reducing the processing cost of waste liquid which is generated at the time of electrolytic plating.

On the other hand, as electronic devices become smaller, thinner, lighter and have more functionality, the technical development which enables high density and high speed printing wiring substrates which are mounted with these electronic components is actively being carried out together with miniaturization and thinning of various electronic components which form electronic devices.

In particular, there is a demand for a new proposal for a circuit substrate having a multilayer wiring structure which can mount a semiconductor chip such as an LSI at a high density and is compatible with a high-speed signal processing circuit. In this type of multilayer wiring circuit substrate, being arranged with high electrical connection reliability between multiple wiring patterns formed with a fine wiring pitch, and excellent high frequency characteristics and the like is important.

As a method for manufacturing such a multilayer wiring circuit substrate, as is shown in FIG. 26A to FIG. 26E, a so-called plating method for manufacturing a multilayer wiring circuit substrate having a wiring pattern 93, a via 94 and a land 95 has been proposed (see Japanese Laid Open Patent Publication No. 2003-257979) by forming a metal layer 91 above an insulating film 3 formed with a trench groove part by sputtering and non-electrolytic plating or the like (see FIG. 26A), embedded copper as conductor 92 within the trench groove part as a conductor by an electrolytic plating process (see FIG. 26B to FIG. 26D), and performing a polishing treatment (see FIG. 26E).

In addition, as is shown in FIG. 27A to FIG. 27C, a so-called paste method for manufacturing a multilayer wiring circuit substrate having the wiring pattern 93, the via 94 and the land 95 has been proposed (see Japanese Laid Open Patent Publication No. H10-56060) in which a metal layer 91 is formed by sputtering and non-electrolytic plating or the like (see FIG. 27A) on the insulating film 3 in which the trench groove part is formed and a polishing process is performed (see FIG. 27C) after embedding a conductive paste including metal particles as conductor 92 in the trench grove part (see FIG. 27B).

In order to improve high frequency characteristics, it is important to match the characteristic impedance of the entire system and reduce the transmission path loss for reliably transmitting a signal. One cause of the transmission path loss is loss due to conductor resistance (referred to as conductor loss below). Conductor loss, especially in the transmission of high frequency signals, causes an increase in resistance which leads to signal attenuates (loss increases) due to a current being concentrated on the surface of the transmission path and an effective cross section through which the current flows becoming smaller.

Japanese Laid Open Patent Publication No. 2004-87928 discloses a technique in which the surface resistance of the transmission path is reduced to a specific numerical value or less by controlling the surface roughness of an opposing transmission path sandwiching an insulating layer in a multilayer wiring substrate in order to reduce conductor loss in a high frequency signal. In addition, Japanese Laid Open Patent Publication No. 2011-103602 discloses arranging convex parts at the end parts of the transmission path in order to reduce conductor loss in a high frequency signal and increasing the surface area of the region area where the current is concentrated.

SUMMARY

A wiring substrate according to an embodiment of the present invention includes: a first wiring layer, a second wiring layer disposed on the first wiring layer interposed by an insulating film, and a via conductor passing through the insulating film in a thickness direction, the via conductor electrically connecting the first wiring layer and the second wiring layer. The second wiring layer and the via conductor include a second sintered metal layer and a first sintered metal layer arranged to surround the second sintered metal layer, and an average particle diameter of first metal particles forming the first sintered metal layer is smaller than an average particle diameter of second metal particles forming the second sintered metal layer.

A method of manufacturing a wiring substrate according to another embodiment of the present invention includes: forming an insulating film pattern including a through hole exposing a part of a first wiring layer and a recess part on the first wiring layer, applying a first conductive paste including first metal particles to cover the insulating film pattern and forming a first sintered metal layer by sintering the first conductive paste, and applying a second conductive paste including second metal particles to cover the first sintered metal layer and to fill the through hole and the recess part, and forming a second sintered metal layer by sintering the second conductive paste. An average particle diameter of the first metal particles is smaller than an average particle diameter of the second metal particles.

A wiring substrate according to another embodiment of the present invention includes: a first wiring layer, a second wiring layer disposed on the first wiring layer interposed by an insulating film, and a via conductor passing through the insulating film in a thickness direction, the via conductor electrically connecting the first wiring layer and the second wiring layer. The second wiring layer and the via conductor include a sintered metal layer, and a sputtered metal layer or non-electrolytic plated metal layer arranged to surround the sintered metal layer.

BRIEF DESCRIPTION OF DRAWINGS

FIG. 11A to FIG. 11C is a process flow diagram (first) showing a cross-sectional view of each step of a manufacturing method of a wiring substrate related to one embodiment of the present disclosure;

FIG. 12A to FIG. 12D is a process flow diagram (second) showing a cross-sectional view of each step of a manufacturing method of a wiring substrate related to one embodiment of the present disclosure;

FIG. 13 is a cross-sectional diagram showing a schematic structure of a wiring substrate related to one embodiment of the present disclosure;

FIG. 14A to FIG. 14D is a process flow diagram (second) showing a cross-sectional view of each step of a manufacturing method of a wiring substrate related to one embodiment of the present disclosure;

DESCRIPTION OF EMBODIMENTS

Figure 1:
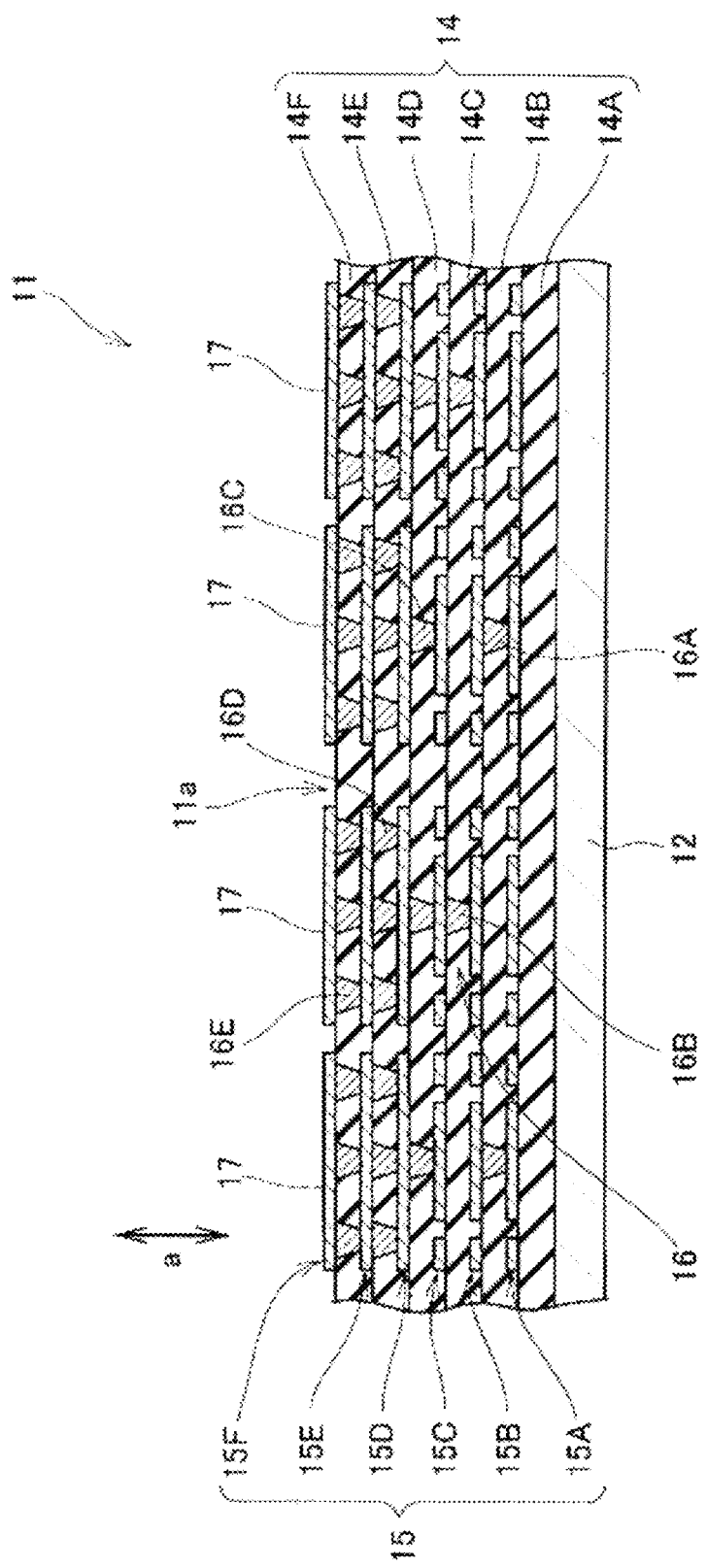
FIG. 1 is schematic partial cross-sectional view showing a mounting component related to one embodiment of the present disclosure.

The embodiments of the present disclosure are explained below while referring to the drawings. Furthermore, the drawings are schematic or conceptual and the dimensions of each member and the ratio of the sizes between members are not necessarily the same as actual ones, and even in the case where they are expressed as the same member, in some cases the dimensions and ratios of each member may be represented differently depending on the drawing. The mounting components, wiring substrate, electronic device and the manufacturing method thereof according to the embodiments of the present disclosure can be implemented in many different modes and should not be interpreted as being limited to the description of the embodiments described below. Furthermore, in the drawings referred to in the present embodiment, the same reference numerals are attached to the same parts or parts having similar functions, and a repetitive description thereof is omitted. In addition, for the purpose of convenience of explanation, although an explanation is made using the phrases "above" or "below", the up/down direction may be reversed.

Together with an increase in density, mounting components to be mounted are miniaturized in wiring or interlayer connectors, the number of pins is increasing which leads to a dynamically fragile structure compared with multilayer wiring substrates. For example, in a mounting component such as an LSI, wiring or the interlayer connectors are generally thin and dynamically fragile. As a result, breakage of the mounting components due to a load applied at the time of being mounted on a multilayer wiring substrate becomes a problem. Therefore, in order to prevent the mounting components from being breaking, if the load applied at the time of mounting is reduced, obstruction of mutual electrode connections due to dispersion of the mounting load caused by the mounting components having multiple pins becomes a problem.

In addition, in the method of Japanese Laid Open Patent Publication No. 2013-16780 in which a multilayer wiring substrate has a dynamically rigid structure, a dummy pattern which does not contribute to the electric circuit is arranged inside in order to increase the metal ratio inside the multilayer wiring substrate. However, when recent demands for high density are considered, there is a problem whereby a dummy pattern which does not contribute to an electric circuit instead generates a parasitic capacitance component with respect to an electric signal which is a cause of obstructing signal transmission.

Figure 26A:
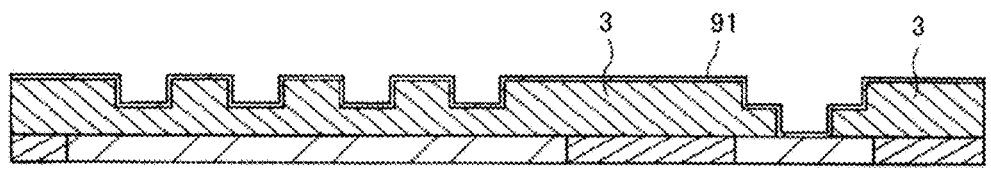
FIG. 26A to FIG. 26E is a process flow diagram showing a cross-sectional view of each process of a manufacturing method (plating method) of a conventional multilayer wiring circuit substrate; and FIG. 27A to FIG. 27C is a process flow diagram showing a cross-sectional view of each process of a manufacturing method (paste method) of a conventional multilayer wiring circuit substrate.
Figure 26B:
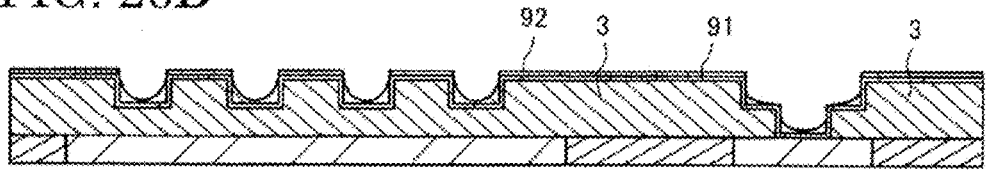
Figure 26C:
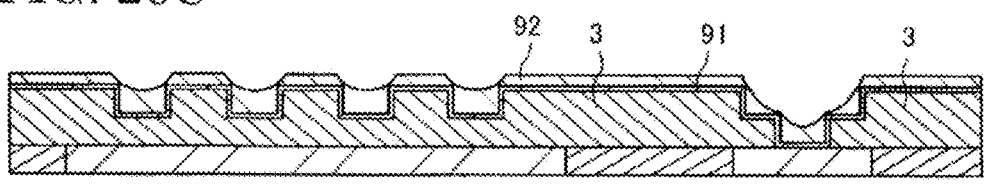
Figure 26D:
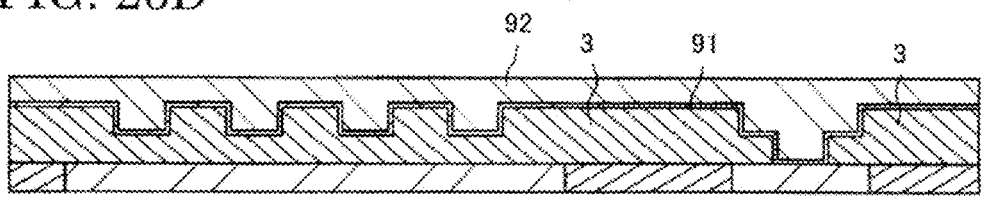
Figure 26E:
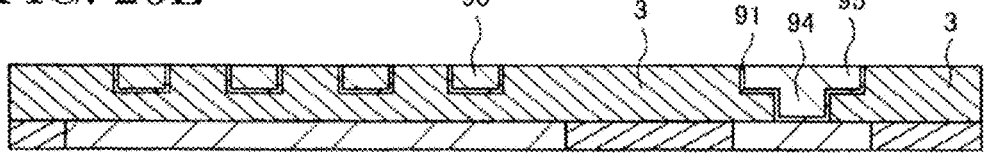
Figure 27A:
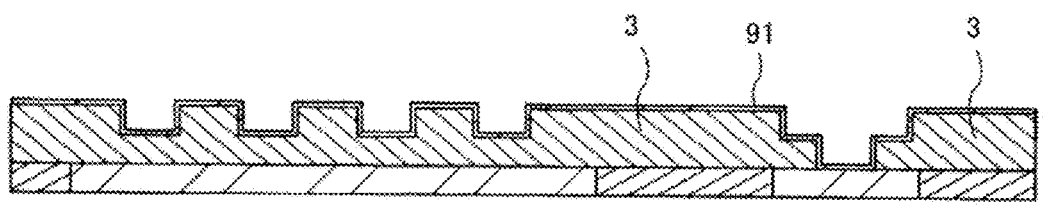
Figure 27B:
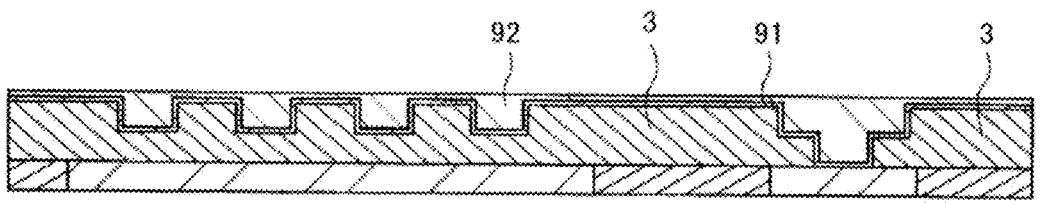
Figure 27C:
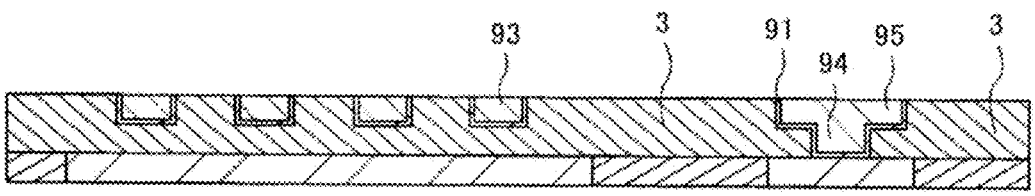

In the plating method disclosed in Japanese Laid Open Patent Publication No. 2003-257979 described above, within the trench groove part, because the depth and width between the groove part for the wiring pattern 93 and the groove part (including a through hole) for the via 94 and the land 95 are different, in order to form a conductor forming the wiring pattern 93, the via 94 and the land 95 densely and flatly, a plating process including a step is necessary. Specifically, first, a copper plating layer as conductor 92 which acts as an underlayer is densely formed with a low current density (about 1 A/dm$^2$) (see FIG. 26B), and after a conductor 92 is embedded in a trench groove part with a medium current density (about 2 A/dm$^2$) (see FIG. 26C) leveling is performed at a high current density (exceeding 2 A/dm$^2$) (see FIG. 26D). As described above, the plating treatment must be performed while changing the current density stepwise and thereby a long time electrolytic copper plating treatment is necessary. In addition, because a conducting layer must be formed thick above the insulating film in order to be leveled, a long polishing process is required thereafter. Therefore, the manufacturing process of a multilayer wiring circuit substrate becomes complicated and manufacturing yield is poor which is a problem.

In addition, in the paste method disclosed in the Japanese Laid Open Patent Publication No. H10-56060 described above, generally a sintering type conductive paste is used. In order to improve electrical connection reliability and high frequency characteristics in the GHz to THz band, it is necessary to use a low viscosity (low concentration) conductive paste including a metal filler having a relatively small grain diameter to form a dense conducting layer. In particular, forming a dense conducting layer at a connection part with a lower layer wiring in the via 94 leads to an improvement in electrical connection reliability and high frequency characteristics. However, when a low viscosity conductive paste is used, volume reduction when sintering is large, and in order to embed a conductor in the trench groove part having a predetermined depth and in particular the groove part (including a through hole) for the via 94 and the land 95, overcoating a plurality of times of is necessary and there is a problem whereby manufacturing yield of a multilayer wiring circuit substrate deteriorates. When a conductive paste including a metal filler having a relatively large particle diameter is used to form a conducting layer in a short amount of time, the viscosity (concentration) of the conductive paste becomes high, it becomes difficult to form a dense conducting layer, and in particular, there is concern that the reliability of an electrical connection between the via 94 and lower layer wiring and high frequency characteristics will deteriorate.

In addition, in Japanese Laid Open Patent Publication No. 2004-87928 described above, a process for controlling the surface roughness of a transmission path is separately required, and in Japanese Laid Open Patent Publication No. 2011-103602, a process for forming a convex part at the end part of the transmission path is separately required which increases the manufacturing processes. Furthermore, in Japanese Laid Open Patent Publication No. 2004-87928 and No. 2011-103602, the conductor material of the transmission path is not considered at all.

Some of the embodiments described below provide mounting component, wiring substrate, electronic device and manufacturing method thereof solving one or a plurality of these problems.

First Embodiment

[Mounting Components]

FIG. 1 is a schematic partial cross-sectional diagram showing one embodiment of a mounting component of the present disclosure. In FIG. 1, the mounting component 11 includes a multilayer structure in which a plurality of conductor layers are stacked on a base material 12 via an insulating layer 14, and an interlayer connector 16 electrically connecting upper and lower conductor layers 15 interposed by the insulating layer 14. In the illustrated example, the insulating layer 14 has six insulating layers 14A to 14F, the conductor layer 15 has six conductor layers 15A to 15F, and interlayer connectors 16A to 16E for electrically connecting the upper and lower conductor layers 15A to 15F interposed by each insulating layer 14A to 14F. In addition, the conductor layer 15F located on the insulating layer 14F of the outermost surface 11a of the mounting component 11 has a plurality of electrode pads 17 which are surface electrodes.

Figure 2:
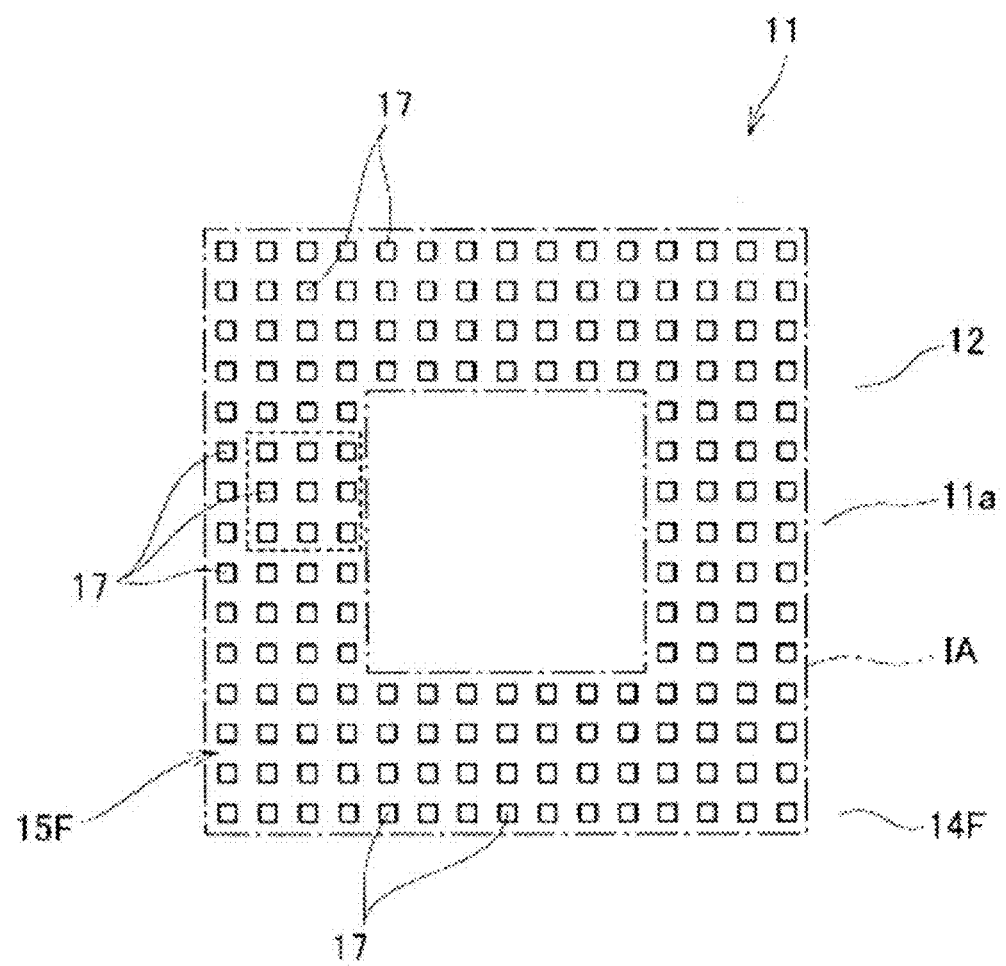
FIG. 2 is a planar view diagram showing an example of an arrangement of electrode pads of a mounting component related to one embodiment of the present disclosure.

FIG. 2 is a planar diagram showing an example of the arrangement of the electrode pads 17 of this type of mounting component 11. An annular mounting region IA (shown surrounded by a dotted line in FIG. 2) having a rectangular outline in a planar view and having a non-mounting region at the center is demarcated in the insulating layer 14F of the outermost surface 11a of the mounting component 11. In this mounting area IA, a plurality of electrode pads 17 are arranged at a predetermined pitch so as to be located at lattice shaped intersections. The mounting area IA can be defined so as to become a region, for example, to a position spaced by 25 μm from the electrode pad 17 located at the outer side end of the lattice shaped arrangement. In FIG. 2, although the conductor layer 15F located in the mounting area IA is only the plurality of electrode pads 17, according to necessity, wiring patterns or the like of the conductor layer 15F may also be located in the mounting area IA.

In the mounting component 11, in each of the conductor layers 15A to 15E excluding the conductor layer 15F of the outermost surface 11a, the area $S_{15}$ of the conductor layer overlapping the mounting area IA in the thickness direction of the multilayer structure (direction shown by the arrow a in FIG. 1) is in the range of 60% to 95%, preferably 70% to 95% of the area $S_{IA}$ of the mounting area IA. If the area $S_{15}$ of the conductor layer overlapping with the mounting area IA is less than 60% of the area $S_{IA}$ of the mounting area IA, the mounting component 11 becomes dynamically fragile, and the internal structure of the mounting component 11 may be broken due to the load applied at the time of mounting on the multilayer wiring substrate. In addition, if the area $S_{15}$ of the conductor layer overlapping with the mounting area IA exceeds 95% of the area $S_{IA}$ of the mounting area IA, it is difficult to sufficiently separate pairs of circuit patterns from each other, and unnecessary vicinity effect occur which is not preferable.

Here, the area $S_{15}$ of a conductor layer indicates the area of each conductor layer when seen in a planar view from the direction indicated by the arrow a of each conductor layer 15A to 15E overlapping with the mounting area IA in the thickness direction of the multilayer structure (direction indicated by the arrow a in FIG. 1). For example, in the conductor layer 15E, the area $S_{15E}$ of the conductor layer which exists in a range overlapping the mounting region IA defined in the insulating layer 14F in the thickness direction of the multilayer structure is preferably in the range of 60% to 95% of the area $S_{IA}$ of the mounting region IA and more preferably in the range of 70% to 95%. The same is true for the conductor layers 15A to 15D. In this way, when the area $S_{IA}$ of the mounting area IA is 100%, in each of the conductor layers 15A to 15E excluding the conductor layer 15F of the outermost surface 11a, the area $S_{15A}$ to $S_{15E}$ of each conductor layer overlapping the mounting area IA in the thickness direction of the multilayer structure is in the range of 60% to 95% and preferably in the range of 70% to 95%, so that even when a load is appropriately applied to the mounting components when the mounting component 11 is flip-chip mounted on the multilayer wiring substrate and integrated, the mounting components are prevented from damage, thereby mutual electrode connection is prevented from being obstructed due to dispersion of the mounting load due to the mounting components being multi-pin, so that it is possible to stably perform mutual electrode connection between the multilayer wiring substrate and the mounting components.

Figure 3A:
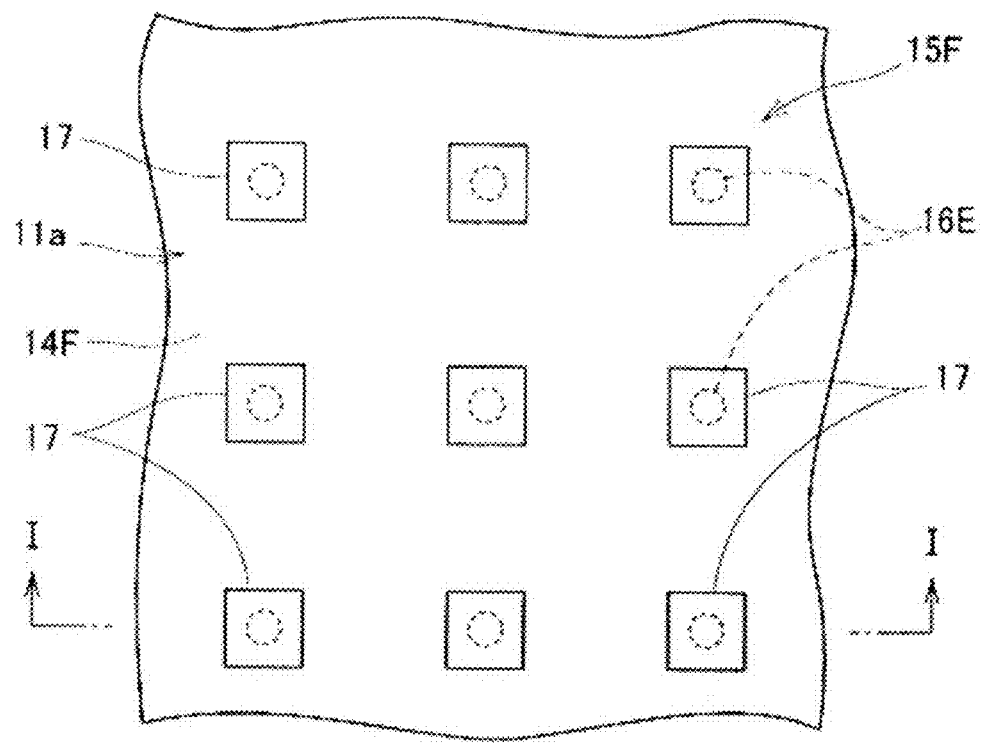
FIG. 3A and FIG. 3B is a diagram for explaining a region surrounded by a dotted line in FIG. 2.
Figure 3B:
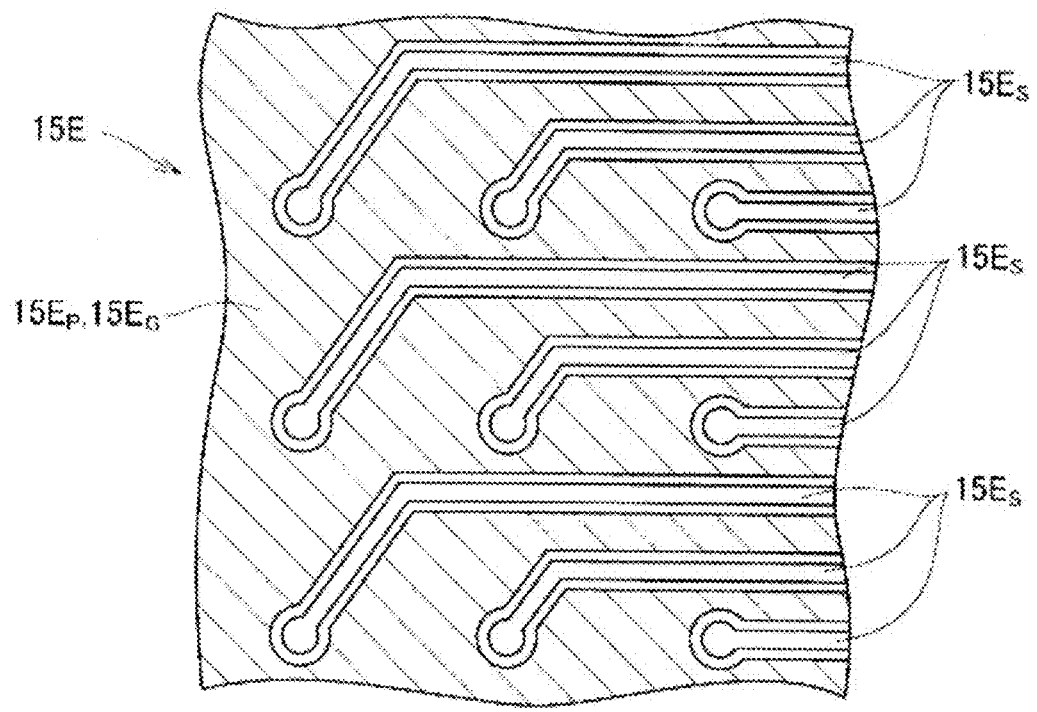
Figure 4:
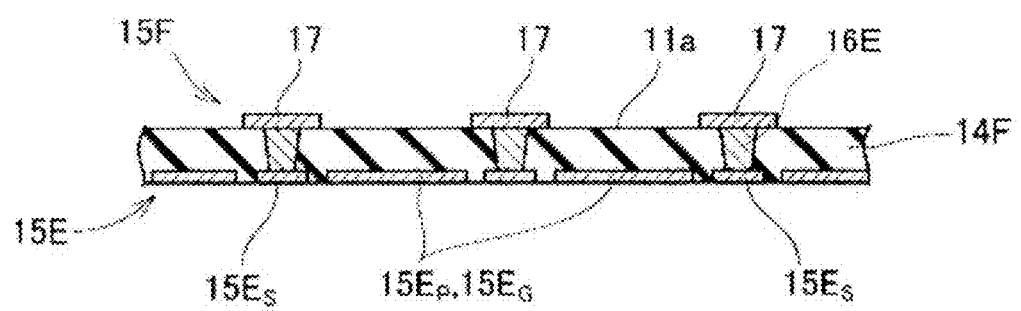
FIG. 4 is a horizontal cross-sectional diagram along the line I-I in FIG. 3A.

In addition, in the mounting component 11, the areas $S_{15A}$ to $S_{15E}$ of each of the conductor layers 15A to 15E overlapping the mounting area IA in the thickness direction of the multilayer structure (the direction indicated by the arrow a in FIG. 1) are preferred to be larger as the conductor layers become closer to the outermost surface 11a of the mounting component 11. Therefore, the areas $S_{15A}$ to $S_{15E}$ of each of the conductor layers 15A to 15E existing in a range overlapping the mounting area IA defined in the insulating layer 14F in the thickness direction of the multilayer structure are preferred to satisfy $S_{15A} \leq S_{15B} \leq S_{15C} \leq S_{15D} \leq S_{15E}$. When the relationship described above is established for the areas $S_{15A}$ to $S_{15E}$ of each of the conductor layers 15A to 15E, when the mounting component 11 is flip-chip mounted on the multilayer wiring substrate and integrated, even when an appropriate load is applied to the mounting components in order to ensure mutual electrode connection, it is possible to more reliably prevent the occurrence of breakage of the mounting components FIG. 3A and FIG. 3B is a diagram for explaining a region surrounded by a dotted chain line in FIG. 2. FIG. 3A is a planar view of a region surrounded by a dotted line on the outermost surface 11a of the mounting component 11 in FIG. 2, and FIG. 4 is a horizontal cross-sectional view along the line I-I in FIG. 3A. In FIG. 4, only the conductor layer 15F, the insulating layer 14F, the interlayer connector 16E and the conductor layer 15E are shown from the outermost surface 11a side of the mounting component 11 and other layers are omitted. As is shown in the diagram, the conductor layer 15F includes a plurality of electrode pads 17 which are surface electrodes, and an interlayer connector 16E (shown by a chain line in FIG. 3A) is located below each electrode pad 17. This interlayer connector 16E is electrically connected to a desired part of the conductor layer 15E which is the lower layer of the conductor layer 15F.

In addition, FIG. 3B is a planar view showing only the conductor layer 15E after removing the conductor layer 15F, the insulating layer 14F and the interlayer connector 16E from FIG. 3A. This conductor layer 15E has a signal pattern $15E_S$ electrically connected to the interlayer connector 16E and a power supply pattern $15E_P$ or a ground pattern $15E_G$ (shown hatched in FIG. 3B) which is electrically insulated from the signal pattern $15E_S$ and is located in the periphery of the signal pattern $15E_S$.

As is described above, in the mounting component 11, it is preferred that the conductor layers 15A to 15E form a circuit pattern and that no dummy pattern is present. In this way, it is possible to prevent the generation of a parasitic capacitance component due to a dummy pattern and suppress a factor that obstructs signal transmission. Furthermore, in the present disclosure, it is not excluded that the conductor layers 15A to 15E include a dummy pattern. For example, in the case when a power supply pattern or a ground pattern exists between a dummy pattern and a signal pattern used for signal transmission, the generation of a parasitic capacitance component due to a dummy pattern is suppressed. In addition, even in the case when there is no power supply pattern or ground pattern, the separation distance between the signal pattern and the dummy pattern is set to, for example, about 3 to 5 times or more the width in a direction perpendicular to the signal transmission direction of the signal pattern shape, and thereby it is possible to suppress the generation of a parasitic capacitance component which is preferable.

In addition, in the mounting component 11, in the conductor layer 15E located immediately below the conductor layer 15F of the outermost surface 11a interposed by the insulating layer 14F, it is preferred that the area of the conductor layer 15E overlapping with the electrode pad 17 included in the conductor layer 15F of the outermost surface 11a in the thickness direction (direction indicated by the arrow a in FIG. 1) of the multilayer structure is 50% or more, preferably 75% or more of the area of the electrode pad 17. If the area of the conductor layer 15E overlapping with the electrode pad 17 is less than 50% of the area of the electrode pad 17, the mounting component 11 becomes dynamically fragile and there is a possibility of breakage of the internal structure of the mounting component 11 due to the load applied at the time of mounting on the multilayer wiring substrate which is not preferable.

Figure 5A:
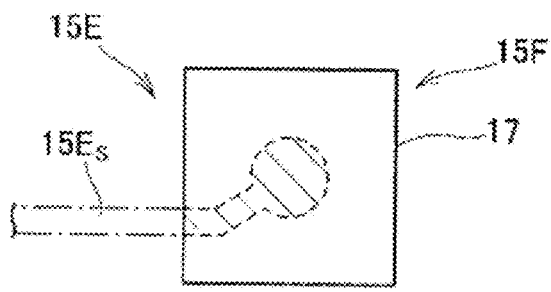
FIG. 5A to FIG. 5D is a diagram for explaining a relationship between an electrode pad and a conducting layer on a lower layer thereof.

FIG. 5A to FIG. 5D is a diagram for explaining the relationship between an electrode pad 17 included in the conductor layer 15F and the conductor layer 15E on a lower layer. In FIG. 5A to FIG. 5D, the outline of the electrode pad 17 included in the conductor layer 15F is indicated by a solid line, the outline of the conductor layer 15E on a lower layer is indicated by a dotted line, the outline of the conductor layer 15E overlapping with the electrode pad 17 is indicated by a chain line, and overlapping parts are indicated by diagonal lines. In FIG. 5A, an example is shown in which the conductor layer 15E located on a lower layer of the electrode pad 17 is only the signal pattern $15E_S$ electrically connected with the electrode pad 17 via the interlayer connector 16E. In the example shown in FIG. 5A, the area of the signal pattern $15E_S$ (part shown by a hatched area) overlapping with the electrode pad 17 is approximately 15% when the area of the electrode pad 17 is 100%.

Figure 5B:
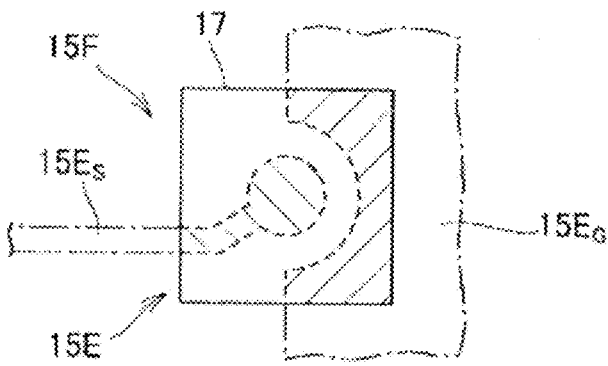
Figure 5C:
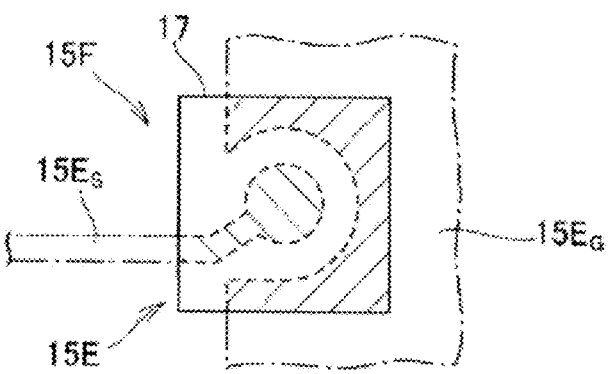

In addition, in FIG. 5B and FIG. 5C, an example is shown in which the conductor layer 15E located on a lower layer of the electrode pad 17 is the signal pattern $15E_S$ and the ground pattern $15E_G$ located in a state electrically insulated from the signal pattern $15E_S$. In the example shown in FIG. 5B, the total of the areas of the signal pattern $15E_S$ and the ground pattern $15E_G$ (parts hatched with diagonal lines) overlapping the electrode pad 17 is about 50% when the area of the electrode pad 17 is 100%, and in the example shown in FIG. 5C is about 65%.

Figure 5D:
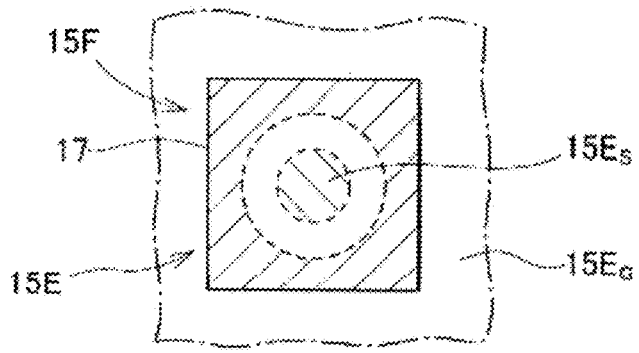

Furthermore, in FIG. 5D, an example is shown in which the conductor layer 15E located on a lower layer of the electrode pad 17 is a signal pattern $15E_S$ and a ground pattern $15E_G$ located in a state electrically insulated in the periphery of the signal pattern $15E_S$. In the example shown in FIG. 5D, the total of the areas of the signal pattern $15E_S$ and the ground pattern $15E_G$ (the parts hatched by diagonal lines) overlapping with the electrode pad 17 is about 75% when the area of the electrode pad 17 is 100%.

Here, in FIG. 5B to FIG. 5D, examples are shown in which the conductor layer 15E located on a lower layer of the electrode pad 17 is a signal pattern $15E_S$ electrically connected to the electrode pad 17 via the interlayer connector 16E, and a ground pattern $15E_G$ located in a state electrically insulated in the periphery of the signal pattern $15E_S$. However, the present invention is not limited to this structure, and as long as the total of the areas is within the range described above, then the conductor layer 15E located on a lower layer of the electrode pad 17 may only be the signal pattern $15E_S$ electrically connected to the electrode pad 17 via the interlayer connector 16. In addition, instead of the ground pattern $15E_G$, it may be a power supply pattern $15E_P$ or a combination of the ground pattern $15E_G$ and the power supply pattern $15E_P$. Furthermore, as long as it is possible to prevent the generation of a parasitic capacitance component, a signal pattern $15E_S$ electrically insulated from the electrode pad 17 may also be included.

As is described above, in the thickness direction of the multilayer structure, the area of the lower layer conductor layer 15E overlapping with the electrode pad 17 located on the outermost surface 11a is 50% or more, preferably 75% or more of the area of the electrode pad 17, thereby rigidity is dynamically improved. In this way, when the mounting component 11 is flip-chip mounted on the multilayer wiring substrate and integrated, even if a load is appropriately applied to the mounting component in order to ensure mutual electrode connection, it is possible to more reliably prevent breakage of the mounting component.

The base material 12 which forms this type of a mounting component 11 may be silicon or glass or the like. In addition, the rectangular dimensions which are the outline of the base material 12 in a planar view can be set according to the dimensions required for the mounting component 11, and the thickness of the base material 12 can be appropriately set within a range of, for example, 50 to 1000 µm.

In addition, the insulating layer 14 (14A to 14F) which forms the mounting component 11 can be formed by an organic material such as an epoxy resin, a benzocyclobutene resin, a cardo resin, a polyimide resin, or the like, or a combination of these organic materials and glass fiber or the like, and the thickness can be set within a range of 100 to 4000 µm.

In addition, the conductor layers 15 (15A to 15F) and the interlayer connectors 16 (16A to 16E) which form the mounting component 11 can be made of a conductive material such as copper, silver, gold, chromium, aluminum and nickel. In addition, the electrode pad 17 included in the conductor layer 15F may be the conductive materials described above and may further have a three-layer structure of gold/nickel/gold or a two-layer structure of nickel/gold or the like.

In mounting such a mounting component according to the present disclosure on a multilayer wiring substrate, breakage of the mounting component can be prevented and mutual electrode connection of the multilayer wiring substrate and the mounting component can be stably performed.

The embodiment of the mounting component described above is an example, and the present disclosure is not limited to this embodiment. For example, a circuit pattern formed by a conductor layer may form a passive component such as a capacitor, a resistor, an inductor, a transformer or an LCR circuit and the like together with at least one of a signal pattern, a power supply pattern and a ground pattern. Furthermore, the circuit pattern may form an active component such as an operational amplifier or an active component such as a logic or a memory element or the like.

[Manufacturing Method of Mounting Components]

Figure 6A:
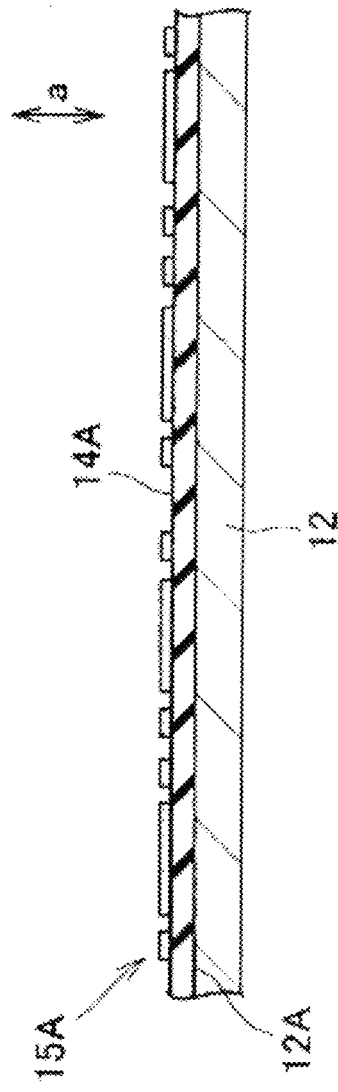
FIG. 6A to FIG. 6C is a process diagram for explaining a manufacturing method of a mounting component related to one embodiment of the present disclosure.
Figure 6B:
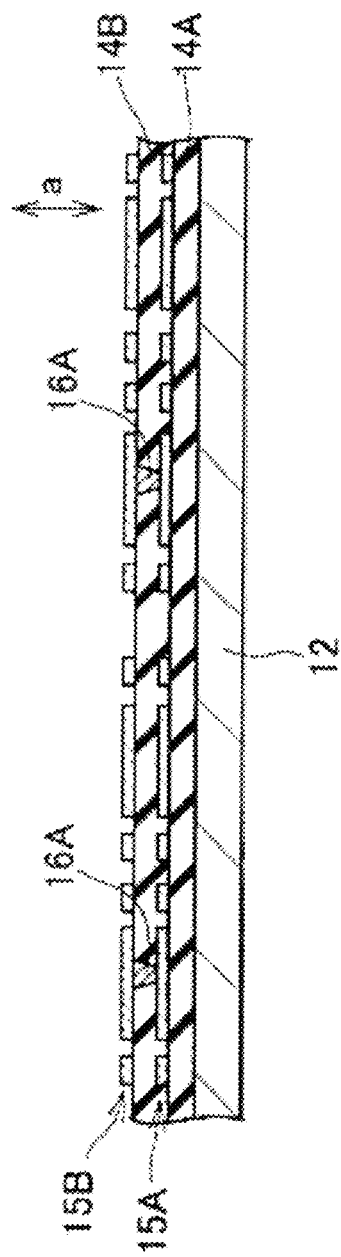
Figure 6C:
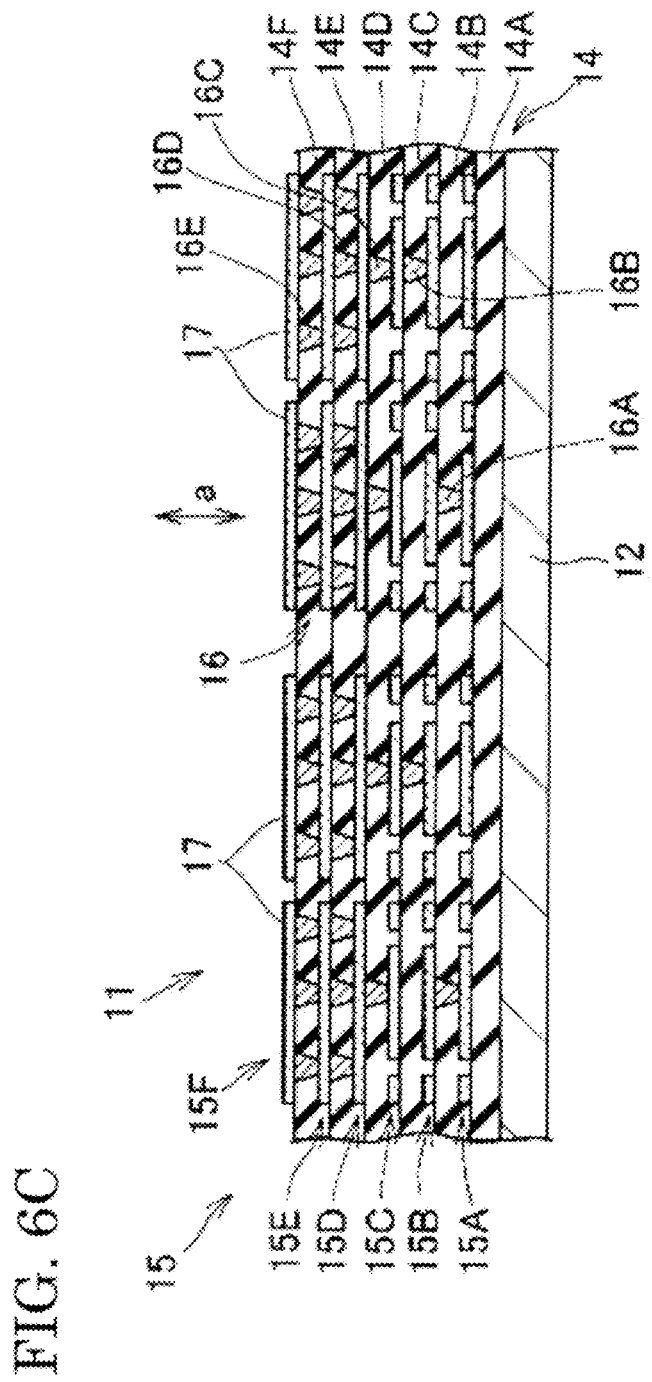

FIG. 6A to FIG. 6C is a process diagram for explaining one embodiment of a method for manufacturing a mounting component according to the present disclosure, and the manufacturing method of the mounting component 11 described above is used as an example.

In the method of manufacturing a mounting component according to the present disclosure, an insulating layer 14A is first formed on one surface 12A of a substrate 12, and a conductor layer 15A is formed at a desired part of the insulating layer 14A (FIG. 6A). In the formation of the conductor layer 15A on the insulating layer 14A, a mounting region IA (not shown in the diagram) in which the electrode pad 17 is arranged is set in advance in the insulating layer 14F which becomes the outermost surface 11a of the mounting component 11 which is the object of manufacture. Next, the area of the conductor layer 15A overlapping this mounting region IA in the thickness direction (direction shown by the arrow a in FIG. 6A to FIG. 6C) of the stacked structure formed in the subsequent process is 60% to 95%, more preferably 70% to 95% of the area of the mounting area IA.

In this way, it is possible to easily and reliably manufacture the mounting component 11 which can prevent breakage occurring of the internal structure even if an appropriate load is applied to the mounting component. Therefore, when the mounting component 11 is flip-chip mounted on the multilayer wiring substrate and integrated, it is possible to stably perform mutual electrode connection between the multilayer wiring substrate and the mounting component.

It is possible to use silicon or glass or the like as the substrate 12 and the thickness can be, for example, about 50 μm to 1000 μm.

The formation of the insulating layer 14A can be carried out, for example, by coating a coating liquid containing an electrically insulating resin material such as an epoxy resin, a benzocyclobutene resin, a cardo resin or a polyimide resin or a combination of these electrically insulating resin materials and glass fibers, or by a known coating method for coating a coating liquid a combination of containing these electrically insulating resin materials and glass fibers, and then subjecting the coating liquid to a predetermined curing treatment such as heating, ultraviolet irradiation or electron beam irradiation or the like.

Formation of the conductor layer 15A on the insulating layer 14A can be carried out, for example, as follows. First, a conductive material thin film is formed on the insulating layer 14A by a known vacuum film-forming method such as a sputtering method. For example, copper, silver, gold, chromium, aluminum or nickel and the like can be used as the conductive material. Next, a photosensitive resist is coated on the conductive material thin film, and a desired pattern exposure and development are performed to form a resist pattern. Following this, it is possible to form the conductor layer 15A by etching the conductive material thin film using this resist pattern as a mask.

Next, the conductor layer 15B is formed on the conductor layer 15A via the insulating layer 14B, and desired parts of the conductor layer 15A and the conductor layer 15B located above and below via the insulating layer 14B are connected by the interlayer connector 16A (FIG. 6B). Also in the formation of the conductor layer 15B, the area of the conductor layer 15B overlapping the mounting area IA (not shown in the diagram) described above in the thickness direction of the stacked structure is 60% to 95%, preferably 70% to 95% of the area of the mounting area IA.

Here, a photosensitive insulating layer which serves as the insulating layer 14B is formed using a photosensitive insulating material, the photosensitive insulating layer is exposed through a predetermined mask, and developed to form the insulating layer 14 B having hole parts at predetermined positions of the conductor layer 15A for forming the interlayer connector 16A. After washing, a conductive material thin film is formed on the hole part and the insulating layer 14B described above by a known vacuum film formation method such as a sputtering method, a resist layer is formed on the conductive material thin film, and a desired pattern exposure and development are performed to form a resist pattern. Next, by using this resist pattern as a mask, it is possible to form the conductor layer 15B and the interlayer connector 16A by etching the conductive material thin film.

In addition, the formation of the insulating layer 14B, the conductor layer 15B and the interlayer connector 16A can also be performed as follows. That is, the insulating layer 14B is formed to cover the conductor layer 15A, and a hole part for forming the interlayer connector 16A is formed in the insulating layer 14B using a carbon dioxide laser or a UV-YAG laser and the like. Then, after washing, a conductive material thin film is formed on the hole part described above and the insulating layer 14B by a known vacuum film-forming method such as a sputtering method. Next, a dry film resist is laminated on the conductive material thin film and a desired pattern exposure and development are performed to form a resist pattern. Next, by using this resist pattern as a mask, it is possible to form the conductor layer 15B and the interlayer connector 16A by etching the conductive material thin film.

Next, in the same step, a conductor layer 15C is formed on the conductor layer 15B via the insulating layer 14C, and desired parts of the conductor layer 15B and the conductor layer 15C located above and below via the insulation layer 14C are connected by the interlayer connector 16B. Furthermore, by repeating this process, finally, the conductor layer 15F having the electrode pad 17 is formed on the conductor layer 15E via the insulating layer 14F, and desired parts of the conductor layer 15E and conductor layer 15F located above and below via the insulating layer 14F are connected by the interlayer connector 16E (FIG. 6C). In this way, the mounting component 11 is manufactured.

Also in the formation of the conductor layers 15C to 15E, the area of each of the conductor layers 15C to 15E overlapping the mounting area IA (not shown in the diagram) in the thickness direction of the stacked structure is 60% to 95%, preferably 70% to 95% of the area of the mounting area IA %.

In addition, in the method of manufacturing a mounting component according to the present disclosure, in the formation of the conductor layer 15E, the area of the conductor layer 15E overlapping with the electrode pad 17 included in the conductor layer 15F formed in a subsequent process is preferred to be 50% or more, preferably 75% or more than the area of the electrode pad 17. In this way, it is possible to easily and reliably manufacture the mounting component 11 which can reliably prevent the occurrence of breakage of the internal structure even if an appropriate load is applied to the mounting component. Therefore, when the mounting component 11 is flip-chip mounted on the multilayer wiring substrate and integrated, it is possible to reliably connect mutual electrodes.

In addition, in the method for manufacturing a mounting component according to the present disclosure, it is preferred that the area of each of the conductor layers 15A to 15E overlapping the mounting region IA (not shown in the diagram) which is set in advance in the thickness direction of the multilayer structure becomes larger as the conductor layers become closer to the outermost surface 11a of the mounting component 11. In this way, it is possible to easily and reliably manufacture the mounting component 11 which can more surely prevent the occurrence of breakage of the internal structure even if an appropriate load is applied to the mounting component. Therefore, when the mounting component 11 is flip-chip mounted on the multilayer wiring substrate and integrated, it is possible to stably perform mutual electrode connection between the multilayer wiring substrate and the mounting component.

In addition, in the method for manufacturing a mounting component according to the present disclosure, in the formation of each of the conductor layers 15A to 15E, a circuit pattern is formed including at least one of a signal pattern for transmitting a signal, a power supply pattern for maintaining a power supply potential and a ground pattern for maintaining a ground potential, and it is preferable that a dummy pattern which does not form a circuit pattern is not formed. In this way, it is possible to prevent the generation of a parasitic capacitance component due to a dummy pattern and to manufacture a mounting component excluding the factor of obstructing signal transmission.

A method of forming a desired pattern on an insulating material by imprint lithography technology has recently been developed in addition to the photolithography technology described above. A method of manufacturing a mounting component according to a modified example of the embodiment of the present disclosure is explained using FIG. 7A to FIG. 7F.

FIG. 7A to FIG. 7F is a process diagram for explaining a modified example of the method of manufacturing a mounting component according to the present disclosure, and the manufacture of the mounting component 11 described above is used as an example. In this modified example, the same reference numerals are attached to the same structures as those of the first embodiment, and a detailed description thereof is omitted.

Figure 7A:
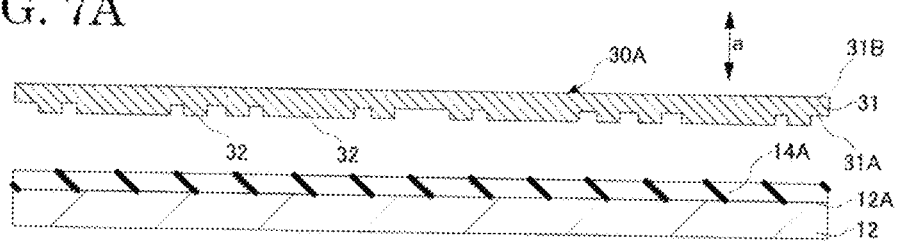
FIG. 7A to FIG. 7F is a process diagram for explaining a manufacturing method of a mounting component related to one embodiment of the present disclosure.

In the manufacturing method of the mounting component according to the present disclosure, first, as well as forming the insulating layer 14A on one surface 12A of the substrate 12, an imprint mold 30A for forming the conductor layer 15A at a desired part of the insulating layer 14A is prepared (FIG. 7A). The imprint mold 30A includes a base material 31 having a first surface 31A and a second surface 31B opposing the first surface, and a convex part 32 formed on the first surface 31A of the base material 31. The convex part 32 forms a concave part corresponding to the conductor layer 15A on the insulating layer 14A.

In the formation of the concave part corresponding to the conductor layer 15A on the insulating layer 14A, a mounting area IA (not shown in the diagram) in which the electrode pad 17 is arranged in the insulating layer 14F which serves as the outermost surface 11a of the mounting component 11 is set in advance. Next, the area of the conductor layer 15A overlapping the mounting area IA in the thickness direction (direction indicated by the arrow a in FIG. 7A) of the stacked structure formed in the subsequent process is 60% to 95%, preferably 70% to 95% of the area of the mounting area IA. In this way, it is possible to easily and reliably manufacture the mounting component 11 which can prevent the breakdown of the internal structure even if an appropriate load is applied to the mounting component. Therefore, when the mounting component 11 is flip-chip mounted on the multilayer wiring substrate and integrated, it is possible to stably perform mutual electrode connection between the multilayer wiring substrate and the mounting component.

The dimensions and the pitch of the convex part 32 are not particularly limited and can be appropriately set according to the dimensions and pitch of the conductor layer 15A in the mounting component 11. However, when the mounting component 11 is required to have excellent high frequency characteristics, for example, the size and the pitch of the convex part 32 can be set to about 0.5 µm to 20 µm.

It is possible to use silicon or glass or the like as the substrate 12, and the thickness can be, for example, about 50 µm to 1000 µm. A material having electrical insulating properties can be used as a material forming the insulating layer 14A and examples thereof include an epoxy resin material, a phenol resin material, a polyimide resin material, a polysulfone resin material, a polyester resin material and a polycarbonate based resin material and the like. The thickness of the insulating layer 14A is preferably about 3 µm to 30 µm.

Figure 7B:
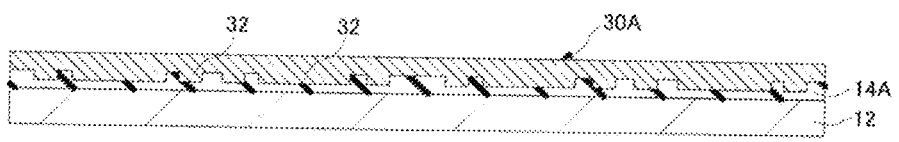

The imprint mold 30A is pressed to the insulating layer 14A on the substrate 12 to form a concave part corresponding to the convex part 32 of the imprint mold 30A, and in this state the insulating layer 14A is cured (FIG. 7B). The method of curing the insulating layer 14A may be appropriately selected according to the curing characteristics of the resin material which forms the insulating layer 14A. For example, in the case where the insulating layer 14A is formed of an ultraviolet curable resin, the insulating layer 14A can be cured by irradiating ultraviolet rays in a state where the imprint mold 30A is pressed into the insulating layer 14A.

Figure 7C:
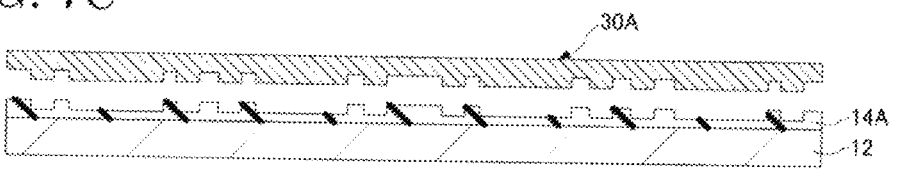

The imprint mold 30A is peeled from the cured insulating layer 14A (FIG. 7C). In this way, the insulating layer 14A in which the concave part for forming the conductor layer 15A is formed is manufactured.

Figure 7D:

The conductor layer 15A is formed in a recess part corresponding to the convex part 32 of the imprint mold 30A of the insulating layer 14A (FIG. 7D). The formation of the conductor layer 15A on the insulating layer 14A can be performed, for example, as follows. First, a conductive material thin film is formed on the insulating layer 14A by a known vacuum film-forming method such as a sputtering method. For example, copper, silver, gold, chromium, aluminum and nickel and the like can be used as the conductive material. Next, a conductive paste including a metal filler such as gold, silver or copper or the like is coated and filled on the conductive material thin film by a printing method and the conductive layer 15A can be formed by a sintering treatment.

The average particle size of the metal filler included in the conductive paste is, for example, about 50 nm or more, preferably about 60 nm to 300 nm. The metal filler concentration of the conductive paste is, for example, about 30% to 80% by mass. When the metal filler concentration of the conductive paste is within this range, a metal layer can be formed thick so that it is possible to form the conductor layer 15A which fills the concave part of the insulating layer 14A by a single coating and sintering process.

Furthermore, in the present embodiment, the average particle diameter of the metal filler included in the conductive paste means the individual average particle diameter calculated using particle diameter analysis software (for example, particle analysis ver. 3.5 (manufactured by Nittetsu Sumikin Technology Co., Ltd.)) or image analysis software A image (manufactured by Asahi Kasei Engineering Co., Ltd., etc.) and the like). Here, the particle diameter L2 of the metal filler indicates the average of the short diameter d2 and the long diameter D2 of the projected image of the metal filler (formula 1).

$$L2=(d2+D2)/2 \qquad \text{(formula 1)}$$

The average particle diameter of the metal filler can be obtained by calculating the average value of the particle diameter L2 per 10 metal fillers.

The sintering temperature and sintering time of the conductive paste are not particularly limited as long as the metal filler included in the conductive paste can be sintered and there is no particular limit as long as it is possible to volatilize a solvent or the like included in the conductive paste, and is about 0.5 to 2 hours at 150° C. to 250° C.

Figure 7E:

The conductor layer 15A is formed by performing a polishing process on the conductor layer 15A covering the insulating layer 14A to such an extent that the insulating layer 14A can be exposed (FIG. 7E).

Figure 7F:
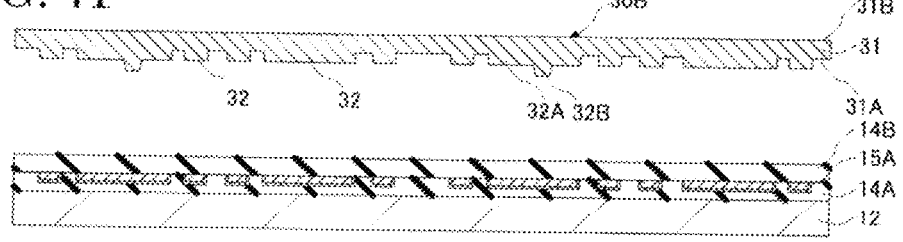

Next, as well as forming the insulating layer 14B on the conductor layer 15A, an imprint mold 30B for forming the conductor layer 15B at a desired part of the insulating layer 14B, the conductor layer 15A located above and below via the insulating layer 14B, and the interlayer connection body 16A at a desired position of conductor layer 15B is prepared (FIG. 7F). The imprint mold 30B has a base material 31 having a first surface 31A and a second surface 31B opposing the first surface, and a convex part 32 formed on the first surface 31A of the base material 31. The convex part 32 includes a first convex part 32A for forming a first convex part for forming a concave part corresponding to the conductor layer 15B on the insulating layer 14B, and a second convex part 32B for forming a hole part corresponding to the interlayer connector 16A on the insulating layer 14B. The first convex part 32A and the second convex part 32B are connected to each other so that the conductor layer 15B and the interlayer connector 16A are electrically connected to each other, and the concave part corresponding to the first convex part 32A formed on the insulating layer 14B and the hole corresponding to the second convex part 32B are continuous. Also in the formation of the conductor layer 15B, the area of the conductor layer 15B overlapping the mounting area IA (not shown in the diagram) in the thickness direction of the stacked structure is 60% to 95%, preferably 70% To 95% of the area of the mounting area IA.

In the same step, the imprint mold 30B is pressed into the insulating layer 14B to form a concave part corresponding to the convex part 32 of the imprint mold 30B, and in this state the insulating layer 14B is cured. By peeling the imprint mold 30B from the cured insulating layer 14B, an insulating layer 14B is formed in which a concave part for forming the conductor layer 15B and a hole part for forming the interlayer connector 16A are manufactured. A conductive material thin film is formed on the hole part and the insulating layer 14B described above by a known vacuum film formation method such as a sputtering method, a conductive paste including a metal filler such as gold, silver or copper or the like is coated and filled on the conductive material thin film by a printing method, and it is possible to form the conductor layer 15B and the interlayer connector 16A by performing a sintering treatment.

A conductor layer 15C is formed on the conductor layer 15B via the insulating layer 14C and desired parts of the conductor layer 15B and the conductor layer 15C located above and below via the insulation layer 14C are connected by the interlayer connector 16B. Furthermore, by repeating this process, finally the conductor layer 15F including the electrode pad 17 is on the conductor layer 15E via the insulating layer 14F, and the desired part of the conductor layer 15F conductor layer 15F located above and below via the insulating layer 14F are connected by the interlayer connector 16E. In this way, the mounting component 11 is manufactured. Also in the formation of the conductor layers 15C to 15E, the area of each of the conductor layers 15C to 15E overlapping the mounting area IA (not shown in the diagram) in the thickness direction of the stacked structure is 60% to 95%, preferably 70% to 95% of the area of the mounting area IA.

In addition, in the method of manufacturing a mounting component according to the present disclosure, in the formation of the conductor layer 15E, the area of the conductor layer 15E overlapping with the electrode pad 17 included in the conductor layer 15F formed in a subsequent process is preferably 50% or more, preferably 75% or more of the area of the electrode pad 17. In this way, it is possible to easily and reliably manufacture the mounting component 11 which can reliably prevent the occurrence of breakage of the internal structure even if an appropriate load is applied to the mounting component. Therefore, when the mounting component 11 is flip-chip mounted on the multilayer wiring substrate and integrated, it is possible to reliably connect mutual electrodes.

In addition, in the method for manufacturing a mounting component according to the present disclosure, the area of each of the conductor layers 15A to 15E overlapping the mounting region IA (not shown in the diagram) set in advance in the thickness direction of the multilayer structure is preferred to become larger the closer the conductor layer is to the outermost surface 11a. In this way, it is possible to easily and reliably manufacture the mounting component 11 which can more surely prevent the occurrence of breakage of the internal structure even if an appropriate load is applied to the mounting component. Therefore, when the mounting component 11 is flip-chip mounted on the multilayer wiring substrate and integrated, it is possible to stably perform mutual electrode connection between the multilayer wiring substrate and the mounting component.

In addition, in the method for manufacturing a mounting component according to the present disclosure, in the formation of each of the conductor layers 15A to 15E, a circuit pattern is formed including at least one of a signal pattern for transmitting a signal, a power supply pattern for maintaining a power supply potential and a ground pattern for maintaining a ground potential and it is preferred that a dummy pattern which does not form a circuit pattern is not formed. In this way, it is possible to prevent the generation of a parasitic capacitance component due to the dummy pattern and to manufacture a mounting component excluding the factor of obstructing signal transmission.

In addition, in the method for manufacturing a mounting component according to the present disclosure, it is possible to waster less liquid and be less expensive compared to a photolithography method. In addition, similar to the imprint mold 30B, by forming the convex part 32 in a plurality of steps by forming the first convex part 32A for forming a convex part corresponding to the conductor layer 15B on the insulating layer 14B, and the second convex part 32b for forming the hole corresponding to the interlayer connector 16A on the insulating layer 14B, it is possible to perform a plurality of layers by lithography in a single step. For example, in the case of forming the conductor layer 15B and the interlayer connector 16A, while it is necessary to form the conductor layer 15B and the interlayer connector 16A in each step by a photolithography method, they can be formed collectively by an imprint lithography method, and it is possible to reduce costs by a reduction in processes. In addition, the imprint lithography method can form a fine pattern compared with the photolithography method, and is particularly effective because it has a high degree of freedom with respect to product design for use in manipulating the density of the formed pattern as in invention of the present application.

The embodiment of the method for manufacturing the mounting component described above is an example, and the present disclosure is not limited to this embodiment. For example, a circuit pattern in each of the conductor layers 15A to 15E may form a passive component such as a capacitor, a resistor, an inductor, a transformer or an LCR circuit and the like as well as at least one of a signal pattern, a power supply pattern and a ground pattern. Furthermore, the circuit pattern may be an active component such as an operational amplifier or an active component such as a logic or a memory element or the like.

In addition, in the method of manufacturing a mounting component according to the present disclosure, the conductive layers 15A to 15E do not exclude including a dummy pattern and in this case, for example, in the case where a power supply pattern or a ground pattern exists between a dummy pattern and a signal pattern used for signal transmission, the generation of a parasitic capacitance component due to the dummy pattern is suppressed. In addition, even in the case when no power supply pattern or ground pattern is present, by setting the separation distance between the signal pattern and the dummy pattern to, for example, 3 to 5 times or more of the signal pattern shape, it is possible to suppress the generation of a parasitic capacitance component, which is preferable.

[Electronic Device]

Figure 8:
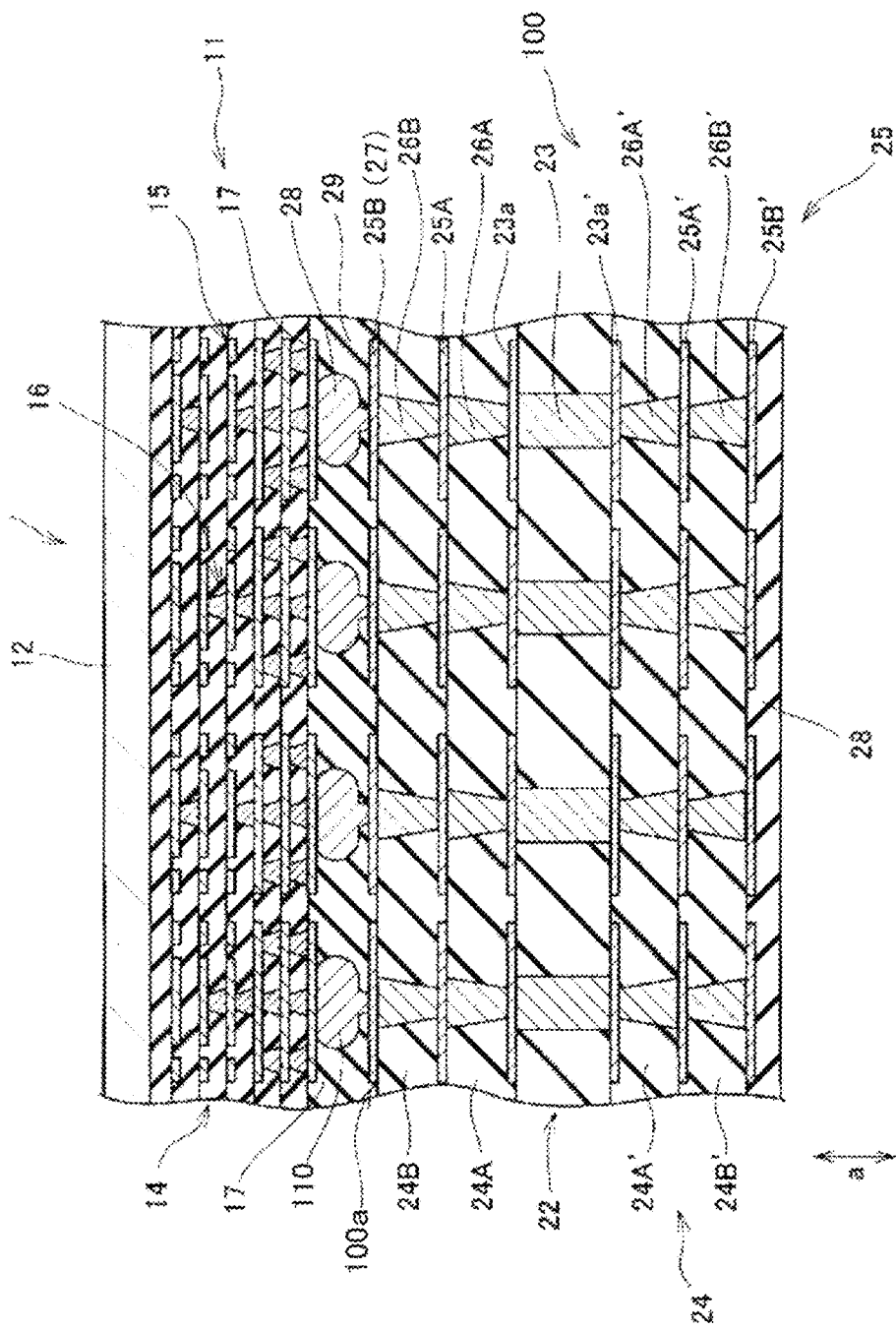
FIG. 8 is schematic partial cross-sectional view showing an electronic device related to one embodiment of the present disclosure.

FIG. 8 is a schematic partial cross-sectional diagram showing one embodiment of the electronic device of the present disclosure. In the electronic device 1 in FIG. 8, the mounting component 11 is flip-chip mounted on the multilayer wiring substrate 100 via a conductive material 110, and an insulating material 29 is present in a gap between the mounting component 11 and the multilayer wiring substrate 100. In this embodiment, the mounting component 11 is the mounting component according to the present disclosure as described above, and an explanation hereof is omitted here.

The multilayer wiring substrate 100 includes a core base material 22 and a multilayer structure in which a plurality of conductor layers 25 are stacked on both surfaces of the core base material 22 interposed by an insulating layer 24. The core base material 22 includes a plurality of front and rear conductive members 23 which pass through the core base material 22, a conductor layer 23a electrically connected with a certain front and rear conductive member 23 on the front surface (in the illustrated example, the surface on which the mounting component 11 is mounted) of the core base material 22, and a conductor layer 23a' electrically connected to a certain front and rear conducting member 23 on the rear surface of the core base material 22. Such a core base material may be an electrically insulating material such as glass or polyamide resin or the like.

Conductive layers 25A and 25B are stacked via insulating layers 24A and 24B on the front surface side (in the illustrated example, the surface on which the mounting component 11 is mounted) of the core base material 22, and an interlayer connector 26A electrically connecting the conductor layer 23a located above and below via the insulating layer 24A and the conductor layer 25A, and an interlayer connector 26B electrically connecting the conductor layer 25A located above and below via the insulation layer 24B and the conductor layer 25B are arranged.

In addition, conductor layers 25A' and 25B' are stacked on the rear surface side of the core base material 22 interposed by the insulating layers 24A' and 24B', and an interlayer connector 26A' electrically connecting the conductor layer 23a' located above and below via the insulating layer 24A' and the conductor layer 25A', and an interlayer connector 26B' connecting the conductor layer 25A' located above and below via the insulating layer 24B' and the conductor layer 25B' are arranged. Then, a solder resist 28 is arranged covering the whole area or a desired part of the conductor layer 25B'.

In the multilayer wiring substrate 100, a mounting region (not shown in the diagram) is defined in the insulating layer 24B of the outermost surface 100a on which the mounting component 11 is mounted, and a plurality of electrode pads 27 are located in this mounting region. In addition, in each of the conductor layers 25A, 23a, 23a', 25A' and 25B' excluding the conductor layer 25B located on the outermost surface 100a in the multilayer wiring substrate 100, the area of the conductor layer overlapping with the mounting region in the thickness direction (the direction indicated by the arrow a in FIG. 8) of the multilayer structure is 60% to 95%, preferably 75% to 95% of the area of the mounting region.

It is possible to use a conductive material such as gold or the like as the conductive material 110 for flip chip mounting the mounting component 11 on the multilayer wiring substrate 100. For example, it is possible to arrange the conductive material 110 in advance on the electrode pads 17 of the mounting component 11 and by performing thermocompression bonding it is possible to perform flip-chip mounting.

It is possible to use a thermosetting resin such as an epoxy resin or a thermosetting resin containing a filler as the insulating material 29 located in the gap between the mounting component 11 and the multilayer wiring substrate 100. For example, a thermosetting resin can be applied to the outermost surface 100a of the multilayer wiring substrate 100, and after the conductive material 110 arranged in advance on the electrode pads 17 of the mounting component 11 is thermocompression bonded to an electrode pad 27 of the multilayer wiring substrate 100, thermal curing is performed to form the insulating material 29. In addition, after the conductive material 110 arranged in advance on the electrode pad 17 of the mounting component 11 is thermocompression bonded to the electrode pad 27 of the multilayer wiring substrate 100 and integrated, it is possible fill the thermosetting resin in the gap between the mounting component 11 and the multilayer wiring substrate 100 and then form the insulating material 29 by heating and curing.

In the electronic device according to the present disclosure, mutual electrode connection between the multilayer wiring substrate and the mounting component is reliable, circuit connection stability is high, breakage of the mounting component is prevented and reliability of the electronic device of the invention is high. Furthermore, in the case when each conductor layer forming a mounting component forms a circuit and no dummy pattern is present, a factor which generates a parasitic capacitance component with respect to an electric signal and obstructs signal transmission is eliminated, and reliability of the electronic device of the invention is further increased.

The embodiment of the electronic device described above is an example, and the present disclosure is not limited to such an embodiment. For example, the multilayer wiring substrate 100 may be a printed wiring substrate, an interposer or a mother substrate or the like.

Second Embodiment

[Wiring Substrate]

Figure 9:
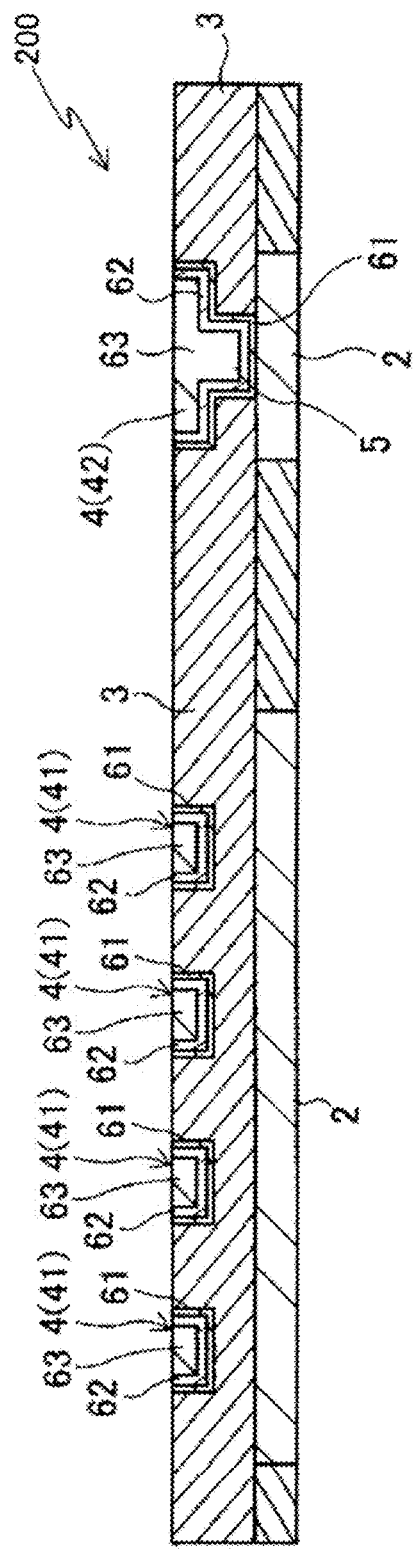
FIG. 9 is a cross-sectional diagram showing a schematic structure of a wiring substrate related to one embodiment of the present disclosure.
Figure 10:
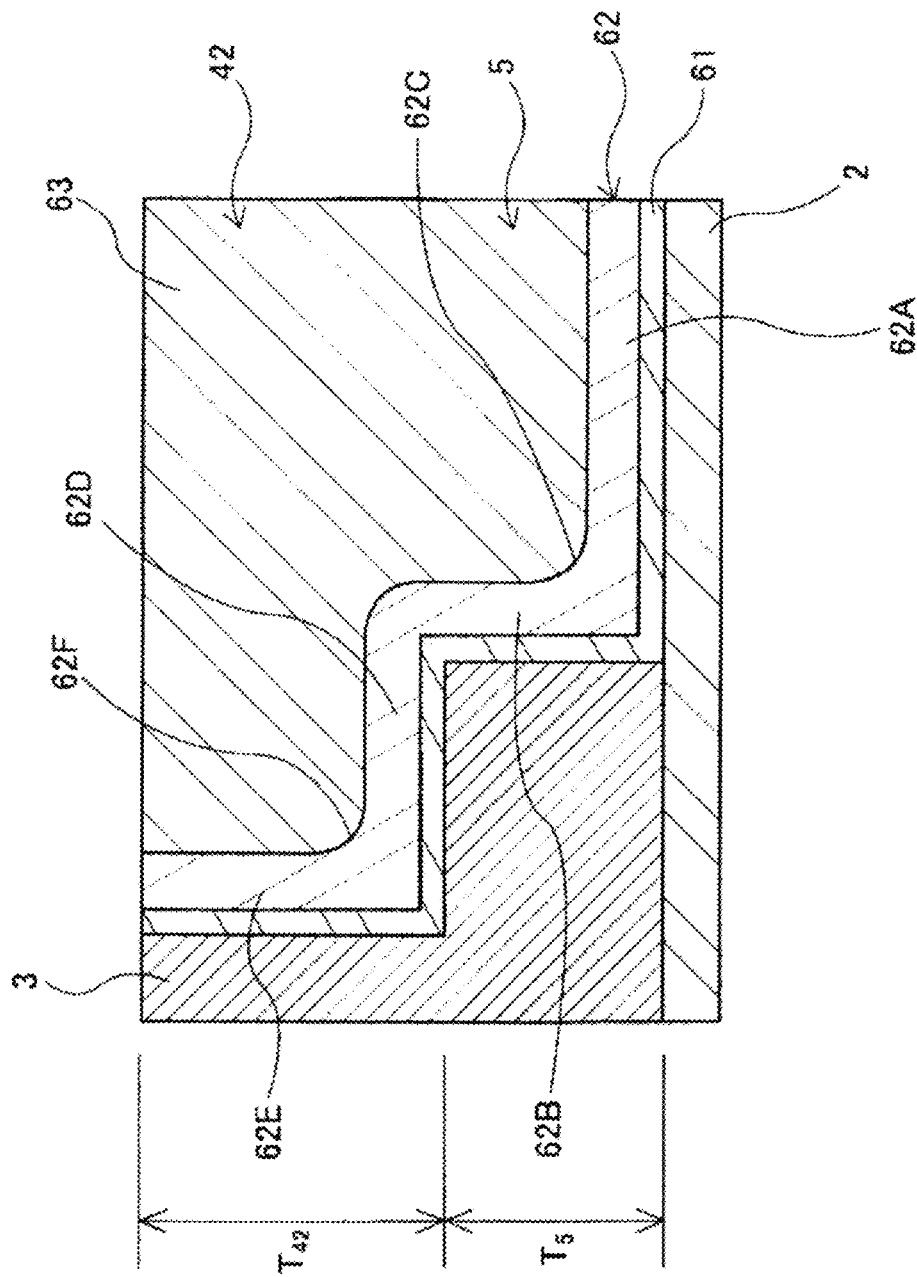
FIG. 10 is a partial expanded cross-sectional diagram showing a schematic structure in the vicinity of a via conductor in a wiring substrate related to one embodiment of the present disclosure.

A wiring substrate according to a second embodiment of the present disclosure is explained while referring to the drawings. FIG. 9 is a cross-sectional diagram showing a schematic structure of a wiring substrate according to one embodiment of the present disclosure, and FIG. 10 is a partial enlarged cross-sectional diagram showing a schematic structure in the vicinity of a via conductor in the wiring substrate according to one embodiment of the present disclosure.

As is shown in FIG. 9, the wiring substrate 200 according to the present embodiment is arranged with a first wiring layer 2, an insulating film 3 and a second wiring layer 4 in this order and a via conductor 5 passing through in the thickness direction of the insulating film 3 and electrically connecting the first wiring layer 2 and the second wiring layer 4. Furthermore, although a wiring substrate having two wiring layers 2 and 4 and one via conductor 5 for electrically connecting these two wiring layers is explained as an example in the present embodiment, the present invention is not limited to such a mode and the wiring substrate may have three or more wiring layers. In such a wiring substrate, an insulating film may be interposed between each wiring layer and a via conductor for electrically connecting each wiring layer may be arranged.

As long as it is a material having electrical insulation properties, there is no particular limitation to the material which forms the insulating film 3 located between the first wiring layer 2 and the second wiring layer 4 and examples thereof include an epoxy resin material, phenol resin material, polyimide resin material, polysulfone resin material, polyester resin material and polycarbonate resin material and the like. The thickness of the insulating film 3 can be set to about 3 μm to 30 μm for example.

The second wiring layer 4 includes a wiring part 41 and a land part 42 which is electrically connected to the first wiring layer 2 via the via conductor 5. The second wiring layer 4 and the via conductor 5 have a metal layer 61, a first sintered metal layer 62 and a second sintered metal layer 63 from the outer side in a cross-sectional view in the thickness direction. In other words, in the wiring substrate 200, the metal layer 61 is arranged so as to be in contact with the surface on the inner side of the recess part arranged in the insulating film 3, the first sintered metal layer 62 is arranged so as to be in contact with the metal layer 61, and the second wiring layer 4 and via conductor 5 in which the second sintered metal layer 63 is arranged so as to be in contact with the first sintered metal layer 62 are arranged. That is, in the wiring substrate 200 according to the present embodiment, the first sintered metal layer 62 surrounds the second sintered metal layer 63, and the second wiring layer 4 and a via conductor 5 are arranged so that the metal layer 61 surrounds the first sintered metal layer 62.

The metal layer 61 prevents a short circuit due to migration of a conductive material between adjacent wiring parts 41, in particular, short circuits due to migration of the conductive material which readily occur the smaller the dimensions and pitch (about 10 μm or less) of the wiring part 41, and is a layer that plays the function of ensuring electrical insulation between the wiring parts 41. For example, titanium (Ti), chromium (Cr), molybdenum (Mo), tungsten (W), indium (In), niobium (Nb), cobalt (Co) and the like are examples of the material forming the metal layer 61. It is more preferable to use, for example, titanium (Ti), titanium nitride (TiN), chromium (Cr), chromium nitride (CrN), molybdenum (Mo) or the like as a main component of a material forming the metal layer 61. Since the metal layer 61 contains titanium (Ti), titanium nitride (TiN), chromium (Cr), chromium nitride (CrN), molybdenum (Mo) or the like, migration of the conductive material to the insulating film 3 is prevented, and the metal layer 61 functions as a stopper layer for chemical mechanical polishing in a chemical mechanical polishing process for forming the wiring part 41 described later, thereby it is possible to suppress grinding of the conductive material forming the wiring part 41 which is filled in the recess part of the insulating film 3. The method for forming the metal layer 61 is not particularly limited and examples include sputtering and non-electrolytic plating for example. Since the metal layer 61 is formed by sputtering or non-electrolytic plating, it is formed as a dense metal layer having higher conductivity than the first sintered metal layer 62 and the second sintered metal layer 63.

Each of the first sintered metal layer 62 and the second sintered metal layer 63 is formed by sintering a conductive paste including a first metal filler and a second metal filler. Each of the first sintered metal layer 62 and the second sintered metal layer 63 are formed by a first metal particle and a second metal particle. Examples of the first metal particle and the second metal particle include particles of gold, silver, copper, and they may be mutually the same metal particle or different metal particles.

The average particle diameter of the first metal particles which form the first sintered metal layer 62 is smaller than the average particle diameter of the second metal particles which form the second sintered metal layer 63. That is, the first sintered metal layer 62 is a denser metal layer than the second sintered metal layer 63. Furthermore, the average particle diameter of the first metal particles and the second metal particles forming each of the first sintered metal layer 62 and the second sintered metal layer 63 respectively is determined by obtaining an electron microscopic image of an arbitrary cut surface of the first sintered metal layer 62 and the second sintered metal layer 63 and calculating an individual average particle diameter using software which calculates average particle diameter from the electron microscope image (for example, particle analysis ver. 3.5 (manufactured by Nittetsu Sumikin Technology Co., Ltd.), image analysis software A image Kun (Asahi Kasei Engineering Co., Ltd.) etc.).

Here, the particle diameter L1 of the first metal particle and the second metal particle means the average of the short diameter d1 and the long diameter D1 of the first metal particle and the second metal particle which are observed at an arbitrary cut surface of the first sintered metal layer 62 and the second sintered metal layer 63 (formula 2).

$$L1=(d1+D1)/2 \qquad \text{(formula 2)}$$

The average particle diameter of the first metal particle and the second metal particle can be obtained by calculating the average value of the particle diameter L1 per 10 second metal particles of an arbitrary first metal particle and second metal particle observed at an arbitrary cut surface of the first sintered metal layer 62 and the second sintered metal layer 63.

The first sintered metal layer 62 of the via conductor 5 is electrically connected to the first wiring layer 2 via the metal layer 61. In addition, since the first sintered metal layer 62 is formed as a dense metal layer, the conductivity of the first sintered metal layer 62 becomes larger than the conductivity of the second sintered metal layer 63. As a result, it is possible to improve the electrical connection reliability between the first wiring layer 2 and the second wiring layer 4.

In addition, when a high frequency current flows through the wiring part 41 of the wiring substrate 200 according to the present embodiment, a current concentrates on the outer surface of the conductor which forms the wiring part 41 due to a so-called surface skin effect. In the wiring substrate 200 according to the present embodiment, since the outer surface side of the wiring part 41 where the current is concentrated is formed by a dense metal layer (the first sintered metal layer 62 having a high electric conductivity), it is difficult to increase the resistance of the wiring part 41 and therefore the effect of improving the high frequency characteristics can be exhibited. In the wiring substrate 200 according to the present embodiment, since the outermost surface on which the current is concentrated is formed by the most dense metal layer 61 (the metal layer 61 having a higher conductivity), it is difficult to increase the resistance of the wiring part 41 and thereby it possible to further improve the high frequency characteristics. In other words, since the first sintered metal layer 62 is formed as a denser metal layer than the second sintered metal layer 63, the conductivity of the first sintered metal layer 62 becomes larger than that of the second sintered metal layer 63. Furthermore, since the metal layer 61 is formed as a denser metal layer than the first sintered metal layer 62, the conductivity of the metal layer 61 is becomes higher than the conductivity of the first sintered metal layer 62. By selecting a material with high conductivity in the order of the second sintered metal layer 63, the first sintered metal layer 62, and the metal layer 61, it is possible to suppress a change in characteristics of a signal due to the surface skin effect.

A corner part 62C which links a bottom surface part 62A of the first sintered metal layer 62 and a side wall part 62B in the via conductor 5 has a curvature radius of ¼ or more of the height $T_5$ of the via conductor 5. Similarly, a corner part 62F which links a bottom surface part 62D of the first sintered metal layer 62 and a side wall part 62E in the land part 42 also has a curvature radius of ¼ or more of the height $T_{42}$ of the land part 42. As described above, the corner parts 62C and 62F have a predetermined curvature radius so that a dense first sintered metal layer 62 can be formed without producing voids in the corner parts 62C and 62F and it is possible to improve electrical connection reliability and high frequency characteristics.

Furthermore, similarly, in the wiring part 41 of the second wiring layer 4, a corner part linking the bottom surface part of the first sintered metal layer 62 and the side wall part of the wiring part 41 has a curvature radius of ¼ or more of the height of the wiring part 41.

In the wiring substrate 200 having the structure described above, since the first sintered metal layer 62 of the second wiring layer 4 and the via conductor 5 is formed as a denser metal layer than the second sintered metal layer 63 located inside thereof, excellent electrical connection reliability and high frequency characteristics are exhibited.

[Manufacturing Method of Wiring Substrate]

The wiring substrate 200 having the structure described above can be manufactured as follows. FIG. 11A to FIG. 11C and FIG. 12A to FIG. 12D are process flow diagrams showing each step of the method of manufacturing the wiring substrate according to the present embodiment in a cross-sectional view.

First, as well as forming an insulating layer 3' on the first wiring layer 2, an imprint mold 50 for forming the second wiring layer 4 and the via conductor 5 in the insulating layer 3' is prepared (refer to FIG. 11A). It is possible to use a material having electrical insulating properties as the material forming the insulating layer 3' and examples thereof include an epoxy resin material, a phenol resin material, a polyimide resin material, a polysulfone resin material, a polyester resin material and a polycarbonate resin material and the like. The thickness of the insulating layer 3' is preferably about 3 μm to 30 μm.

The imprint mold 50 includes a base material 51 having a first surface 51A and a second surface 51B facing the first surface, and a convex part 52 formed on the first surface 51A of the base material 51. The convex part 52 has a first convex part 52A for forming a concave part corresponding to the second wiring layer 4 (wiring part 41 and land part 42) in the insulating layer 3', and a second convex part 52B for forming a through hole corresponding to the via conductor 5 in the insulating layer 3'. The second convex part 52B is arranged above the first convex part 52A among a plurality of first convex parts 52A formed above a first surface 51A (first convex part 52A for forming a concave part corresponding to the land part 42), and is narrower than the first convex part 52A in a cross-sectional view in the thickness direction of the substrate 51.

Although the dimensions and pitch of the first convex part 52A are not particularly limited and can be appropriately set according to the dimensions and pitch of the second wiring layer 4 in the wiring substrate 200, in the case where excellent high frequency characteristics are required in the substrate 200, for example, the dimensions and pitch of the first convex part 52A can be set to about 0.5 μm to 20 μm.

Figure 11B:
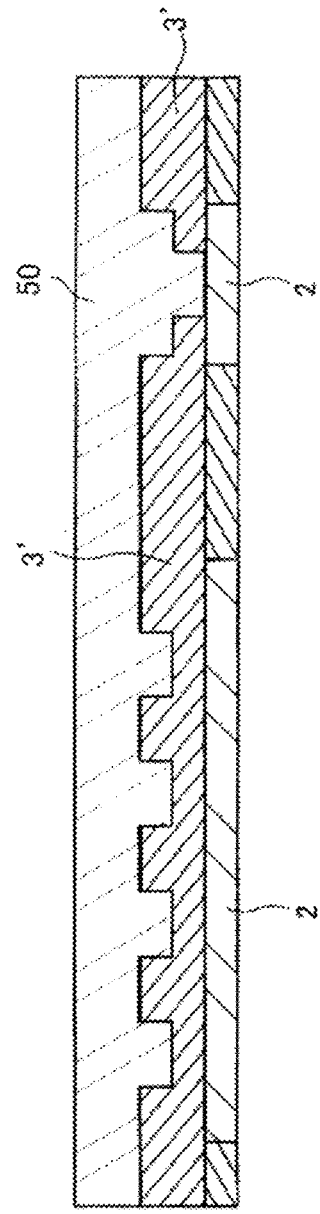

The imprint mold 50 is pressed into the insulating layer 3' on the first wiring layer 2 to form a recess part corresponding to the convex part 52 (first convex part 52A and second convex part 52B) of the imprint mold 50A and through hole (narrow first through hole corresponding to the second convex part 52B and a linking wide second through hole corresponding to the first convex part 52A) are formed, and in this state the insulation layer 3' is cured (refer to FIG. 11B). The method of curing the insulating layer 3' may be appropriately selected according to the curing characteristics of the resin material for forming the insulating layer 3', for example, in the case when the insulating layer 3' is formed from an ultraviolet curable resin, the insulating layer 3' can be cured by irradiating ultraviolet rays in a state where the imprint mold 50 is pressed into the insulation layer 3'.

Figure 11C:
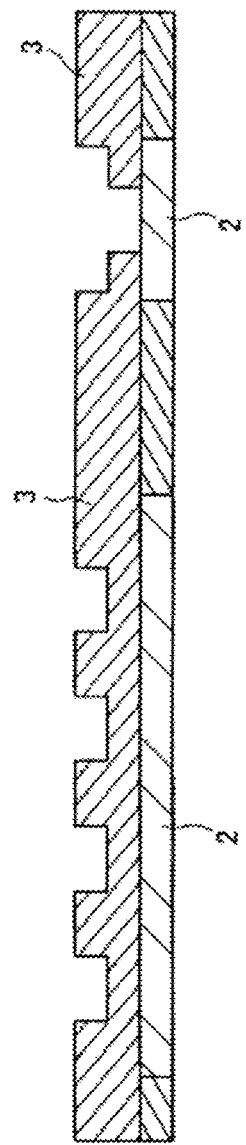

The imprint mold 50 is peeled from the cured insulating layer 3' (refer to FIG. 11C). In this way, the insulating film 3 in which the recess part and the through hole for forming the second wiring layer 4 and the via conductor 5 are formed is manufactured.

Furthermore, in the present embodiment, although a form in which the imprint mold 50 having the predetermined convex part 52 is used as an example to form the concave part and the through hole in the insulating film 3, the embodiment is not limited to such a form and the concave part and the through hole may be formed in the insulating film 3 by using a method such as photolithography or laser cutting and or the like.

Next, a metal layer 61 is formed on the insulating film 3 (refer to FIG. 12A)). Examples of the material (metal material) forming the metal layer 61 include Ti, Cr, Mo, W, In, Nb and Co and the like. By forming the metal layer 61, it is possible to increase the electrical connection reliability between the first wiring layer 2 and the via conductor 5. In the case when the wiring substrate 200 is required to have excellent high frequency characteristics and the dimensions and the pitch of the second wiring layer 4 are set to about 0.5 μm to 20 μm, it is preferred to use Ti or Mo or the like as a material forming the metal layer 61 in order to prevent a short circuit due to migration of the conductor material between adjacent wiring parts 41 in the second wiring layer 4. Ti, TiN, Cr, CrN or Mo or the like is more preferably used as the material forming the metal layer 61. By including Ti, TiN, Cr, CrN or Mo or the like in the metal layer 61, it is possible to prevent a short circuit due to migration of the conductive material between adjacent wiring parts 41 in the second wiring layer 4, and since the metal layer 61 functions as a stopper layer for chemical mechanical polishing in a chemical mechanical polishing process for forming the wiring part 41 described later, it is possible to suppress grinding of the conductive material which forms the wiring part 41 filled in the recess part of the insulating film 3. Although the thickness of the metal layer 61 is not particularly limited, it can be set to about 10 nm to 1000 nm. The method for forming the metal layer 61 is not particularly limited, and examples thereof include sputtering and non-electrolytic plating and the like.

A first metal layer is formed by coating a first conductive paste including a first metal filler such as gold, silver or copper or the like on the metal layer 61, and the first metal layer is subjected to a sintering treatment to form a first sintered metal layer 62 (refer to FIG. 12B). The average particle diameter of the first metal filler included in the first conductive paste is smaller than the average particle diameter of the second metal filler included in the second conductive paste for forming the second metal layer described later, for example, about 50 nm or less and preferably about 10 nm to 40 nm. The first metal filler concentration in the first conductive paste is lower than the second metal filler concentration of the second conductive paste, and is, for example, about 10% to 15% by mass. Since the average particle diameter of the first metal filler included in the first conductive paste is smaller than the average particle diameter of the second metal filler include in the second conductive paste, the first sintered metal layer 62 is formed relatively densely and therefore it is possible to improve the electrical connection reliability between the via conductor 5 and the first wiring layer 2 and excellent high frequency characteristics can be obtained. In addition, since the concentration of the first metal filler in the first conductive paste is about 10% to 15% by mass, it is possible to relatively reduce the viscosity of the first conductive paste, and in the first sintered metal layer 62 obtained by sintering the first metal layer formed by applying the first conductive paste, it is possible to form a curved part having a curvature radius ¼ or more of the height of the side wall part in the corner part which links the side wall part and the bottom surface part, and it is possible to form a dense first sintered metal layer 62 at the corner part. The film thickness of the first sintered metal layer 62 is, for example, about 100 nm to 1000 nm.

The sintering temperature and sintering time of the first metal layer is not particularly limited as long as the metal filler included in the first conductive paste can be sintered and the solvent included in the first conductive paste can be volatilized, and is, for example, about 150° C. to 250° C. and about 0.5 hours to 2 hours.

Next, a second conductive paste including a second metal filler such as gold, silver or copper and the like is coated onto the first sintered metal layer 62 to form the second metal layer which embeds the concave part of the insulating film 3 and the through hole, and the second sintered metal layer 63 is formed by sintering the second metal layer (refer to FIG. 12C). The second metal filler may be the same material as the first metal filler or may be a different material. The average particle diameter of the second metal filler included in the second conductive paste is larger than the average particle diameter of the first metal filler included in the first conductive paste, for example, about 50 nm or more, preferably about 60 nm to 300 nm. The second metal filler concentration of the second conductive paste is higher than the first metal filler concentration of the first conductive paste, and is, for example, about 30% to 80% by mass. Since the second metal filler concentration of the second conductive paste is high, it is possible to increase the thickness of the second metal layer so that the second sintered metal layer 63 which embeds the concave part and the through hole of the insulating film 3 can be formed with a single application and sintering treatment.

Furthermore, in the present embodiment, the average particle diameter of the first metal filler and the second metal filler included in each of the first conductive paste and the second conductive paste means an individual average particle diameter measured using particle diameter analysis software (for example, particle number analysis ver. 3.5 (manufactured by Nippon Steel Sumikin Technology Co., Ltd.) or image analysis software A image kun (Asahi Kasei Engineering Co., Ltd.), etc.)). Here, the particle diameter L2 of the first metal filler and the second metal filler shows the average of the short diameter d2 and the long diameter D2 of the projected images of the first metal filler and the second metal filler (formula 3).

$$L2=(d2+D2)/2 \qquad \text{(formula 3)}$$

The average particle diameter of the first metal filler and the second metal filler can be obtained by calculating the average value of the particle diameter L2 per 10 pieces of the first metal filler and the second metal filler.

The sintering temperature and sintering time of the second metal layer is not particularly limited as long as the second metal filler included in the second conductive paste can be sintered and the solvent included in the second conductive paste can be volatilized, and it is, for example, about 150° C. to 250° C. for about 0.5 hours to 2 hours.

Finally, by performing a polishing treatment on the metal layer 61, the first sintered metal layer 62 and the second sintered metal layer 63 to the extent that the insulating film 3 can be exposed, the second wiring layer 4, and the via conductor 5 for electrically connecting the first wiring layer 2 and the second wiring layer 4 are formed and the wiring substrate 200 is manufactured (refer to FIG. 12D).

According to the manufacturing method of the wiring substrate according to the second embodiment described above, since the first sintered metal layer 62 is formed by using the first conductive paste including the first metal filler having a relatively small average particle diameter at a low concentration, and the second sintered metal layer 63 is formed by using the second conductive paste including the second metal filler having a relatively large average particle diameter inside thereof at a high concentration, it is possible to manufacture the wiring substrate 200 having excellent electrical connection reliability and high frequency characteristics with high yield.

Third Embodiment

[Wiring Substrate]

A wiring substrate according to a third embodiment of the present disclosure is explained while referring to the drawings. FIG. 13 is a cross-sectional diagram showing a schematic structure of a wiring substrate according to one embodiment of the present disclosure. In the third embodiment, the same reference numerals are given to the same structures as those of the second embodiment, and a detailed explanation thereof is omitted.

As is shown in FIG. 13, the wiring substrate 300 according to the present embodiment has a first wiring layer 2, an insulating film 3 and a second wiring layer 4 in this order, and the thickness of the insulating film 3, and is arranged with a via conductor 5 passing through in the thickness direction of the insulating layer 3 and electrically connecting the first wiring layer 2 and the second wiring layer 4.

The second wiring layer 4 includes a wiring part 41 and a land part 42 which is electrically connected to the first wiring layer 2 via the via conductor 5. The second wiring layer 4 and the via conductor 5 have a metal layer 61, a sputtered metal layer or a non-electrolytic plated metal layer 62', and a sintered metal layer 63 from the outside in a cross-sectional view in the thickness direction. In other words, in the wiring substrate 300, the metal layer 61 is arranged to be in contact with the surface of the inner side of the recess part arranged in the insulating film 3, and the sputtered metal layer or the non-electrolytic plated metal layer 62' is arranged to be in contact with the metal layer 61, and a second wiring layer 4 and a via conductor 5 arranged with the sintered metal layer 63 are arranged to be in contact with the sputtered metal layer or the non-electrolytic plating metal layer 62'. That is, in the wiring substrate 300 according to the present embodiment, the sintered metal layer 63 is surrounded by the sputtered metal layer or the non-electrolytic plated metal layer 62', and the second wiring layer 4 and via conductor 5 are arranged with the metal layer 61 to surround the sputtered metal layer or the non-electrolytic plated metal layer 62'.

Since the sputtered metal layer or the non-electrolytic plated metal layer 62' is formed by sputtering or non-electrolytic plating of a metal material (gold, silver, copper, etc.) forming the metal layer, it is a denser metal layer than the sintered metal layer 63. The sputtered metal layer or the non-electrolytic plated metal layer 62' of the via conductor 5 is electrically connected to the first wiring layer 2 via the metal layer 61. In addition, since the sputtered metal layer or the non-electrolytic plated metal layer 62' is formed as a dense metal layer, the conductivity of the sputtered metal layer or the non-electrolytic plated metal layer 62' is higher than the conductivity of the sintered metal layer 63. As a result, it is possible to improve the electrical connection reliability between the first wiring layer 2 and the second wiring layer 4.

In addition, when a high frequency current flows through the wiring part 41 of the wiring substrate 300 according to the present embodiment, a current concentrates on the outer surface of the conductor which forms the wiring part 41 due to the so-called surface skin effect. In the wiring substrate 300 according to the present embodiment, since the outer surface side of the wiring part 41 in which a current concentrates is formed by a dense metal layer (a sputtered metal layer or an non-electrolytic plated metal layer 62' having a higher conductivity than the sintered metal layer 63), it is difficult to increase the resistance of the wiring part 41, therefore the effect of improving high frequency characteristics is exhibited. In the wiring substrate 300 according to the present embodiment, since the outermost surface on which the current is concentrated is formed by the most dense metal layer 61 (the metal layer 61 having a higher conductivity), it is difficult to increase the resistance of the wiring part 41 which makes it possible to further improve high frequency characteristics. In other words, since the sputtered metal layer or the non-electrolytic plated metal layer 62' is formed as a denser metal layer than the sintered metal layer 63, the conductivity of the sputtered metal layer or the non-electrolytic plated metal layer 62' is larger than the conductivity of the sintered metal layer 63. Furthermore, since the metal layer 61 is formed as a denser metal layer than the sputtered metal layer or the non-electrolytic plated metal layer 62', the conductivity of the metal layer 61 is higher than the conductivity of the sputtered metal layer or the non-electrolytic plated metal layer 62'. By selecting a material with high conductivity in the order of the sintered metal layer 63, the sputtered metal layer or the non-electrolytic plated metal layer 62', and the metal layer 61, it is possible to suppress a change in characteristics of a signal due to the surface skin effect.

In the wiring substrate 300 having the structure described above, since the sputtered metal layer or the non-electrolytic plated metal layer 62' of the second wiring layer 4 and the via conductor 5 is formed as a denser metal layer than the sintered metal layer 63 located further inside thereof, excellent electrical connection reliability and high frequency characteristics are exhibited.

[Manufacturing Method of Wiring Substrate]

The wiring substrate 300 having the structure described above can manufacture as follows. FIG. 11A to FIG. 11C and FIG. 14A to FIG. 14D are process flow diagrams showing each step of the method of manufacturing a wiring substrate according to the present embodiment in a cross-sectional view.

First, similar to the second embodiment, the insulating film 3 in which the recess part and through hole for forming the second wiring layer 4 and the via conductor 5 are formed on the first wiring layer 2 is manufactured (refer to FIG. 11A to FIG. 11C).

Next, a metal layer 61 is formed on the insulating film 3 (refer to FIG. 14A). Examples of the material (metal material) forming the metal layer 61 include Ti, Cr, Mo, W, In, Nb, and Co and the like. By forming the metal layer 61, it is possible to increase the electrical connection reliability between the first wiring layer 2 and the via conductor 5. When the wiring substrate 300 is required to have excellent high frequency characteristics and the dimensions and the pitch of the second wiring layer 4 are set to about 0.5 μm to 20 μm, it is preferred to use Ti or Mo and the like as the material forming the metal layer 61 in order to prevent a short circuit due to migration of the conductor material in the metal layer 61 between adjacent wiring parts 41 in the second wiring layer 4. Ti, TiN, Cr, CrN or Mo and the like is more preferably used as the material forming the metal layer 61. By including Ti, TiN, Cr, CrN, Mo or the like in the metal layer 61, it is possible to prevent a short circuit due to migration of the conductive material between adjacent wiring parts 41 in the second wiring layer 4, and since the metal layer 61 functions as a stopper layer for chemical mechanical polishing in a chemical mechanical polishing process for forming a wiring part described later, it is possible to suppress grinding of the conductive material which forms the wiring part 41 which is filled in the recess part of the insulating film 3. Although the thickness of the metal layer 61 is not particularly limited, it can be set to about 10 nm to 1000 nm. The method for forming the metal layer 61 is not particularly limited, and examples thereof include sputtering and non-electrolytic plating and the like.

A sputtered metal layer or non-electrolytic plated metal layer 62' is formed on the metal layer 61 by sputtering or non-electrolytic plating of a metal material such as gold, silver or copper or the like (refer to FIG. 14B). The film thickness of the sputtered metal layer or non-electrolytic plated metal layer 62'b is, for example, about 100 nm to 1000 nm.

Figure 14C:
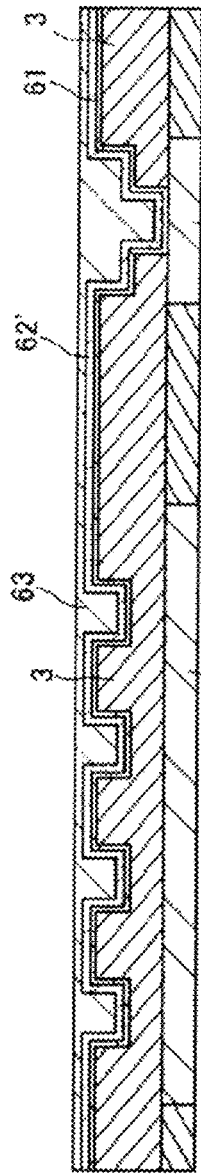

Next, a conductive paste including a metal filler such as gold, silver or copper or the like is coated on the sputtered metal layer or the non-electrolytic plating metal layer 62' to form a metal layer which embeds a recess part and the through hole of the insulating film 3, and the sintered metal layer 63 is formed by sintering the metal layer (refer to FIG. 14C).

The average particle size of the metal filler included in the conductive paste is, for example, about 50 nm or more, preferably about 60 nm to 300 nm. The metal filler concentration of the conductive paste is, for example, about 30% to 80% by mass. Since the metal layer can be formed thick when the concentration of the metal filler in the conductive paste is within the above range, it is possible to for the sintered metal layer 63 which embeds the concave part and the through hole of the insulating film 3 by one application and sintering treatment.

Furthermore, in the present embodiment, the average particle diameter of the metal filler included in the conductive paste means the individual particle diameter measured using particle analysis software (for example, particle analysis ver. 3.5 (manufactured by Nittetsu Sumikin Technology Co., Ltd.), image analysis software A image kun (Manufactured by Asahi Kasei Engineering Co., Ltd., etc.) and the like). Here, the particle diameter L2 of the metal filler shows the average of the short diameter d2 and the log diameter D2 of the projected image of the metal filler (formula 4).

$$L2=(d2+D2)/2 \quad \text{(formula 4)}$$

The average particle diameter of the metal filler can be obtained by calculating the average value of the particle diameter L2 per 10 metal fillers.

The sintering temperature and sintering time of the metal layer are not particularly limited as long as the metal filler included in the conductive paste can be sintered and the solvent and the like included in the conductive paste can be volatilized, for example, it is about 150° C. to 250° C. for about 0.5 hours to 2 hours.

Figure 14D:
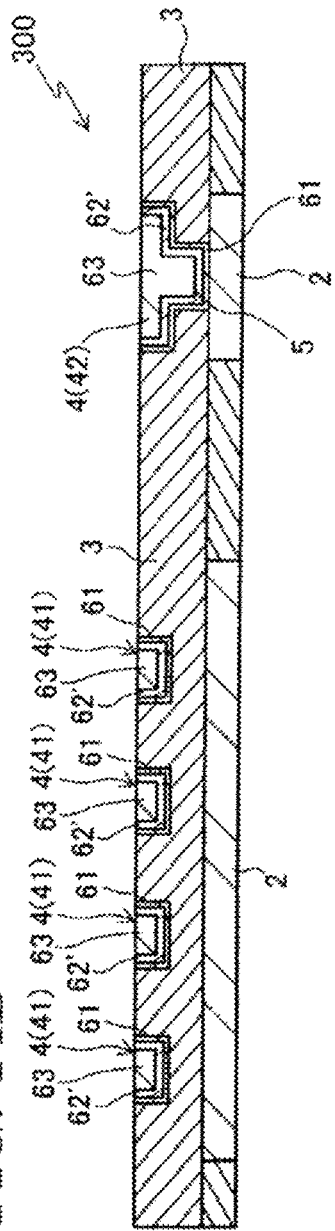

Finally, by polishing the metal layer 61, the sputtered metal layer or the non-electrolytic plated metal layer 62' and the sintered metal layer 63 to such an extent that the insulating film 3 can be exposed, the second wiring layer 4, and the via conductor 5 for electrically connecting the first wiring layer 2 and the second wiring layer 4 are formed, and the wiring substrate 300 is manufactured (refer to FIG. 14D).

According to the method of manufacturing a wiring substrate according to the present embodiment described above, since a sputtered metal layer or an non-electrolytic plated metal layer 62' is formed by sputtering or non-electrolytic plating, and a sintered metal layer 63 is formed using a conductive paste including a metal filler having a predetermined average particle diameter at a high concentration on the inside thereof, it is possible to manufacture the wiring substrate 300 having excellent electrical connection reliability and high-frequency characteristics with high yield.

Fourth Embodiment

The structure of the wiring substrate 400 and the manufacturing method of the wiring substrate 400 according to the fourth embodiment of the present disclosure is explained wile referring to FIG. 15A and FIG. 15B or FIG. 16A to FIG. 16D.

[Structure of Wiring Substrate]

Figure 15A:
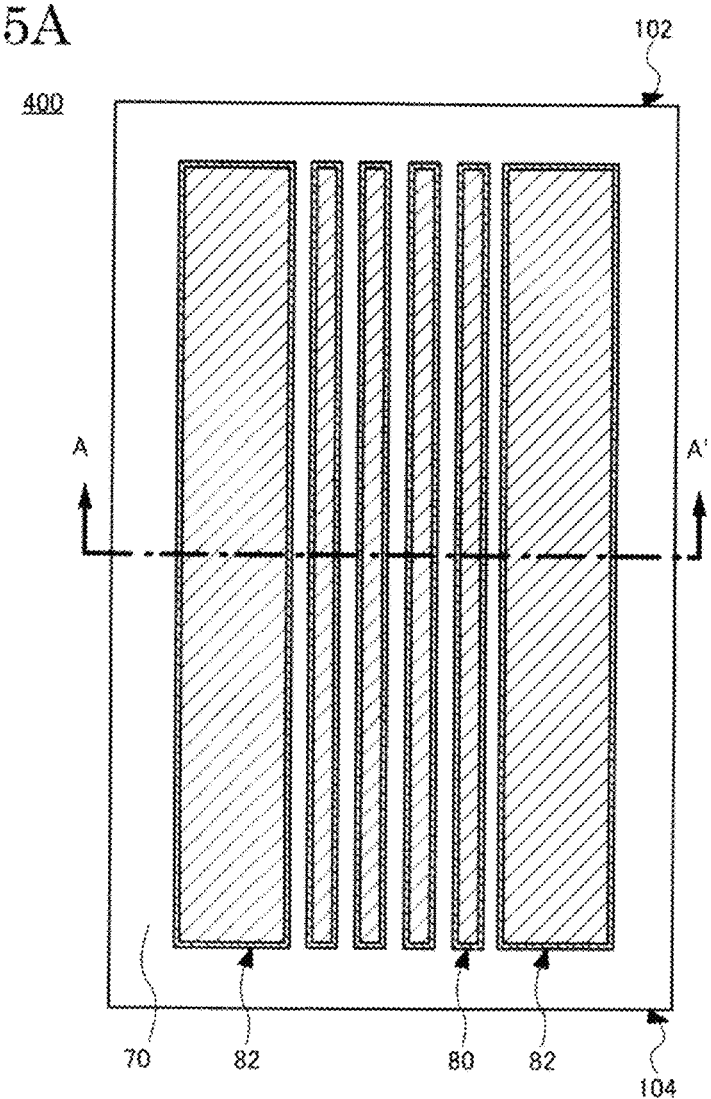
FIG. 15A is an upper surface view showing an example of a wiring substrate related to one embodiment of the present disclosure.
Figure 15B:
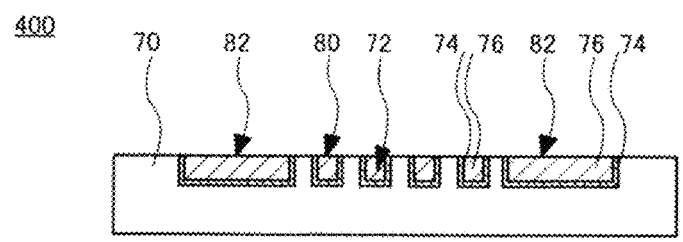
FIG. 15B is a cross-sectional view showing an example of a wiring substrate related to one embodiment of the present disclosure.

FIG. 15A is an upper surface view and FIG. 15B is a cross-sectional view showing an example of a wiring substrate according to one embodiment of the present disclosure. As is shown in FIG. 15A and FIG. 15B, the wiring substrate 400 has a first insulating layer 70, a transmission path (first wiring) 80 and a ground conductor (second wiring, third wiring) 82. The first insulating layer 70 is arranged with a plurality of trenches 72. The transmission path 80 or the ground conductor 82 is arranged in each of the plurality of trenches 72. In the present embodiment, the transmission path 80 is arranged sandwiched between two ground conductors 82. That is, the ground conductor 82 is arranged on both sides of the transmission path 80. Although four transmission paths 80 are arranged, the present invention is not limited thereto. One or more transmission path may be arranged.

As is shown in FIG. 15A, although the planar shape of the transmission path 80 and the ground conductor 82 have a line and space shape in which a plurality of lines each independently extend from a first side 102 of a first insulating layer 70 toward a second side 104 opposite to the first side 102 is exemplified, the shape is not limited to this. For example, the planar shape of the transmission path 80 and the ground conductor 82 may be such that a plurality of lines extends in different directions and some lines intersect or some lines are connected. In addition, the planar shape of the ground conductor 82 is not limited to a line shape, and may be a circular shape or a polygonal shape. In addition, the planar shape of the ground conductor 82 may be a combination of a line shape, a circular shape and a polygonal shape or the like. In addition, although the first insulating layer 70 is rectangular in FIG. 15A, it is not limited to this shape.

The material of the first insulating layer 70 may be a material having electrical insulating properties. For example, an epoxy resin material, a phenol resin material, a polyimide resin material, a polysulfone resin material, a polyester resin material or a polycarbonate resin material or the like can be used as the material of the first insulating layer 70. Furthermore, although an example in which the first insulating layer 70 is formed by a single layer is illustrated, the present invention is not limited thereto, and a structure in which pluralities of base materials or layers are stacked may be used.

Although the thickness of the first insulating layer 70 is not particularly limited, for example, a base material having a thickness of 3 μm or more and 30 μm or less can be used. When the thickness of the first insulating layer 70 is thinner than the lower limit described above, the deflection of the base material is increased, and therefore handling in the manufacturing process becomes difficult. On the other hand, when the thickness of the first insulating layer 70 is thicker than the upper limit described above, the weight of the base material is increased and the burden on the handling device is increased. In addition, in the case where the wiring substrate 400 is used as a multilayer wiring substrate, the thicker the first insulating layer 70 is, the deeper the via for forming a via conductor for electrically connecting each layer becomes.

As is shown in FIG. 15A and FIG. 15B, the transmission path 80 and the ground conductor 82 each include a first conductor 74 and a second conductor 76. The first conductor 74 is arranged on the inner surface of the trench 72. The second conductor 76 is arranged in the trench 72 and is in contact with the first conductor 74.

The material of the first conductor 74 and the material of the second conductor 76 are only required to have conductivity and satisfy the conditions explained herein. The second conductor 76 has a lower conductivity than the conductivity of the first conductor 74. The conductivity of the first conductor 74 may be $5 \times 10^7$ S/m or more. The conductivity of the second conductor 76 can be in the range of $1 \times 10^7$ S/m to $2 \times 10^7$ S/m.

Although the material of the first conductor 74 is copper in the present embodiment, the material is not limited thereto. Gold, silver, copper, platinum, nickel, rhodium, ruthenium or iridium or the like can be used as the material of the first conductor 74. Although the material of the second conductor 76 is a copper nanoparticle paste sintered body, it is not limited thereto. It is sufficient as long as it is a paste including metal nanoparticles or the like having a diameter of 200 nm or less and subjected to low temperature sintering. For example, gold, silver or copper or the like can be used as the metal. Metallic nanoparticles have low melting points. Therefore, by sintering the paste containing the metal nanoparticles, the contained metal melts after coagulation and conductivity improves. The copper nanoparticle paste sintered body is aggregated in a state in which the particle size of the contained metal is increased, and thereby the second conductor 76 which includes voids is in a porous state.

In the present embodiment, the thickness of the first conductor 74 is 0.4 μm. However, the thickness of the first conductor 74 is not limited to this, and the thickness of the first conductor 74 can be appropriately selected depending on its application and it may be at least ⅛ of the width of the transmission path 80.

In the present embodiment, the width of the transmission path 80 is 3 μm. However, the present invention is not limited thereto, and the width of the transmission path 80 can be appropriately selected depending on its application and can be selected within the range of, for example, 0.5 μm or more and 10 μm or less.

In the present embodiment, the height of the transmission path 80 is 2 μm. However, the present invention is not limited to this and the height of the transmission path 80 can be appropriately selected depending on its application, and can be selected within a range of, for example, 0.5 μm or more and 10 μm or less.

The aspect ratio of the trench 72 in which the transmission path 80 is arranged may be selected to be 0.1 or more and 5 or less. Here, the aspect ratio of the trench 72 is defined as the depth with respect to the opening width. In the case where the planar shape of the trench 72 is different from the shape shown in FIG. 15A, the aspect ratio of the trench 72 may be defined as the depth with respect to the width of the narrowest part of the opening. If the aspect ratio of the trench 72 in which the transmission path 80 is arranged is smaller than the lower limit described above, it becomes difficult to form a fine pattern of the transmission path 80 in the wiring substrate 400. When the aspect ratio of the trench 72 in which the transmission path 80 is arranged is larger than the upper limit described above, it becomes difficult to fill the trench 72 with the first conductor 74 and the second conductor 76.

As described above, in the wiring substrate 400 according to the present embodiment, the first conductor 74 having a higher conductivity is arranged so as to be in contact with a surface on the inner side of the trench 72 arranged in the first insulating layer 70, and has a transmission path 80 in which a second conductor 76 having a lower conductivity is arranged so as to be in contact with the first conductor 74. In other words, in the wiring substrate 400 according to the present embodiment, the transmission path 80 is arranged so that the second conductor 76 having lower conductivity is surrounded by the first conductor 74 having higher conductivity. By adopting such a structure, the wiring substrate 400 according to the present embodiment can improve the transmission characteristics in the high frequency band of the transmission path 80 in which the second conductor 76 having low conductivity is arranged, and higher speed signal transmission becomes possible.

[Manufacturing Method of Wiring Substrate 400]

A method of manufacturing a wiring substrate according to an embodiment of the present disclosure is explained using FIG. 16A to FIG. 16D. In FIG. 16A to FIG. 16D, the same elements as those shown in FIG. 15A and FIG. 15B are attached with the same reference numerals.

Figure 16A:
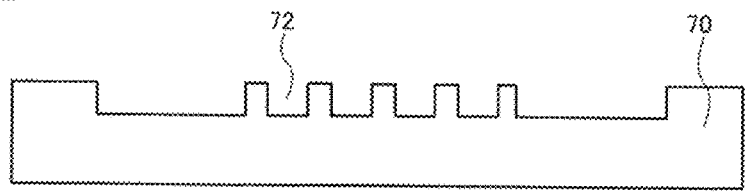
FIG. 16A to FIG. 16D is a cross-sectional diagram showing a manufacturing method of a wiring substrate related to one embodiment of the present disclosure.

FIG. 16A is a diagram showing a process of forming a trench 72 in the first insulating layer 70 in the method for manufacturing a wiring substrate according to one embodiment of the present disclosure. A resist pattern is formed in the first insulating layer 70 by photolithography so as to expose a region where the trench 72 is formed. Etching of the first insulating layer 70 exposed from the resist pattern is performed to form the trench 72. By removing the resist pattern, a substrate having the cross-sectional structure shown in FIG. 16A can be obtained. However, the present invention is not limited to this structure, and a method such as an imprint method can be used as a method of forming the trench 72 in the first insulating layer 70.

Figure 16B:
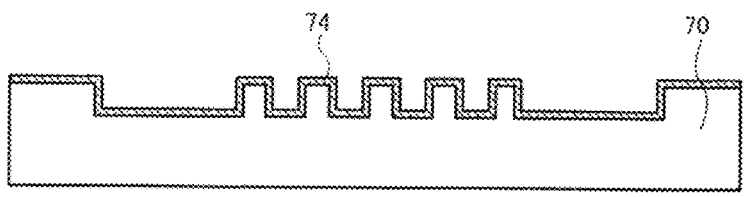

FIG. 16B is a diagram showing a process of forming the first conductor 74 on the first insulating layer 70 in the method of manufacturing the wiring substrate according to the embodiment of the present disclosure. As is shown in FIG. 16B, a first conductor 74 is formed on substantially the entire surface of the first insulating layer 70. At this time, the thickness of the first conductor 74 is controlled so as to be a predetermined film thickness. In the present embodiment, the first conductor 74 is formed by sputtering using copper. A plasma CVD method can also be used as a method for forming the first conductor 74. Although the first conductor 74 is formed on substantially the entire surface of the first insulating layer 70 in the present embodiment, it may also be formed only in the region of the trench 72 in which the transmission path 80 is arranged.

Figure 16C:
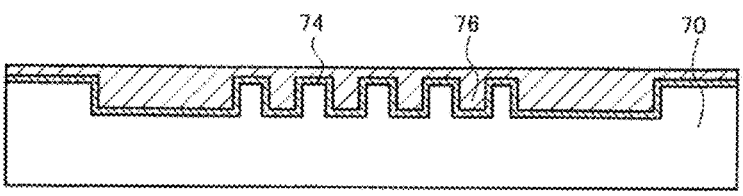

FIG. 16C is a diagram showing a process of forming the second conductor 76 in the method of manufacturing the wiring substrate according to the embodiment of the present disclosure. As is shown in FIG. 16C, a second conductor 76 is formed on substantially the entire surface of the first conductor 74. In the present embodiment, the second conductor 76 is formed using a paste including copper nanoparticles having a diameter of 200 nm or less. By printing the copper nanoparticle paste using a printing method, the trench 72 is filled with the copper nanoparticle paste. Following this, for example, the second conductor 76 is formed by sintering at 180° C. for 60 minutes.

Figure 16D:
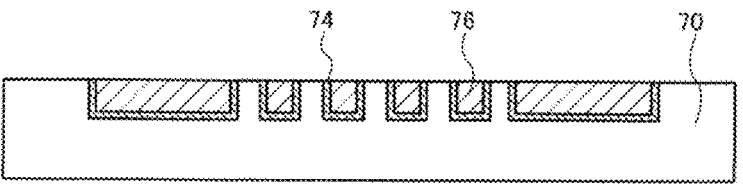

FIG. 16D is a diagram showing a process of polishing the surface of the first insulating layer 70 in the method of manufacturing the wiring substrate according to the embodiment of the present disclosure. As is shown in FIG. 16D, substantially the entire surface of the first insulating layer 70 is polished. In the present embodiment, the surface of the first insulating layer 70 was polished using chemical mechanical polishing. A mechanical polishing method can also be used as a method of polishing the surface of the first insulating layer 70. By polishing the surface of the first insulating layer 70, the first conductor 74 and the second conductor 76 other than the inside of the trench 72 are removed. In this way, the first conductor 74 and the second conductor 76 in the trench 72 are formed as the transmission path 80 and the ground conductor 82.

As is described above, according to the method of manufacturing the wiring substrate 400 according to the present embodiment, by a simple method of controlling the first conductor 74 to have a predetermined film thickness, it is possible to form the wiring substrate 400 with improved transmission characteristics in the high frequency band of the transmission path 80 in which the second conductor 76 having a low conductivity is arranged. The second conductor 76 can be formed by printing the copper nanoparticle paste by a printing method which enables high-density wiring at a low cost.

Fifth Embodiment

In the fourth embodiment, the thickness of the first conductor 74 was uniform on the surface on the inner side of the trench 72. In the fifth embodiment, the thickness of the first conductor 74 is larger in the side wall part of the trench 72 closer to the ground conductor 82 than in the bottom part.

The structure of the wiring substrate 500 according to the fifth embodiment of the present disclosure and the manufacturing method of the wiring substrate 500 is explained using FIG. 17A and FIG. 17B or FIG. 18A to FIG. 18F. Here, a detailed explanation of the same parts as those of the fourth embodiment is omitted.

[Structure of Wiring Substrate]

Figure 17A:
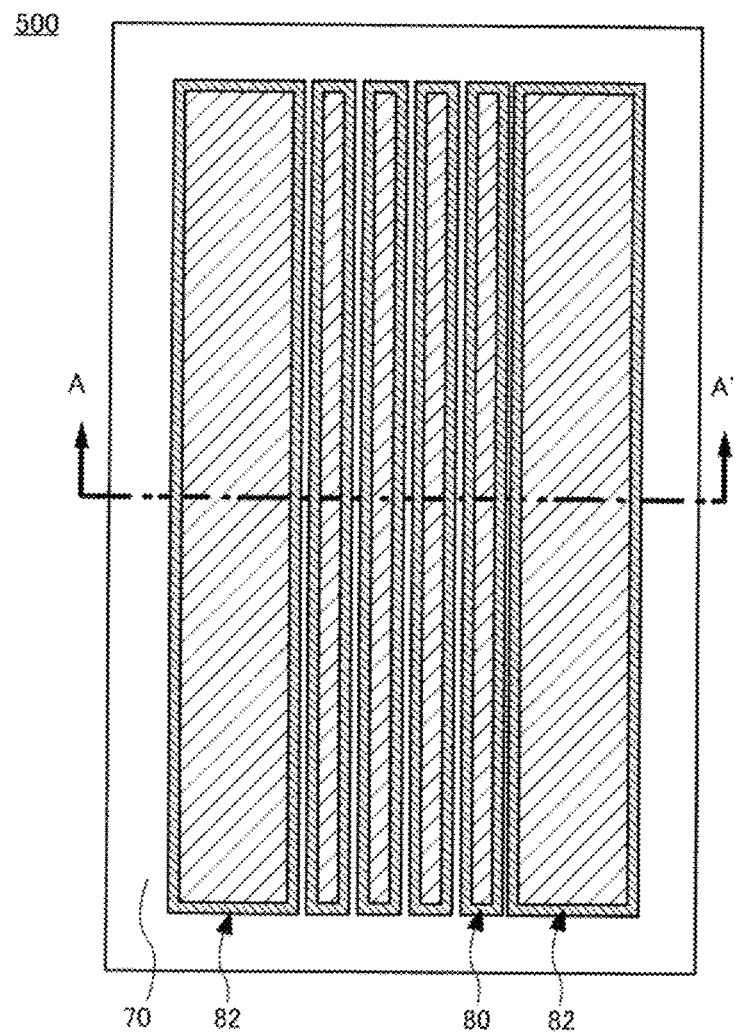
FIG. 17A is an upper surface view showing an example of a wiring substrate related to one embodiment of the present disclosure.
Figure 17B:
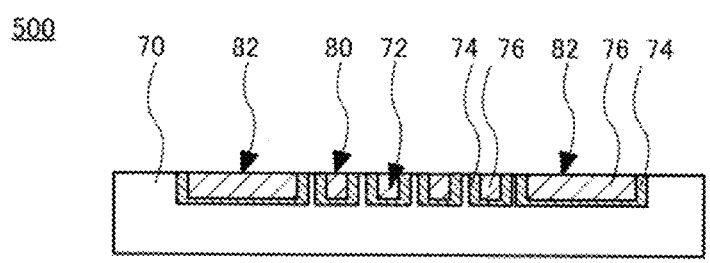
FIG. 17B is a cross-sectional view showing an example of a wiring substrate related to one embodiment of the present disclosure.

FIG. 17A is an upper surface view and FIG. 17B is a cross-sectional view showing an example of a wiring substrate according to one embodiment of the present disclosure. As is shown in FIG. 17A and FIG. 17B, the wiring substrate 500 has a first insulating layer 70, a transmission path (first wiring) 80 and a ground conductor (second wiring and third wiring) 82. The first insulating layer 70 is arranged with a plurality of trenches 72. The transmission path 80 or the ground conductor 82 is arranged in each of the plurality of trenches 72. In the present embodiment, the transmission path 80 is arranged sandwiched between two ground conductors 82. That is, the ground conductor 82 is arranged on both sides of the transmission path 80. Although four transmission paths 80 are arranged, the present invention is not limited to four and one or more may be arranged.

As is shown in FIG. 17A and FIG. 17B, the transmission path 80 and the ground conductor 82 each include a first conductor 74 and a second conductor 76. The first conductor 74 is arranged on surface on the inner side of the trench 72. The second conductor 76 is arranged in the trench 72 and is in contact with the first conductor 74.

The material of the first conductor 74 and the material of the second conductor 76 are only required to have conductivity and satisfy the conditions described herein. The second conductor 76 has conductivity lower than the conductivity of the first conductor 74. The conductivity of the first conductor 74 may be $5 \times 10^7$ S/m or more. The conductivity of the second conductor 76 can be in the range of $1 \times 10^7$ S/m to $2 \times 10^7$ S/m.

Although the material of the first conductor 74 is copper, in the present embodiment, the material is not limited thereto. Gold, silver, copper, platinum, nickel, rhodium, ruthenium or iridium or the like can be used as the material of the first conductor 74. Although the material of the second conductor 76 is a copper nanoparticle paste sintered body, it is not limited thereto. Any material is sufficient as long as it is a paste including metal nanoparticles or the like having a diameter of 200 nm or less and is subjected to low temperature sintering. For example, gold, silver or copper or the like can be used as the material of the first conductor 74. Metallic nanoparticles have low melting points. Therefore, by sintering the paste containing the metal nanoparticles, the contained metal melts after coagulation and conductivity improves. The copper nanoparticle paste sintered body is aggregated in a state in which the particle size of the contained metal is increased and the second electric conductor 76 which includes voids is in a porous state.

In the present embodiment, the width of the transmission path 80 is 3 μm. However, the present invention is not limited thereto, and the width of the transmission path 80 can be appropriately selected depending on its application, and can be selected within the range of, for example, 0.5 μm or more and 10 μm or less.

In the present embodiment, the thickness of the first conductor 74 is 0.4 μm or more. However, the thickness of the first conductor 74 is not limited to this, and the thickness of the first conductor 74 can be appropriately selected depending on its application and may be at least ⅛ of the width of the transmission path 80. Furthermore, the thickness of the first conductor 74 is larger in the side wall part of the trench 72 closer to the ground conductor 82 than in the bottom part. That is, in the transmission path 80, the thickness of the first conductor 74 is thicker at the side surface part close to the ground conductor 82 than at the bottom part.

As is described above, in the wiring substrate 500 according to the present embodiment, the first conductor 74 having a higher conductivity is arranged so as to be in contact with the surface on the inner side of the trench 72 arranged in the first insulating layer 70 and has a transmission path 80 in which a second conductor 76 having a lower conductivity is arranged so as to be in contact with the first conductor 74. Furthermore, the thickness of the first conductor 74 is larger in the side wall part of the trench 72 closer to the ground conductor 82 than in the bottom part. In other words, the wiring substrate 500 according to the present embodiment is arranged so that the second conductor 76 having lower conductivity is surrounded by the first conductor 74 having higher conductivity, and furthermore, the transmission path 80 is arranged in which the side surface part close to the ground conductor 82 of the first conductor 74 is thicker than the bottom part. By adopting such a structure, the wiring substrate 500 according to the present embodiment can further improve the transmission characteristics in the high frequency band of the transmission path 80 in which the second conductor 76 having low conductivity is arranged and higher speed signal transmission becomes possible.

[Manufacturing Method of Wiring Substrate 500]

A method of manufacturing a wiring substrate according to an embodiment of the present disclosure is explained using FIG. 18A to FIG. 18F. In FIG. 18A to FIG. 18F, the same elements as those shown in FIG. 17A and FIG. 17B are attached with the same reference numerals.

Figure 18A:
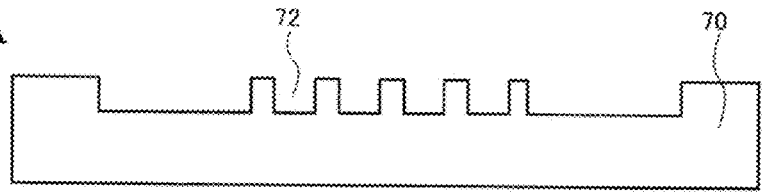
FIG. 18A to FIG. 18F is a cross-sectional diagram showing a manufacturing method of a wiring substrate related to one embodiment of the present disclosure.

FIG. 18A is a diagram showing a process of forming the trench 72 in the first insulating layer 70 in the method of manufacturing the wiring substrate according to the embodiment of the present disclosure. A resist pattern is formed in the first insulating layer 70 by photolithography to expose a region where the trench 72 is formed. Etching of the first insulating layer 70 exposed from the resist pattern is performed to form the trench 72. By removing the resist pattern, a substrate having he cross-sectional structure shown in FIG. 18A can be obtained. A method such as an imprint method or the like can be used as a method of forming the trench 72 in the first insulating layer 70.

Figure 18B:
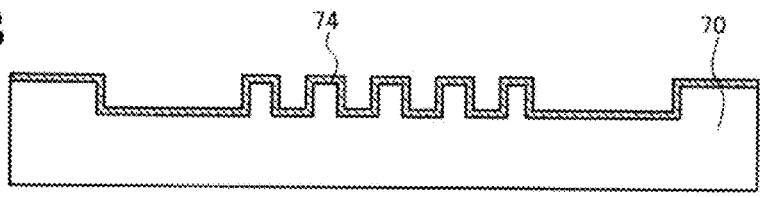

FIG. 18B is a diagram showing a process of forming the first conductor 74 on the first insulating layer 70 in the method of manufacturing the wiring substrate according to the embodiment of the present disclosure. As is shown in FIG. 18B, a first conductor 74 is formed on substantially the entire surface of the first insulating layer 70. At this time, the thickness of the first conductor 74 is controlled to be a predetermined film thickness according to the process of FIG. 18D to be described herein. In the present embodiment, the first conductor 74 is formed by sputtering using copper. A plasma CVD method can also be used as a method for forming the first conductor 74. In addition, although the first conductor 74 is formed on substantially the entire surface of the first insulating layer 70 in the present embodiment, it may be formed only in the region of the trench 72 in which the transmission path 80 is arranged.

Figure 18C:
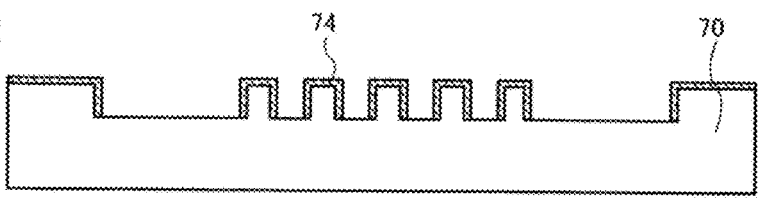

FIG. 18C is a diagram showing a process of etching the first conductor 74 in the method of manufacturing the wiring substrate according to the embodiment of the present disclosure. A resist pattern is formed on the first conductor 74 to expose the bottom of the trench 72 by photolithography. The first conductor 74 exposed from the resist pattern is etched to selectively remove the first conductor 74 at the bottom of the trench 72. By removing the resist pattern, a substrate having the cross-sectional structure shown in FIG. 18C can be obtained.

Figure 18D:
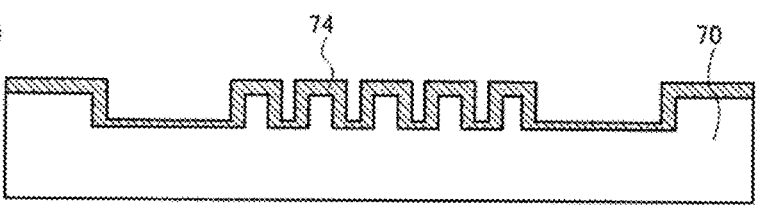

FIG. 18D is a diagram showing a process of forming the first conductor 74 on the first insulating layer 70 in the method of manufacturing the wiring substrate according to the embodiment of the present disclosure. As is shown in FIG. 18D, a first conductor 74 is formed on substantially the entire surface of the first insulating layer 70. At this time, the thickness of the first conductor 74 is controlled to be a predetermined film thickness according to the step of FIG. 18B described above. By the processes in FIG. 18B to FIG. 18D, the thickness of the first conductor 74 is formed so that the side wall part of the trench 72 close to the ground conductor 82 is thicker than the bottom part. In the present embodiment, the first conductor 74 is formed by sputtering using copper. Although the first conductor 74 is formed on substantially the entire surface of the first insulating layer 70 in the present embodiment, it may be formed only in the region of the trench 72 in which the transmission path 80 is arranged.

Figure 18E:
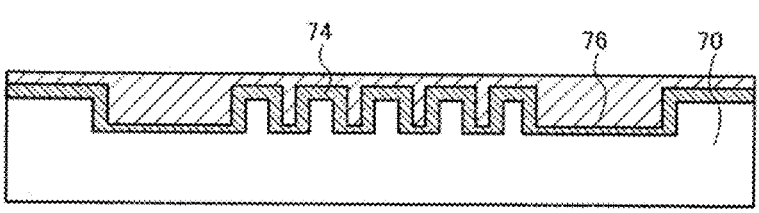

FIG. 18E is a diagram showing a process of forming a second conductor 76 in the method for manufacturing a wiring substrate according to one embodiment of the present disclosure. As is shown in FIG. 18E, the second conductor 76 is formed on substantially the entire surface of the first conductor 74. In the present embodiment, the second conductor 76 is formed using a paste including copper nanoparticles having a diameter of 200 nm or less. By printing the copper nanoparticle paste by a printing method, the trench 72 is filled with the copper nanoparticle paste. Following this, for example, the second conductor 76 is formed by sintering at 180° C. for 60 minutes.

Figure 18F:
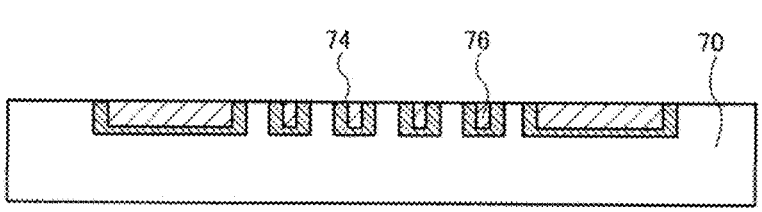

FIG. 18F is a diagram showing a process of polishing the surface of the first insulating layer 70 in the method of manufacturing the wiring substrate according to the embodiment of the present disclosure. As is shown in FIG. 18F, substantially the entire surface of the first insulating layer 70 is polished. In the present embodiment, the surface of the first insulating layer 70 was polished using chemical mechanical polishing. A mechanical polishing method can also be used as a method of polishing the surface of the first insulating layer 70. By polishing the surface of the first insulating layer 70, the first conductor 74 and the second conductor 76 other than the inside of the trench 72 are removed. In this way, the first conductor 74 and the second conductor 76 in the trench 72 are formed as the transmission path 80 and the ground conductor 82.

As is described above, according to the method of manufacturing the wiring substrate 500 according to the present embodiment, by the simple method of controlling the first conductor 74 to have a predetermined film thickness, it is possible to form the wiring substrate 500 with improved transmission characteristics in the high frequency band of the transmission path 80 in which the second conductor 76 having low conductivity is arranged. Furthermore, by controlling the thickness of the first conductor 74 so that the side surface part close to the ground conductor 82 is thicker than the bottom part, it is possible to form the wiring substrate 500 with further improved transmission characteristics in the high frequency band of the transmission path 80. The second conductor 76 can be formed by printing the copper nanoparticle paste by a printing method which enables high density wiring at a low cost.

Sixth Embodiment

In the fourth embodiment, the thickness of the first conductor 74 was uniform on the surface on the side of the trench 72. In the sixth embodiment, the thickness of the first conductor 74 is such that the bottom part of the trench 72 close to the ground conductor 82 is thicker than the sidewall part.

The structure of the wiring substrate 600 according to the sixth embodiment of the present disclosure and the manufacturing method of the wiring substrate 600 are explained using FIG. 19A and FIG. 19B or FIG. 20A to FIG. 18E. Here, a detailed explanation of the same parts as those of the fourth embodiment is omitted.

[Structure of Wiring Substrate]

Figure 19A:
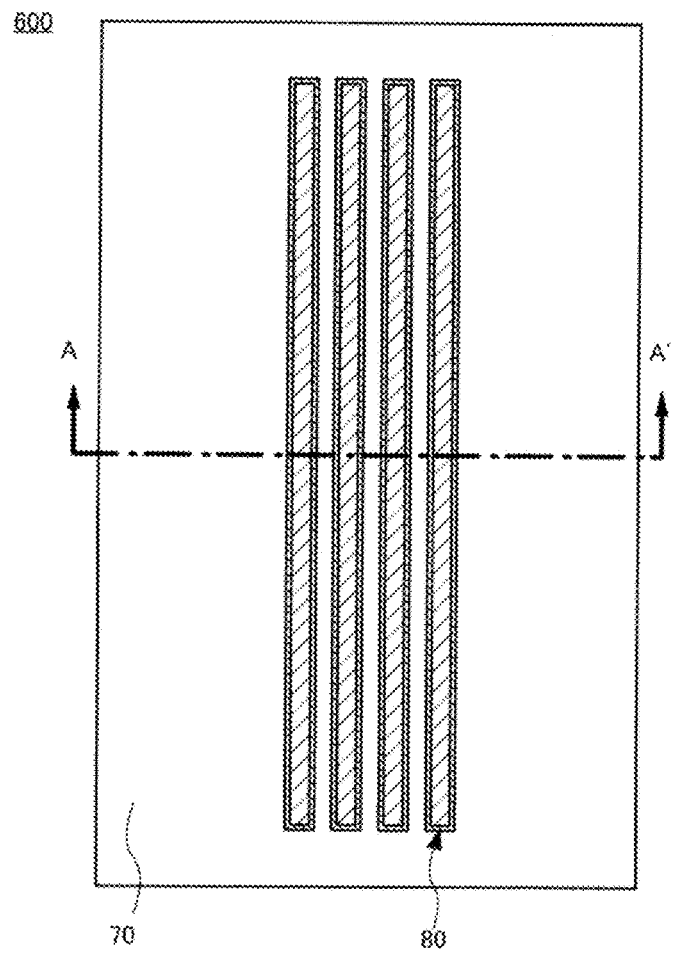
FIG. 19A is an upper surface view shows an example of a wiring substrate related to one embodiment of the present disclosure.
Figure 19B:
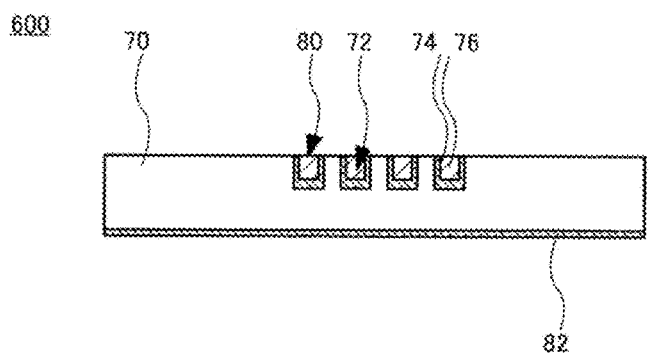
FIG. 19B is a cross-sectional view showing an example of a wiring substrate related to one embodiment of the present disclosure.

FIG. 19A is an upper surface view and FIG. 19B is a cross-sectional view showing an example of a wiring substrate according to one embodiment of the present disclosure. As is shown in FIG. 19A and FIG. 19B, the wiring substrate 600 includes a first insulating layer 70, a transmission path (first wiring) 80 and a grounding conductor (second wiring) 82. The first insulating layer 70 is arranged with a plurality of trenches 72. A transmission path 80 is arranged in each of the plurality of trenches 72. In the present embodiment, the ground conductor 82 is arranged on a surface of the first insulating layer 70 opposite to the surface on which the transmission path 80 is arranged. Although four transmission paths 80 are arranged, the present invention is not limited to four and one or more may be arranged.

As is shown in FIG. 19A and FIG. 19B, each of the transmission paths 80 includes a first conductor 74 and a second conductor 76. The first conductor 74 is arranged on a surface on the inner side of the trench 72. The second conductor 76 is arranged in the trench 72 and is in contact with the first conductor 74. For example, the ground conductor 82 may be formed of only the first conductor 74 or the second conductor 76.

The material of the first conductor 74 and the material of the second conductor 76 are only required to have conductivity and satisfy the conditions described herein. The second conductor 76 has conductivity lower than the conductivity of the first conductor 74. The conductivity of the first conductor 74 may be $5 \times 10^7$ S/m or more. The conductivity of the second conductor 76 can be in the range of $1 \times 10^7$ S/m to $2 \times 10^7$ S/m.

Although the material of the first conductor 74 is copper in the present embodiment, the material is not limited to copper. Gold, silver, copper, platinum, nickel, rhodium, ruthenium or iridium or the like can be used as the material of the first conductor 74. Although the material of the second conductor 76 is a copper nanoparticle paste sintered body, it is not limited to this material. Any material is sufficient as long as it is a paste containing metal nanoparticles or the like having a diameter of 200 nm or less and subjected to low temperature sintering. For example, gold, silver or copper or the like can be used as the metal. Metallic nanoparticles have low melting points. Therefore, by sintering the paste including the metal nanoparticles, the contained metal melts after coagulation and conductivity improves. The copper nanoparticle paste sintered body is aggregated in a state in which the particle size of the contained metal is increased, and the second electric conductor 76 which includes voids is in a porous state.

In the present embodiment, the width of the transmission path 80 is 3 µm. However, the present invention is not limited to this and the width of the transmission path 80 can be appropriately selected depending on its application, and can be selected within the range of, for example, 0.5 µm or more and 10 µm or less.

In the present embodiment, the thickness of the first conductor 74 is 0.4 µm or more. However, the thickness of the first conductor 74 is not limited to this, and the thickness of the first conductor 74 can be appropriately selected depending on its application, and it may be at least ⅛ of the width of the transmission path 80. Furthermore, the thickness of the first conductor 74 is such that the bottom part of the trench 72 close to the ground conductor 82 is thicker than the sidewall part. That is, in the transmission path 80, the thickness of the first conductor 74 is thicker at the bottom part close to the ground conductor 82 than at the side surface part.

As is described above, in the wiring substrate 600 according to the present embodiment, the first conductor 74 having higher conductivity is arranged so as to be in contact with the surface on the inner side of the trench 72 arranged in the first insulating layer 70 and has a transmission path 80 in which a second conductor 76 having a lower conductivity is arranged so as to be in contact with the first conductor 74. Furthermore, the thickness of the first conductor 74 is thicker at the bottom of the trench 72 closer to the ground conductor 82 than at the sidewall. In other words, the wiring substrate 600 according to the present embodiment is arranged so that the second conductor 76 having a lower conductivity is surrounded by the first conductor 74 having a higher conductivity, and the transmission path 80 is arranged having a bottom part close to the ground conductor 82 of the conductor 74 thicker than the side surface part. By adopting such a structure, the wiring substrate 600 according to the present embodiment can further improve the transmission characteristics in the high frequency band of the transmission path 80 in which the second conductor 76 having low conductivity is arranged and higher speed signal transmission becomes possible.

[Manufacturing Method of Wiring Substrate 600]

A method of manufacturing a wiring substrate according to an embodiment of the present disclosure is explained using FIG. 20A to FIG. 20E. In FIG. 20A to FIG. 20E, the same elements as those shown in FIG. 19A and FIG. 19B are attached with the same reference numerals.

Figure 20A:
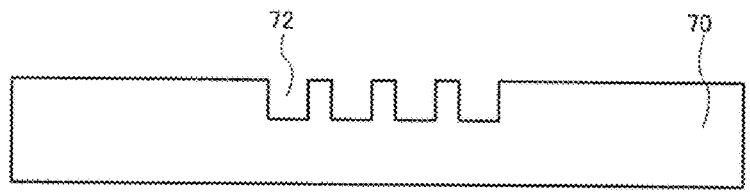
FIG. 20A to FIG. 20E is a cross-sectional diagram showing a manufacturing method of a wiring substrate related to one embodiment of the present disclosure.

FIG. 20A is a diagram showing a process of forming a trench 72 in the first insulating layer 70 in the method for manufacturing a wiring substrate according to one embodiment of the present disclosure. A resist pattern is formed in the first insulating layer 70 by photolithography to expose a region where the trench 72 is formed. Etching of the first insulating layer 70 exposed from the resist pattern is performed to form the trench 72. By removing the resist pattern, a substrate having the cross-sectional structure shown in FIG. 20A can be obtained. A method such as an imprint method or the like can be used as a method of forming the trench 72 in the first insulating layer 70.

Figure 20B:
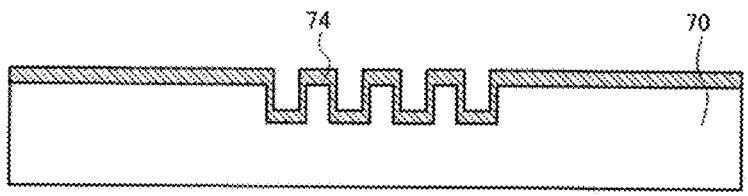

FIG. 20B is a diagram showing a process of forming the first conductor 74 on the first insulating layer 70 in the method of manufacturing the wiring substrate according to the embodiment of the present disclosure. As is shown in FIG. 20B, a first conductor 74 is formed on substantially the entire surface of the first insulating layer 70. At this time, the thickness of the first conductor 74 is controlled to be a predetermined film thickness. In the present embodiment, the first conductor 74 is formed by long-throw sputtering using copper. In this way, the thickness of the first conductor 74 is formed so that the bottom of the trench 72, which is close to the ground conductor 82, is thicker than the side wall part. In addition, in the present embodiment, although the first conductor 74 is formed on substantially the entire surface of the first insulating layer 70, it may be formed only in the region of the trench 72 in which the transmission path 80 is arranged.

Figure 20C:
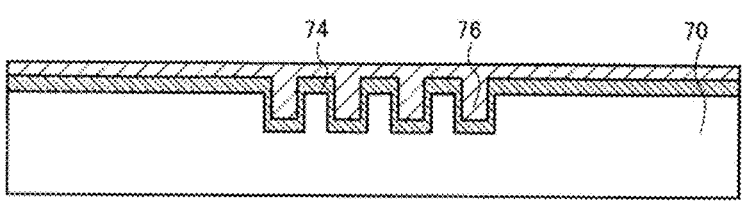

FIG. 20C is a diagram showing a process of forming the second conductor 76 in the method of manufacturing the wiring substrate according to one embodiment of the present disclosure. As is shown in FIG. 20C, a second conductor 76 is formed on substantially the entire surface of the first conductor 74. In the present embodiment, the second conductor 76 is formed using a paste including copper nanoparticles having a diameter of 200 nm or less. By printing the copper nanoparticle paste by a printing method, the trench 72 is filled with the copper nanoparticle paste. Following this, for example, the second conductor 76 is formed by sintering at 180° C. for 60 minutes.

Figure 20D:
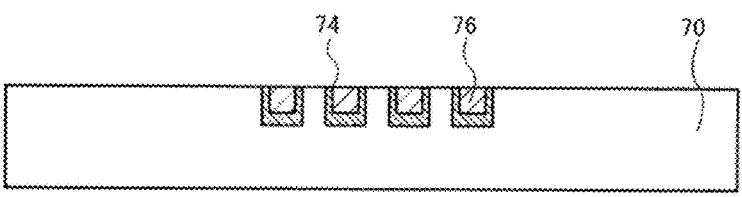

FIG. 20D is a diagram showing a process of polishing the surface of the first insulating layer 70 in the method of manufacturing the wiring substrate according to the embodiment of the present disclosure. As is shown in FIG. 20D, substantially the entire surface of the first insulating layer 70 is polished. In the present embodiment, the surface of the first insulating layer 70 was polished using chemical mechanical polishing. A mechanical polishing method can also be used as a method of polishing the surface of the first insulating layer 70. By polishing the surface of the first insulating layer 70, the first conductor 74 and the second conductor 76 other than the inside of the trench 72 are removed. In this way, the first conductor 74 and the second conductor 76 in the trench 72 are formed as the transmission path 80.

Figure 20E:
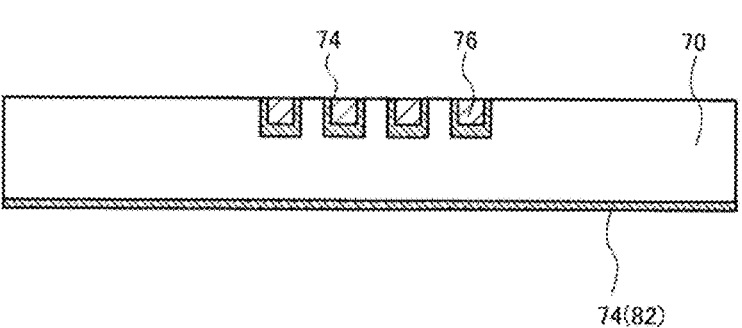

FIG. 20E is a diagram showing a process of forming a first conductor 74 on a surface of the first insulation layer 70 opposite to the surface on which the transmission path 80 is arranged of the first insulating layer 70 in a method of manufacturing a wiring substrate according to one embodiment of the present disclosure. As shown in FIG. 20E, the first conductor 74 is formed on substantially the entire surface of the first insulating layer 70 opposite to the surface on which the transmission path 80 is arranged. In the present embodiment, the first conductor 74 is formed by sputtering using copper. A plasma CVD method can also be used as a method for forming the first conductor 74. In addition, although the first conductor 74 is formed on substantially the entire surface of the first insulating layer 70 in the present embodiment, it may also be formed only in a predetermined region.

As is described above, according to the method of manufacturing the wiring substrate 600 according to the present embodiment, by the simple method of controlling the first conductor 74 to have a predetermined film thickness, it is possible to form the wiring substrate 600 having improved transmission characteristics in the high frequency band of the transmission path 80 in which the second conductor having low conductivity is arranged. Furthermore, by controlling the thickness of the first conductor 74 so that the bottom part close to the ground conductor 82 is thicker than the side surface part, the wiring substrate 600 with further improved transmission characteristics in the high frequency band of the transmission path 80 can be formed. The second conductor 76 can be formed by printing the copper nanoparticle paste by a printing method which enables high density wiring at a low cost.

Seventh Embodiment

In the fourth embodiment, the thickness of the first conductor 74 was uniform on the surface of the inner side of the trench 72. In the sixth embodiment, the thickness of the first conductor 74 is such that the bottom part of the trench 72 close to the ground conductor 82 is thicker than the sidewall part. In the seventh embodiment, the second insulating layer 78 and the ground conductor 82 are stacked on the wiring substrate 600 according to the sixth embodiment. The first conductor 74 is arranged to surround the second conductor 76, and the thickness of the first conductor 74 is thicker at the bottom and the upper part of the trench 72 closer to the ground conductor 82 than at the side wall part.

The structure of the wiring substrate 700 according to the seventh embodiment of the present disclosure and the manufacturing method of the wiring substrate 700 is explained using FIG. 21A and FIG. 21B or FIG. 22A to FIG. 22E. Here, a detailed explanation of parts similar to those of the fourth and sixth embodiments is omitted.

[Structure of Wiring Substrate]

Figure 21A:
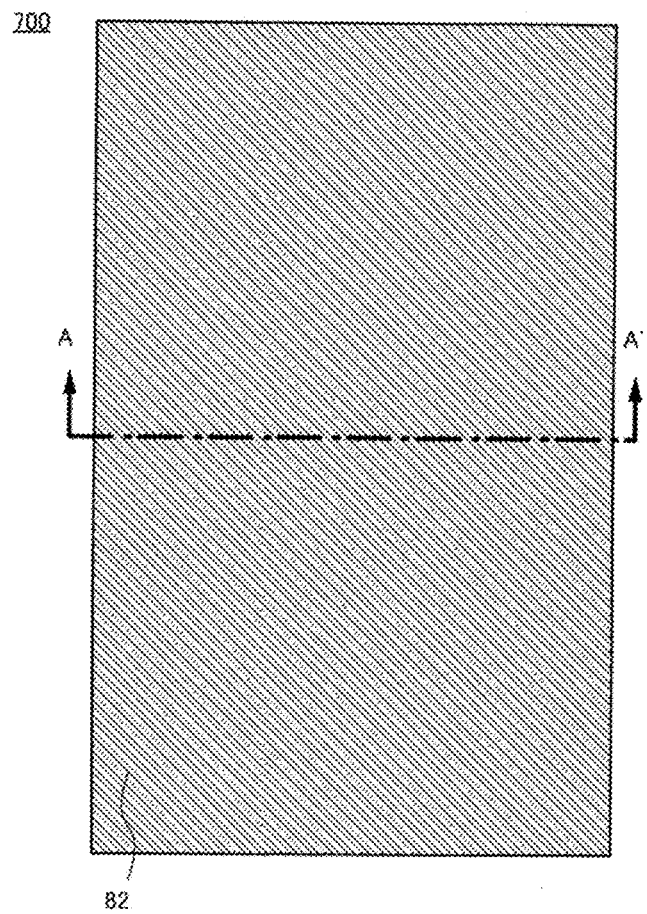
FIG. 21A is an upper surface view shows an example of a wiring substrate related to one embodiment of the present disclosure.
Figure 21B:
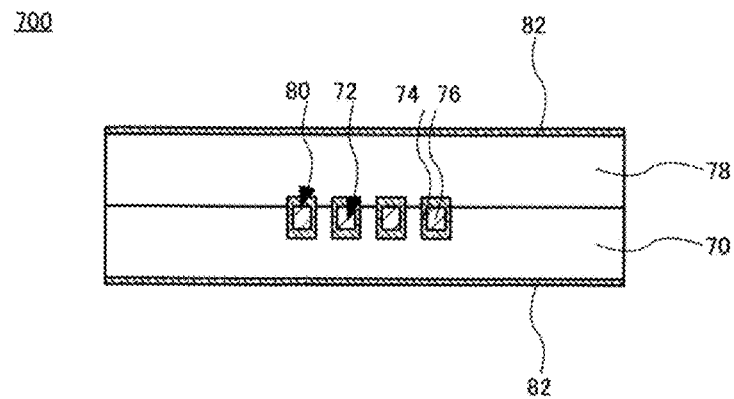
FIG. 21B is a cross-sectional view showing an example of a wiring substrate related to one embodiment of the present disclosure.

FIG. 21A is an upper surface view and FIG. 21B is a cross-sectional view showing an example of a wiring substrate according to one embodiment of the present disclosure. As is shown in FIG. 21A and FIG. 21B, the wiring substrate 700 includes a first insulating layer 70, a transmission path (first wiring) 80, a second insulating layer 78 and a ground conductor (second wiring, third wiring) 82. The first insulating layer 70 is arranged with a plurality of trenches 72. A transmission path 80 is arranged in each of the plurality of trenches 72. The second insulating layer 78 is arranged on the surface on which the transmission path 80 of the first insulating layer 70 is arranged. The second insulating layer 78 has a plurality of trenches 72 so that the transmission path 80 on the first insulating layer 70 is engaged. In the present embodiment, the ground conductor 82 is arranged on the surface of the first insulating layer 70 and the second insulating layer 78 opposite to the surface on which the transmission path 80 is arranged. Although four transmission paths 80 are arranged, the present invention is not limited to four and one or more may be arranged.

The material of the first insulating layer 70 and the second insulating layer 78 may be any material having electrical insulating properties. For example, an epoxy-based resin material, a phenol-based resin material, a polyimide-based resin material, a polysulfone-based resin material, a polyester-based resin material or a polycarbonate based resin material can be used as the material of the first insulating layer 70 and the second insulating layer 78. Furthermore, although an example in which the first insulating layer 70 and the second insulating layer 78 are formed by a single layer is shown, the present invention is not limited to this example and a structure in which a plurality of base materials or layers are stacked may also be used.

As is shown in FIG. 21A and FIG. 21B, each of the transmission paths 80 includes a first conductor 74 and a second conductor 76. The first conductor 74 is arranged on a surface of the inner side of the trench 72. The second conductor 76 is arranged in the trench 72 and is in contact with the first conductor 74. For example, the ground conductor 82 may be formed of only the first conductor 74 or the second conductor 76.

The material of the first conductor 74 and the material of the second conductor 76 are only required to have conductivity and satisfy the conditions described herein. The second conductor 76 has conductivity lower than the conductivity of the first conductor 74. The conductivity of the first conductor 74 may be $5 \times 10^7$ S/m or more. The conductivity of the second conductor 76 can be in the range of $1 \times 10^7$ S/m to $2 \times 10^7$ S/m.

Although the material of the first conductor 74 is copper in the present embodiment, the material is not limited to copper. Gold, silver, copper, platinum, nickel, rhodium, ruthenium or iridium or the like can be used as the material of the first conductor 74. Although the material of the second conductor 76 is a copper nanoparticle paste sintered body, it is not limited thereto. Any material is sufficient as long as it is a paste containing metal nanoparticles or the like having a diameter of 200 nm or less and is subjected to low temperature sintering. For example, gold, silver or copper or the like can be used as the metal. Metallic nanoparticles have low melting points. Therefore, by sintering the paste including the metal nanoparticles, the contained metal melts after coagulation and conductivity improves. The copper nanoparticle paste sintered body is aggregated in a state in which the particle size of the contained metal is increased and the second electric conductor 76 which includes voids is in a porous state.

In the present embodiment, the width of the transmission path 80 is 3 μm. However, the present invention is not limited to this and the width of the transmission path 80 can be appropriately selected depending on its application, and can be selected within the range of, for example, 0.5 μm or more and 10 μm or less.

In the present embodiment, the thickness of the first conductor 74 is 0.4 μm or more. However, the thickness of the first conductor 74 is not limited to this and the thickness of the first conductor 74 can be appropriately selected depending on its application and it may be at least ⅛ of the width of the transmission path 80. Furthermore, the thickness of the first conductor 74 is thicker at the bottom and the upper part of the trench 72 close to the respective ground conductor 82 than at the side wall part. That is, in the transmission path 80, the thickness of the first conductor 74 is thicker at the bottom part and the upper part close to the respective ground conductor 82 than at the side surface part.

As is described above, the wiring substrate 700 according to the present embodiment is formed so that the transmission path 80 is arranged with the first conductor 74 having higher conductivity being in contact with the surface on the inner side of the trench 72 arranged in the first insulating layer 70 and the second insulating layer 78, and the second conductor 76 having a lower conductivity to be in contact with the first conductor 74. Furthermore, the thickness of the first conductor 74 is thicker at the bottom part and the upper part of the trench 72 close to the ground conductor 82 than at the side wall part. In other words, the wiring substrate 700 according to the present embodiment is arranged such that the second conductor 76 having a lower conductivity is surrounded by the first conductor 74 having a higher conductivity, and the transmission path 80 is arranged having a bottom part and an upper part close the ground conductor 82 of the conductor 74 is thicker than the side surface part. By adopting such a structure, the wiring substrate 700 according to the present embodiment can further improve the transmission characteristics in the high frequency band of the transmission path 80 in which the second conductor 76 having low conductivity is arranged and higher speed signal transmission becomes possible.

[Manufacturing Method of Wiring Substrate 700]

A method of manufacturing a wiring substrate according to one embodiment of the present disclosure is explained using FIG. 22A to FIG. 22E. In FIG. 22A to FIG. 22E, the same elements as those shown in FIG. 21A and FIG. 21B are attached with the same reference numerals.

Figure 22A:
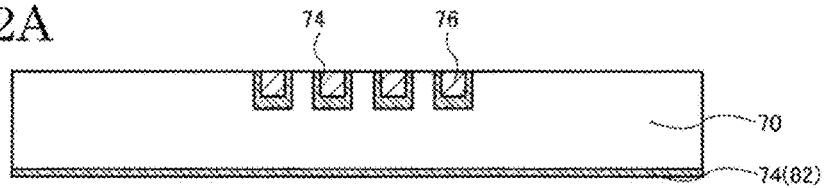
FIG. 22A to FIG. 22E is a cross-sectional diagram showing a manufacturing method of a wiring substrate related to one embodiment of the present disclosure.

FIG. 22A is a diagram showing a process of forming the wiring substrate 600 according to the sixth embodiment in the method of manufacturing the wiring substrate according to one embodiment of the present disclosure. Since it is the same as the manufacturing method of the wiring substrate 600 in the sixth embodiment, a detailed explanation is omitted.

Figure 22B:
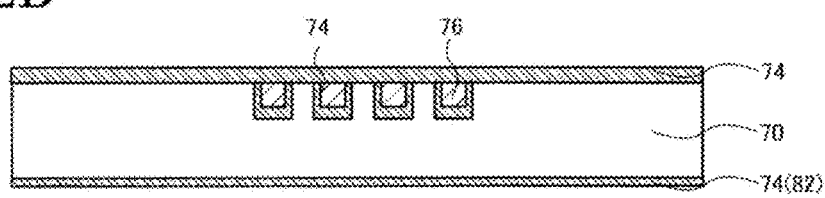

FIG. 22B is a diagram showing a process of forming the first conductor 74 on the first insulating layer 70 in the method of manufacturing the wiring substrate according to one embodiment of the present disclosure. As is shown in FIG. 22B, a first conductor 74 is formed on substantially the entire surface of the first insulating layer 70. At this time, the thickness of the first conductor 74 is controlled to be a predetermined film thickness. In the present embodiment, the first conductor 74 is formed by sputtering using copper. A plasma CVD method can also be used as a method for forming the first conductor 74. Although the first conductor 74 is formed on substantially the entire surface of the first insulating layer 70 in the present embodiment, it may be formed only in a region of the trench 72 in which the transmission path 80 is arranged.

Figure 22C:
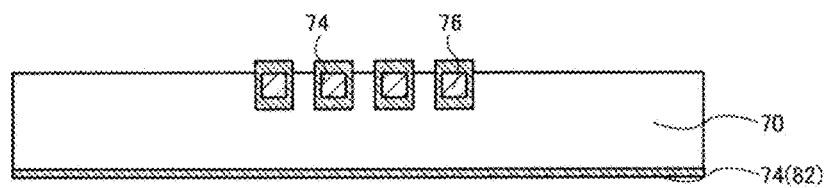

FIG. 22C is a diagram showing a process of etching the first conductor 74 in the method of manufacturing the wiring substrate according to the embodiment of the present disclosure. A resist pattern is formed on the first conductor 74 by photolithography to expose regions other than the region of the trench 72 where the transmission path 80 is arranged. The first conductor 74 exposed from the resist pattern is etched to selectively remove the first conductor 74 other than the region of the trench 72 where the transmission path 80 is arranged. By removing the resist pattern, a substrate having the cross-sectional structure shown in FIG. 22C can be obtained.

Figure 22D:
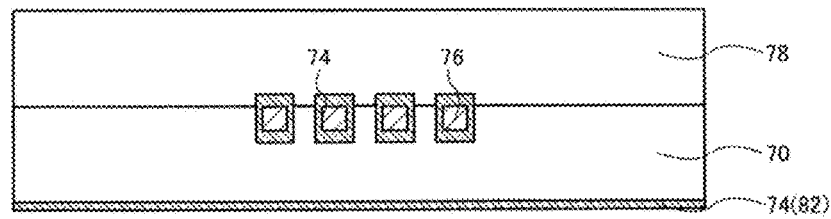

FIG. 22D is a diagram showing a process of stacking the second insulating layer 78 on the first insulating layer 70 in the method for manufacturing the wiring substrate according to one embodiment of the present disclosure. Here, the second insulating layer 78 has a plurality of trenches 72 so that the first conductor 74 is engaged on the first insulating layer 70 formed in FIG. 22B and FIG. 22C. The second insulating layer 78 is stacked on the first insulating layer 70 so that the transmission path 80 is engaged on the first insulating layer 70. In this way, the transmission path 80 is buried in the first insulating layer 70 and the second insulating layer 78.

Figure 22E:
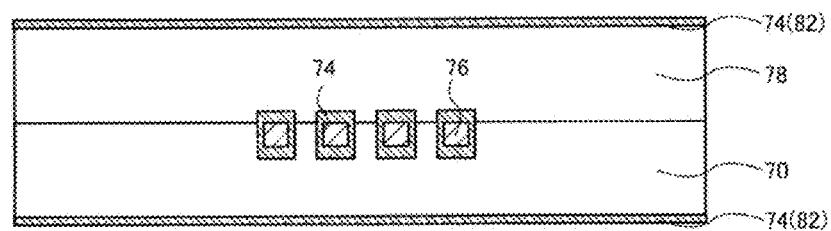

FIG. 22E is a diagram showing a process of forming a first conductor 4 on a surface of the second insulating layer 78 opposite to the surface on which the transmission path 80 is arranged in the manufacturing method of a wiring substrate according to one embodiment of the present disclosure. As is shown in FIG. 22E, the first conductor 74 is formed on substantially the entire surface of the second insulating layer 78 opposite to the surface on which the transmission path 80 is arranged. In the present embodiment, the first conductor 74 is formed by sputtering using copper. Although the first conductor 74 is formed on substantially the entire surface of the first insulating layer 70 in the present embodiment, it may be formed only in a predetermined region.

As is described above, according to the method of manufacturing the wiring substrate 700 according to the present embodiment, by the simple method of controlling the first conductor 74 to have a predetermined film thickness, it is possible to form the wiring substrate 700 with improved transmission characteristics in the high frequency band of the transmission path 80 on which the second conductor 76 is arranged having a low conductivity. Furthermore, by controlling the thickness of the first conductor 74 so that the bottom part and the upper part close to the ground conductor 82 are thicker than the side surface part, it is possible to form the wiring substrate 700 in which the transmission characteristics of the transmission path 80 in the high frequency band are further improved. The second conductor 76 can be formed by printing the copper nanoparticle paste by a printing method which enables high density wiring at a low cost.

MODIFIED EXAMPLE

Figure 23A:
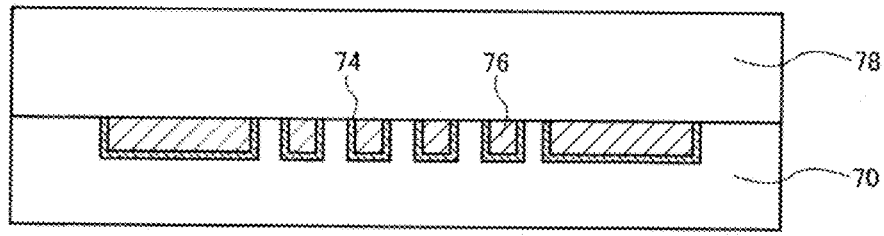
FIG. 23A to FIG. 23C is a cross-sectional diagram showing an example of a wiring substrate related to a modified example of an embodiment of the present disclosure.
Figure 23B:
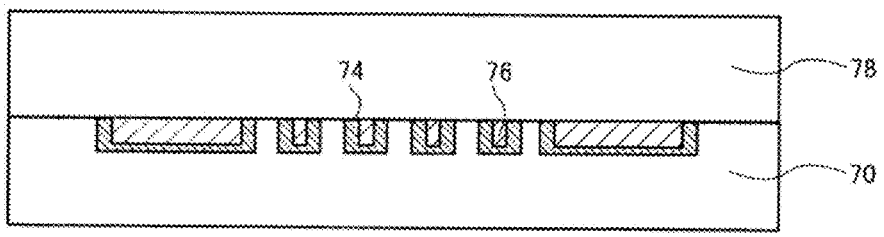
Figure 23C:
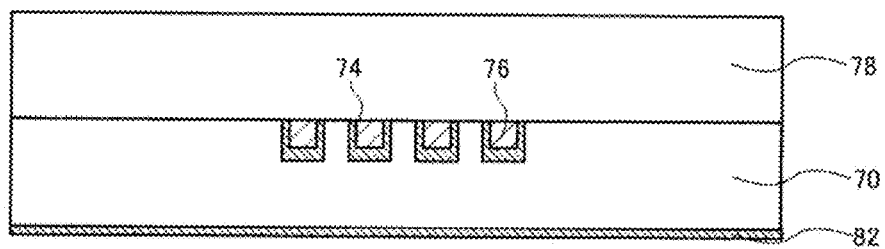

A wiring substrate according to a modified example of one embodiment of the present disclosure is explained using FIG. 23A to FIG. 23C.

FIG. 23A to FIG. 23C is a cross-sectional diagram showing an example of a wiring substrate according to a modified example of the fourth embodiment to the sixth embodiment. In the wiring substrate according to the fourth embodiment to the sixth embodiment, the second insulating layer 78 may be stacked on the first insulating layer 70. A modified example in which the second insulating layer 78 is stacked on the wiring substrate according to the fourth embodiment is shown in FIG. 23A. FIG. 23B shows a modified example in which the second insulating layer 78 is stacked on the wiring substrate according to the fifth embodiment. FIG. 23C shows a modified example in which the second insulating layer 78 is stacked on the wiring substrate according to the sixth embodiment. As is shown in FIG. 23A to FIG. 23C, a second insulating layer 78 is stacked on the surface on which the transmission path 80 of the first insulating layer 70 is arranged. In this way, the transmission path 80 is buried in the first insulating layer 70 and the second insulating layer 78. Although not shown in the diagrams, the wiring substrate 700 according to the embodiment of the present disclosure can be further stacked as a multilayer wiring substrate. In this case, each layer can be electrically connected using a via conductor.

The embodiments examined above are described for easy understanding of the present disclosure and are not described for limiting the present disclosure. Therefore, each element disclosed in the above embodiments includes all design changes and equivalents belonging to the technical scope of the present disclosure.

Example

Next, the present disclosure is further explained in more detail with specific examples.

[Manufacture of Mounting Components]

A silicon base material having a thickness of 700 μm was prepared as a base material, and a multilayer structure was formed by alternately stacking nine insulating layers and nine conductive layers on the silicon base material, and the upper and lower conductor layers were connected via an interlayer connector to manufacture mounting components (samples 1 to 3). Furthermore, the thickness of the insulating layer was 8 μm and the thickness of the conductor layer was 4 nm.

In this mounting component, a mounting region of 25 mm×20 mm is defined in the insulating layer of the outermost surface, and 2500 electrode pads having a size of 150 μm×150 μm were formed in the mounting region so as to be located at intersections of lattice shapes arranged at a pitch of 200 μm.

In addition, in each of the mounting components (samples 1 to 3), by changing each of the circuit pattern shapes of the other eight conductor layers located in the lower layer of the conductor layer on the outermost surface having an electrode pad, the area of each conductor layer of the other eight layers overlapping the mounting region in the thickness direction (indicated by the area (%) when the area of the mounting region is 100%) was set to a value as shown in the following Table 1.

Furthermore, in each of the mounting components (samples 1 to 3), by changing the conductor layers of the lower layer located immediately under the electrode pads as shown in FIG. 5A, FIG. 5B or FIG. 5D, the area of conductor layers of the lower layer located immediately under the electrode pads (indicated by the area (%) when the area of the mounting region is 100%) was set to a value as shown in the following Table 1.

[Evaluation of Mounting Components]

Next, the mounting components (samples 1 to 3) manufactured as described above were flip-chip mounted on a multilayer wiring substrate using solder balls. With respect to each mounting component mounted as described above, the connection with the multilayer wiring substrate was confirmed and the occurrence frequency (%) of connection defects was obtained and is shown in the following Table 1.

TABLE 1

| Mounting Component | Area of conductor layer overlapping mounting region | Area of conductor layer located directly under electrode pad | occurrence frequency of connection defects |
|---|---|---|---|
| Sample 1 | 8% | 15% | 6.1% |
| Sample 2 | 64% | 50% | 0.5% |
| Sample 3 | 86% | 75% | 0% |

As is shown in Table 1, the area of a conductor layer overlapping a mounting area in a thickness direction was 60%, and it was confirmed that mounting components (sample 2, sample 3) did not have connection defects or even when connection defects occurred, the connection defect frequency was extremely low. However, the area of the conductor layer overlapping the mounting region in the thickness direction is less than 60%, and the mounting component (sample 1) for which the area of the conductor layer located directly under the electrode pad is less than 50%, has a high occurrence frequency of connection defects.

In addition, among the mounting components (sample 2, sample 3), the area of the conductor layer overlapping with the mounting region in the thickness direction is 70% or more, and it was confirmed that with respect to the sample 3 in which the area of the conductor layer on a lower layer located directly under the electrode pad is 75% or more, the occurrence of connection defects was reliably prevented.

Next, the wiring substrate according to the present disclosure described above is explained in more detail.

In order to improve the transmission characteristics in the high frequency band of the transmission path arranged with the wiring substrate according to the embodiment of the present disclosure and to enable higher speed signal transmission, the ratio of the first conductor 74 and the second conductor 76 was examined.

Example 1

Since the wiring substrate according to the first embodiment of the present disclosure is the same as the wiring substrate according to the fourth embodiment, a detailed description is omitted.

Parameters of the transmission path in the wiring substrate according to the first embodiment are as follows.
Transmission path width: 3 µm
Transmission path height: 2 µm
Transmission path length: 10 mm
Thickness of first conductor: 0.4 µm
Conductivity of first conductor: $5.8 \times 10^7$ S/m
Width of second conductor: 2.2 µm
Height of second conductor: 1.6 µm
Conductivity of second conductor: $1.5 \times 10^7$ S/m Next, a comparative example of the wiring substrate illustrated in the first embodiment is explained below. In comparative example 1, the thickness of the first conductor and the conductivity of the second conductor are different from those of example 1. Since the manufacturing process of the wiring substrate is the same as that of the first embodiment except for the process of forming the second electric conductor, a detailed explanation omitted. In the process (FIG. 16C) of forming the second conductor, copper is filled in the trench by electrolytic copper plating in comparative example 1. In this way, only a transmission path is formed in which only conductors with high conductivity are arranged.

Comparative Example 1

The parameters of the transmission path in the wiring substrate according to comparative example 1 are as follows.
Transmission path width: 3 µm
Transmission path height: 2 µm
Transmission path length: 10 mm
Thickness of first conductor: 0.2 µm
Conductivity of first conductor: $5.8 \times 10^7$ S/m
Width of second conductor: 2.6 µm
Height of second conductor: 1.8 µm
Conductivity of second conductor: $5.8 \times 10^7$ S/m In comparative example 2, the thickness of the first conductor is different from that of example 1. Since the manufacturing process of the wiring substrate is the same as that of the first embodiment, an explanation is omitted.

Comparative Example 2

Figure 24:
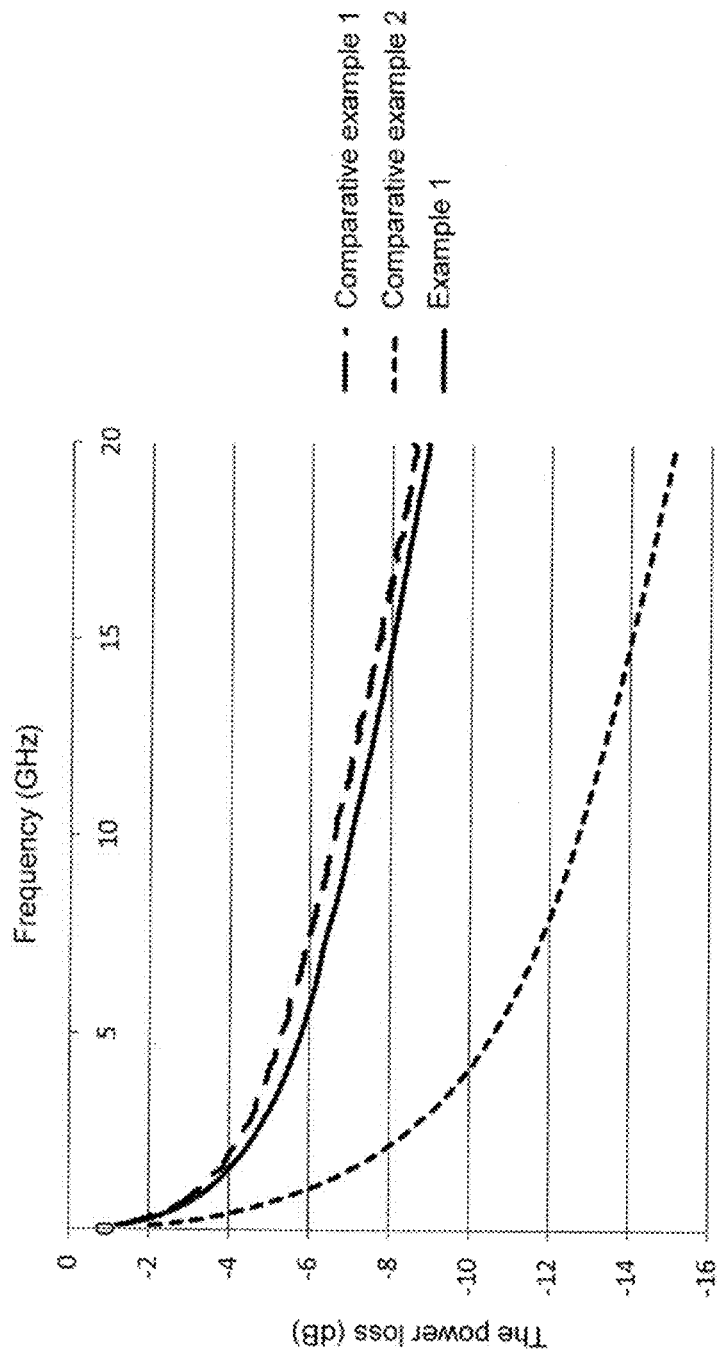
FIG. 24 is a graph showing transmission characteristics of a transmission path in a wiring substrate of an example and a comparative example of the present disclosure.

Parameters of the transmission path in the wiring substrate according to comparative example 2 obtained by the same process as in example 1 are as follows.
Transmission path width: 3 µm
Transmission path height: 2 µm
Transmission path length: 10 mm
Thickness of first conductor: 0.2 µm
Conductivity of first conductor: $5.8 \times 10^7$ S/m
Width of second conductor: 2.6 µm
Height of second conductor: 1.8 µm
Conductivity of second conductor: $1.5 \times 107$ S/m The insertion loss of the transmission path was measured with a network analyzer (manufactured by Keysight) using the wiring substrates of example 1 and comparative examples 1 and 2. FIG. 24 shows the results of measuring a 2-port S parameter and calculating the power loss at each frequency.

As is shown in FIG. 24, in Example 1, by setting the thickness of the first conductor to 0.4 µm, it was possible to improve the transmission characteristics in the high frequency band of the transmission path in which the second conductor having low conductivity is arranged. This result was the same as the transmission characteristics in the high frequency band of the transmission path in which only the conductor having high conductivity in comparative example 1 was arranged. On the other hand, in comparative example 2, when the thickness of the first conductor was set to 0.2 μm, the transmission characteristics in the high frequency band of the transmission path in which the second conductor having low conductivity is arranged could not be improved.

Next, a cross section of the transmission path was observed with an electron microscope (SEM) using the wiring substrate of the comparative example 2. A sample cut out from the cross section of the wiring substrate of comparative example 2 and observed using an electron microscope (SEM) is shown in FIG. 25.

Figure 25:
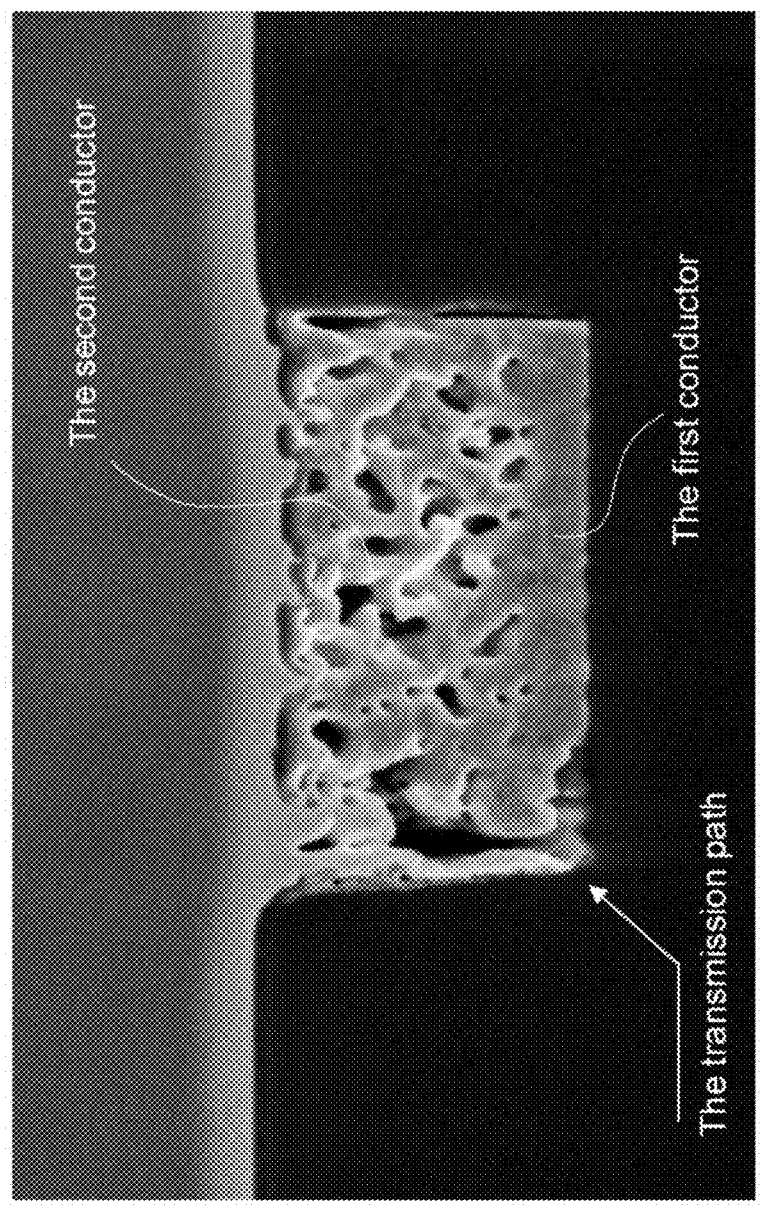
FIG. 25 is an electron microscopic image (SEM) of a wiring substrate cross section related to one embodiment of the present disclosure.

FIG. 25 is an electron microscope image of the transmission path cross section in the comparative example 2. As is shown in FIG. 25, the second conductor formed using a copper nanoparticle paste as a material was observed to have a porous state and a sparse structure. On the other hand, the first conductor 74 which was formed using copper as a material by a sputtering method was observed to have a denser structure.

INDUSTRIAL APPLICABILITY OF THE INVENTION

The present disclosure is useful in various mounting components which are flip-chip mounted on a multilayer wiring substrate, in their manufacture and in electronic devices mounted with the mounting components.

The entirety of, or a part of, the illustrative embodiments disclosed above may be defined by the following supplementary Notes. Any embodiment of the present invention is not limited to any of the following.

Supplementary Note 1

A mounting component includes a multilayer structure in which a plurality of conducting layers are stacked on a base material interposed by an insulating layer, and in a mounting region defined in the outermost insulating layer, a conducting layer is located on the outermost surface arranged with a plurality of electrode pads, and in each conducting layer excluding the outermost conducting layer, an area of a conducting layer overlapping the mounting region in a thickness direction of the multilayer structure includes a region in a range of 60% to 95% of the area of the mounting region.

Supplementary Note 2

In a lower layer conducting layer located immediately below a conducting layer on the outermost surface interposed by an insulating layer, the area of a lower layer conducting layer overlapping with an electrode pad arranged with a conducting layer of the outermost surface in the thickness direction of the multilayer structure may include a region that is 50% or more of the area of the electrode pad.

Supplementary Note 3

In each conducting layer excluding the conducting layer of the outermost surface, the area overlapping with the mounting region in the thickness direction of the multilayer structure may be larger for conducting layers closer to the outermost surface.

Supplementary Note 4

The conducting layer may form a circuit pattern, and no dummy pattern may be present.

Supplementary Note 5

The circuit pattern may include at least one of a signal pattern for transmitting a signal, a power supply pattern for maintaining a power supply potential, and a ground pattern for maintaining a ground potential.

Supplementary Note 6

The base material may be silicon or glass.

Supplementary Note 7

A manufacturing method of a mounting component includes forming a multilayer structure by alternately stacking an insulating layer and a conducting layer on a base material and connecting upper and lower conducting layers via an insulating layer via an interlayer connector, wherein a mounting region for arranging electrode pads is set in an insulating layer which acts as the outermost surface in advance, and in the formation of each conducting layer excluding the conducting layer on the outermost surface, the area of the conducting layer overlapping with the mounting region in the thickness direction of the multilayer structure is set in the range of 60% to 95% of the area of the mounting region, and in the formation of the conducting layer on the insulating layer of the outermost surface, a conducting layer is formed so that the electrode pad is located in the mounting region.

Supplementary Note 8

In the formation of a lower layer conducting layer immediately below the conducting layer on the outermost surface interposed by an insulating layer, an area of a lower layer conducting layer overlapping with an electrode pad arranged with a conducting layer on the outermost surface in the thickness direction of the multilayer structure may be 50% or more of the area of the electrode pad.

Supplementary Note 9

In the formation of each conducting layer excluding the conducting layer on the outermost surface, the area of the conducting layer overlapping the mounting region in the thickness direction of the multilayer structure is larger for conducting layers closer to the outermost surface.

Supplementary Note 10

In formation of each conducting layer, a circuit pattern may include at least one of a signal pattern for transmitting a signal, a power supply pattern for maintaining a power supply potential, and a ground pattern for maintaining a ground potential, and a dummy pattern which does not form a circuit pattern may not be formed.

Supplementary Note 11

Silicon or glass may be used as the base material.

Supplementary Note 12

In the formation of a conducting layer, a recessed part in which a conducting layer is arranged in an insulating layer may be formed by imprint lithography.

Supplementary Note 13

The conducting layer may be formed by a printing method using a conductive paste.

Supplementary Note 14

In an electronic device, the mounting components may be flip-chip mounted on a multilayer wiring substrate.

Supplementary Note 15

The multilayer wiring substrate has a multilayer structure in which a plurality of conducting layers are staked interposed by an insulating layer, and when the surface on which the mounting component is flip-chip mounted is set as the outermost surface, the conducting layer on the outermost surface arranged with a plurality of electrode pads is located in the mounting region defined by the insulating layer on the outermost surface, and in each conducting layer excluding the conducting layer on the outermost surface, the area of the conducting layer overlapping the mounting region in the thickness direction of the multilayer structure may include a region in the range of 60% to 95% of the area of the mounting region.

Supplementary Note 16
A gap may exist between the mounting component and the multilayer wiring substrate, and a conductive material for connecting the electrode pad of the mounting component and the electrode pad of the multilayer wiring substrate may exist in the gap.
Supplementary Note 17
An insulating material may be located in the gap.
Supplementary Note 18
A wiring substrate includes a first wiring layer, an insulating film, and a second wiring layer arranged in this order, a via conductor is arranged passing through the insulating film in a thickness direction and electrically connects the first wiring layer and the second wiring layer, wherein the second wiring layer and the via conductor include a second sintered metal layer, and a first sintered metal layer arranged to surround the second sintered metal layer, and an average particle diameter of first metal particles forming the first sintered metal layer is smaller than an average particle diameter of second metal particles forming the second sintered metal layer.
Supplementary Note 19
The second wiring layer and the via conductor may further include a metal layer arranged so as to surround the first sintered metal layer.
Supplementary Note 20
The first sintered metal layer in the via conductor may include a curved part continuing a corner part between a bottom part and a side wall part, and the curvature radius of the curved part may be ¼ or more of the height of the via conductor.
Supplementary Note 21
The second wiring layer may include a wiring part and a land part which is wider than the via conductor in a cross sectional view in a thickness direction and is electrically connected to the via conductor, and the first sintered metal layer in the land part may include a curved part continuing a corner part between a bottom part and a side wall part, and the curvature radius of the curved part may be ¼ or more of the height of the land part.
Supplementary Note 22
A method of manufacturing a wiring substrate includes a step of forming an insulating film pattern including a through hole and a recess part exposing at least a part of a first wiring layer on the first wiring layer, a step of applying a first conductive paste including first metal particles so as to cover the insulating film pattern and forming a first sintered metal layer by sintering the first conductive paste, and a step of applying a second conductive paste including second metal particles so as to cover the first sintered metal layer and to fill the through hole and the recess part, and forming a second sintered metal layer by sintering the second conductive paste, wherein an average particle diameter of the first metal particles is smaller than the average particle diameter of the second metal particles.
Supplementary Note 23
The method further includes a step of forming a metal layer covering the insulating film pattern, wherein in the step of forming the first sintered metal layer, a first conductive paste may be applied so as to cover the metal layer.
Supplementary Note 24
The through hole may include a first through hole located on the first wiring layer side, and a second through hole located above the first through hole and being wider than the first through hole in a cross sectional view in a thickness direction.
Supplementary Note 25
In the step of forming the first sintered metal layer, it is preferred to apply the first conductive paste so that a first curved part having a curvature radius of ¼ or more of the depth of the first through hole is formed at a corner part between a side wall part of the first through hole and the first wiring layer exposed through the first through hole, and in the step of forming the first sintered metal layer, the first conductive paste may be applied so that a second curved part having a curvature radius of ¼ or more of the depth of the second through hole is formed at the corner between the side wall part of the second through hole and the bottom surface part of the second through hole.
Supplementary Note 26
A wiring substrate includes a first wiring layer, an insulating film, and a second wiring layer arranged in this order, and is arranged with a via conductor passing through the insulating film in a thickness direction and electrically connects the first wiring layer and the second wiring layer, wherein the second wiring layer and the via conductor include a sintered metal layer, and a sputtered metal layer or non-electrolytic plated metal layer arranged so as to surround the sintered metal layer.
Supplementary Note 27
The second wiring layer and the via conductor may further include a metal layer arranged so as to surround the sputtered metal layer or the non-electrolytic plated metal layer.
Supplementary Note 28
The metal layer may include a metal material selected from a group consisting of Ti, TiN, Cr, CrN, and Mo.
Supplementary Note 29
A wiring substrate includes a first insulating layer arranged with a trench on a first surface, and a first wiring having a first conductor arranged on an inner surface of the trench and a second conductor contacting the first conductor and having a conductivity lower than the conductivity of the first conductor.
Supplementary Note 30
The conductivity of the first conductor may be $5 \times 10^7$ S/m or more and the conductivity of the second conductor may be in the range of $1 \times 10^7$ S/m to $2 \times 10^7$ S/m.
Supplementary Note 31
The width of the first conductor may be ⅛ or more of the width of the first wiring.
Supplementary Note 32
The second conductor may be porous.
Supplementary Note 33
The first conductor may be copper and the second conductor may be a copper nanoparticle paste sintered body.
Supplementary Note 34
The wiring substrate may further include a second wiring and a third wiring arranged on both sides of the first wiring on a first surface, and the width of the first conductor near the second wiring and the width of the first conductor near the third wiring may be larger than the width of the first conductor in other regions.
Supplementary Note 35
The wiring substrate may further include a second wiring arranged on a second surface opposite to the first surface, and a width of the first conductor near the second wiring may be larger than the width of the first conductor in other regions.
Supplementary Note 36
The wiring substrate may further include a second insulating layer arranged on the first surface.

Supplementary Note 37

The wiring substrate may further include a second wiring arranged on a second surface opposite to the first surface, a first conductor arranged above the first wiring on the first surface, a second insulating layer arranged on the first surface, and a third wiring arranged on a side of the second insulating layer opposite to the first insulating layer, wherein the width of the first conductor near the second wiring and the width of the first conductor near the third wiring may be larger than the width of the first conductor in other regions.

Supplementary Note 38

A method of manufacturing a wiring substrate includes a step of forming a trench on a first surface of a first insulating layer, a step of forming a first conductor on an inner surface of the trench, and a step of forming a second conductor in contact with the first conductor and having a conductivity lower than the conductivity of the first conductor.

Supplementary Note 39

The second conductor may be formed by a printing method.

Supplementary Note 40

The second conductor may be formed using a copper nanoparticle paste.

What is claimed is:

1. A wiring substrate comprising:
   a first wiring layer,
   a second wiring layer disposed on the first wiring layer interposed by an insulating film, and
   a via conductor passing through the insulating film in a thickness direction, the via conductor electrically connecting the first wiring layer and the second wiring layer,
   wherein the second wiring layer and the via conductor include a second sintered metal layer and a first sintered metal layer arranged to surround the second sintered metal layer, and
   wherein an average particle diameter of first metal particles forming the first sintered metal layer is smaller than an average particle diameter of second metal particles forming the second sintered metal layer.

2. The wiring substrate according to claim 1,
   wherein the second wiring layer and the via conductor further include a metal layer arranged to surround the first sintered metal layer.

3. The wiring substrate according to claim 1,
   wherein the first sintered metal layer in the via conductor includes a first curved part forming a continuous corner part between a bottom part and a side wall part of the via conductor, and a curvature radius of the first curved part is ¼ or more of a height of the via conductor.

4. The wiring substrate according to claim 2,
   wherein the first sintered metal layer in the via conductor includes a first curved part forming a continuous corner part between a bottom part and a side wall part, and a curvature radius of the first curved part is ¼ or more of a height of the via conductor.

5. The wiring substrate according to claim 1,
   wherein the second wiring layer includes a wiring part and a land part, the land part is wider than the via conductor in a cross sectional view in a thickness direction, and the land part is electrically connected to the via conductor, and
   wherein the first sintered metal layer in the land part includes a second curved part forming a continuous corner part between a bottom part and a side wall part of the land part, and a curvature radius of the second curved part is ¼ or more of a height of the land part.

6. The wiring substrate according to claim 2,
   wherein the second wiring layer includes a wiring part and a land part, the land part is wider than the via conductor in a cross sectional view in a thickness direction, and the land part is electrically connected to the via conductor, and
   wherein the first sintered metal layer in the land part includes a second curved part forming a continuous corner part between a bottom part and a side wall part of the land part, and a curvature radius of the second curved part is ¼ or more of a height of the land part.

7. The wiring substrate according to claim 3,
   wherein the second wiring layer includes a wiring part and a land part, the land part is wider than the via conductor in a cross sectional view in a thickness direction, and the land part is electrically connected to the via conductor, and
   wherein the first sintered metal layer in the land part includes a second curved part forming a continuous corner part between a bottom part and a side wall part of the land part, and a curvature radius of the second curved part is ¼ or more of a height of the land part.

8. The wiring substrate according to claim 4,
   wherein the second wiring layer includes a wiring part and a land part, the land part is wider than the via conductor in a cross sectional view in a thickness direction, and the land part is electrically connected to the via conductor, and
   wherein the first sintered metal layer in the land part includes a second curved part forming a continuous corner part between a bottom part and a side wall part of the land part, and a curvature radius of the second curved part is ¼ or more of a height of the land part.

* * * * *